US008101332B2

(12) United States Patent
Aoshima et al.

(10) Patent No.: US 8,101,332 B2

(45) **Date of Patent: *Jan. 24, 2012**

(54) NEGATIVE-WORKING LITHOGRAPHIC PRINTING PLATE PRECURSOR AND METHOD OF LITHOGRAPHIC PRINTING USING SAME

(75) Inventors: Norio Aoshima, Shizuoka (JP); Yu Iwai, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 34 days.

This patent is subject to a terminal disclaimer.

(21) Appl. No.: 12/412,871

(22) Filed: Mar. 27, 2009

(65) Prior Publication Data

US 2009/0246688 A1 Oct. 1, 2009

(30) Foreign Application Priority Data

Mar. 28, 2008 (JP) ................................ 2008-087165
Mar. 28, 2008 (JP) ................................ 2008-087166

(51) Int. Cl.
*G03F 7/00* (2006.01)
*G03F 7/032* (2006.01)
*B41N 1/14* (2006.01)

(52) U.S. Cl. ..................... 430/138; 430/302; 430/283.1; 430/287.1; 430/285.1; 430/944; 430/145; 430/910; 101/451; 101/450.1

(58) Field of Classification Search ........................ None
See application file for complete search history.

(56) References Cited

U.S. PATENT DOCUMENTS

| | | | | |
|---|---|---|---|---|
| 5,264,289 | A * | 11/1993 | Kondo et al. | 428/451 |
| 6,261,740 | B1 * | 7/2001 | Nguyen et al. | 430/271.1 |
| 6,730,455 | B2 * | 5/2004 | Matsumura | 430/270.1 |
| 2001/0018164 | A1 * | 8/2001 | Furukawa | 430/287.1 |
| 2005/0153239 | A1 * | 7/2005 | Hoshi et al. | 430/270.1 |
| 2005/0170282 | A1 * | 8/2005 | Inno et al. | 430/270.1 |
| 2005/0170285 | A1 * | 8/2005 | Sugasaki et al. | 430/270.1 |

FOREIGN PATENT DOCUMENTS

| | | | |
|---|---|---|---|
| EP | 1 219 464 | A2 | 7/2002 |
| EP | 1 291 172 | A2 | 3/2003 |
| EP | 1 319 504 | A2 | 6/2003 |
| EP | 1 747 899 | A1 | 1/2007 |
| EP | 1 884 359 | A1 | 2/2008 |
| EP | 1 972 440 | A2 | 9/2008 |
| EP | 1 972 460 | A1 | 9/2008 |
| EP | 1 985 445 | A1 | 10/2008 |

OTHER PUBLICATIONS

Define: uv ink—Google Search,one page search done and printed on Sep. 25, 2010.at http:..www.google.com.*

* cited by examiner

*Primary Examiner* — Cynthia Hamilton
(74) *Attorney, Agent, or Firm* — Birch, Stewart, Kolasch & Birch, LLP

(57) ABSTRACT

A negative-working lithographic printing plate precursor is disclosed that can be developed on the press without going through a development processing step, and a method of lithographic printing is also disclosed that uses this negative-working lithographic printing plate precursor. A negative-working lithographic printing plate precursor is provided that exhibits excellent on-press developability, nonimage area fine line reproducibility and printing durability and that resists the production of scum during on-press development. The negative-working lithographic printing plate precursor has a hydrophilic support and has thereon a photopolymerizable layer that contains at least one selected from the group consisting of a polymer compound that has an ethylenically unsaturated bond in the side chain position, a hydrophilic group and a sulfonamide group and a polymer compound that has an ethylenically unsaturated bond in the side chain position, a hydrophilic group and a cyclic structure derived from a maleimide. The method of lithographic printing uses this negative-working lithographic printing plate precursor.

13 Claims, No Drawings

NEGATIVE-WORKING LITHOGRAPHIC PRINTING PLATE PRECURSOR AND METHOD OF LITHOGRAPHIC PRINTING USING SAME

BACKGROUND OF THE INVENTION

1. Field of the Invention

The present invention relates to a lithographic printing plate precursor and to a method of lithographic printing that uses this lithographic printing plate precursor. More particularly, the present invention relates to negative-working lithographic printing plate precursor that enables direct platemaking in which platemaking is carried out directly based on a digital signal from, e.g., a computer, by scanning with, for example, a laser having a wavelength from 300 to 1200 nm. The present invention further relates to a method of preparing a lithographic printing plate in which the aforementioned lithographic printing plate precursor is developed directly on the press without going through a development processing step, and a method for lithographic printing in which printing is carried out on the press accordingly.

2. Description of the Related Art

A lithographic printing plate typically comprises an oleophilic image area that is ink receptive during the printing process and a hydrophilic nonimage area that is fountain solution receptive during the printing process. Lithographic printing is a method that utilizes the fact that water and oleophilic ink repel each other: differences in the ink attachment behavior are produced on the surface of the lithographic printing plate by using the oleophilic image areas on the lithographic printing plate as ink receptive areas and using the hydrophilic nonimage areas on the lithographic printing plate as fountain solution receptive areas (areas not receptive to ink). After ink uptake has been brought about only in the image areas, the ink is transferred to the receiving medium, e.g., paper.

A lithographic printing plate precursor (PS plate) comprising an oleophilic photosensitive resin layer (image recording layer) disposed on a hydrophilic support has heretofore been widely used to produce the aforementioned lithographic printing plate. Platemaking is typically carried out by a method in which the lithographic printing plate precursor is exposed to light through an original image, for example, a lith film, after which the areas forming the image areas of the image recording layer remain while the unwanted image recording layer outside these areas is dissolved and removed by an alkaline developing solution or an organic solvent to expose the hydrophilic surface of the support, thus yielding the lithographic printing plate.

The conventional platemaking process for lithographic printing plate precursors has required a step in which, after photoexposure, the unwanted image recording layer is dissolved and removed by, for example, a developing solution adapted to the image recording layer; however, a concern with these separately conducted wet processes has been to render them unnecessary or to simplify them. In particular, attention to the global environment has in recent years caused the disposal of the waste solutions discharged in association with these wet processes to become a major issue for the industrial sector as a whole, and as a consequence there has been an even stronger desire to address the aforementioned concern.

In this context, the method known as on-press development has been introduced as a convenient platemaking method. In on-press development, an image recording layer is used that enables the removal of unwanted areas of the image recording layer to be carried out during an ordinary printing process: after photoexposure, the lithographic printing plate is obtained by removal of the unwanted areas of the image recording layer on the press.

The following are examples of specific methods of on-press development: use of a lithographic printing plate precursor that has an image recording layer that can be dissolved or dispersed in the fountain solution, in the ink solvent, or in an emulsion of the fountain solution and ink; mechanical removal of the image recording layer by contact with rollers or the blanket cylinder on the press; mechanical removal of the image recording layer by carrying out contact with rollers or the blanket cylinder after the cohesive strength within the image recording layer or the adhesive force between the image recording layer and support has been weakened by penetration by, for example, the fountain solution or the ink solvent.

Unless stated otherwise, in the present invention, the "development processing step" refers to a step in which the hydrophilic surface of the support is exposed by the removal of those areas of the image recording layer that have not been exposed to the laser, wherein this removal is effected by contact with a fluid (typically an alkaline developing solution) using an apparatus (typically an automatic developing apparatus) outside of the press, and "on-press development" denotes a step and a method in which the hydrophilic surface of the support is exposed by the removal of those areas of the image recording layer that have not been exposed to the laser, wherein this removal is effected by contact with a fluid (typically the printing ink and/or fountain solution) using the press.

At the same time, digital technology, in which the image data is electronically processed, stored, and output using a computer, has become widespread during the last few years, and various new image output methods have entered into practice in association with this digital technology. Accompanying this, interest has been growing in computer-to-plate (CTP) technology, in which the digitized image data is carried by a highly convergent beam of radiation, for example, laser light, and the lithographic printing plate precursor is subjected to a scanning photoexposure with this light in order to directly produce the lithographic printing plate without going through lith film. As a consequence, the appearance of lithographic printing plate precursors adapted to this technology has become a technical problem of the utmost importance.

Thus, as described in the preceding, based on global environmental concerns and the need to adapt and conform to digital technology, there has recently been an even stronger desire than before for a simplification of platemaking technology, for its conversion to a dry technology, and for its conversion into a processless technology.

Within the sphere of lithographic printing plate precursors, a scanning-photoexposable lithographic printing plate precursor comprising a hydrophilic support bearing an oleophilic photosensitive resin layer that contains a photosensitive compound that can produce an active species (e.g., a radical or a Bronsted acid) upon laser photoexposure has been introduced and has already appeared on the market. An active species can be produced by scanning this lithographic printing plate precursor with a laser based on digital data, and this action causes a physical or chemical change in the photosensitive layer, which induces insolubilization. A negative-working lithographic printing plate is then obtained by executing a development process. In particular, the advantages of excellent productivity, simple development processing, good resolution, and good receptivity are provided by a lithographic printing plate precursor comprising a hydrophilic support provided with a photopolymerizable photosensitive layer containing a photopolymerizable initiator with an excellent photosensitive speed, an addition-polymerizable ethylenically unsaturated compound, and a binder polymer soluble in alkaline development solution, and optionally provided with an oxygen-blocking protective layer, thus providing a plate that exhibits desirable printing characteristics.

The lithographic printing plate precursor described in Japanese Patent No. 2,938,397 is an example of an on-press-developable lithographic printing plate precursor. In this lithographic printing plate precursor, an image-forming layer comprising particles of a hydrophobic thermoplastic polymer dispersed in a hydrophilic binder is disposed on a hydrophilic support. The essential narrative laid out in Japanese Patent No. 2,938,397 is as follows: this lithographic printing plate precursor is photoexposed by an infrared laser in order to bring about image formation by the heat-induced coalescence of the hydrophobic thermoplastic polymer particles and is thereafter installed on the cylinder in the press and can be on-press developed by the fountain solution and/or the ink.

This method of causing image formation by coalescence by the simple thermal melting/bonding of finely divided particles does exhibit an excellent on-press developability; however, the image strength (adhesion to the support) is very weak and the printing durability is thus inadequate.

This on-press developability can be evaluated, for example, in terms of the number of waste sheets of paper, that is, the number of sheets of printing paper required when on-press development is started to reach a state in which ink is not transferred to the nonimage areas.

The lithographic printing plate precursor described in Japanese Patent Application Publication Nos. 2001-277740 and 2001-277742 comprises a hydrophilic support on which there is disposed an image recording layer (heat-sensitive layer) comprising microcapsules that enclose a polymerizable compound.

A lithographic printing plate precursor is described in Japanese Patent Application Publication No. 2002-287334 in which an image recording layer (photosensitive layer) comprising an infrared absorber, a radical polymerization initiator, and a polymerizable compound is disposed on a support.

Due to the high chemical bond density in the image areas, the use of these polymerization reactions does characteristically provide a relatively better image strength than is provided by the image areas formed by the hot melting/bonding of finely divided polymer particles; however, when viewed in terms of practicality, the on-press developability, fine line reproducibility, and printing durability are all still unsatisfactory. In particular, the printing durability using UV inks is very unsatisfactory.

An on-press-developable lithographic printing plate precursor is also described in US Published Application 2003-0064318. This on-press-developable lithographic printing plate precursor comprises a support bearing an image recording layer that contains a polymerizable compound and a graft polymer having pendant polyethylene oxide chains or a block polymer that has a polyethylene oxide block.

The use of this art does provide an excellent on-press developability, but the fine line reproducibility is still inadequate. This fine line reproducibility refers to the reproducibility of a nonimage area interposed between fine lines. In specific terms, using an image chart in which a fine line image of constant width is disposed in alternation with an interposed nonimage area of the same width, the fine line reproducibility refers to the degree to which the nonimage areas between the fine line images on the print are not interrupted by scumming. This characteristic is referred to hereafter as the nonimage area fine line reproducibility or the fine line reproducibility.

In particular, the nonimage area fine line reproducibility is even worse with a UV ink than for a standardly used printing ink (e.g., process ink).

Separately from the preceding, another problem is that components of a photopolymerizable layer that has undergone a typical on-press development form a scum on the dampening roller and ink roller, which impairs the maintenance characteristics of the press and lowers the print quality.

As a method for improving the above conditions, it has been proposed that a sulfonamide group and a hydrophilic group are introduced into a polymer compound, however a printing durability thereby is not sufficient.

DISCLOSURE OF THE INVENTION

Problem to be Solved by the Invention

An object of the present invention is to provide a negative-working lithographic printing plate precursor that can record an image when subjected to photoexposure with a laser. A further object of the present invention is to provide a negative-working lithographic printing plate precursor that can be developed on the press without carrying out a development processing step and a method of lithographic printing that uses this negative-working lithographic printing plate precursor. A particular object of the present invention is to provide a negative-working lithographic printing plate precursor that performs satisfactorily with regard to all of the following and that does so even with UV ink: developability, nonimage area fine line reproducibility, inhibition of scum production, and printing durability.

Means to Solve the Problem

As a result of investigations into various polymer compounds in order to achieve the objects cited above, the present inventors discovered that these objects could be achieved by the use in the photopolymerizable layer (image recording layer) of a polymer compound that has a plurality of specific functional groups. The present invention was achieved based on this discovery.

Thus, the present invention is a negative-working lithographic printing plate precursor comprising on a hydrophilic support a photopolymerizable layer that contains at least one selected from the group consisting of a polymer compound that has an ethylenically unsaturated bond in the side chain position, a hydrophilic group and a sulfonamide group and a polymer compound that has an ethylenically unsaturated bond in the side chain position, a hydrophilic group and a cyclic structure derived from a maleimide. The present invention is also directed to a negative-working lithographic printing plate precursor comprising on a hydrophilic support a photopolymerizable layer that contains at least one polymer compound that has an ethylenically unsaturated bond in the side chain position, a hydrophilic group and a sulfonamide group. The present invention is also directed to a negative-working lithographic printing plate precursor comprising on a hydrophilic support a photopolymerizable layer that contains at least one polymer compound that has an ethylenically unsaturated bond in the side chain position, a hydrophilic group and a cyclic structure derived from a maleimide.

An example of the polymer compound having an ethylenically unsaturated bond in the side chain position, a hydrophilic group and a sulfonamide group is a polymer compound having a unit derived from a monomer having a sulfonamide group and being represented by any of the following formulas (Ia) to (Ie):

(Ia)

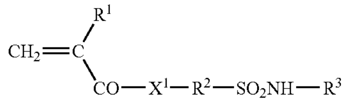

(Ib)

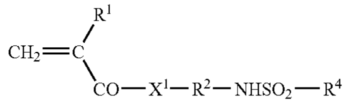

(Ic)

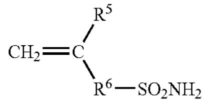

(Id)

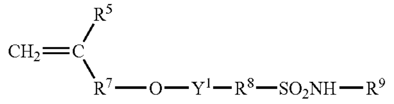

(Ie)

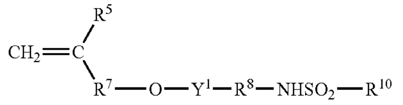

(in the formulas, $X^1$ represents O or NR; $R^1$ represents a hydrogen or a methyl group; $R^2$, $R^6$ and $R^8$ each independently represent optionally substituted $C_{1-12}$ alkylene, cycloalkylene, arylene or aralkylene group; $R^3$ and $R^9$ each independently represent a hydrogen atom or optionally substituted $C_{1-12}$ alkyl, cycloalkyl, aryl or aralkyl group; $R^4$ and $R^{10}$ each independently represent optionally substituted $C_{1-12}$ alkyl, cycloalkyl, aryl or aralkyl group; $R^5$ represents a hydrogen atom, a halogen atom or a methyl group; $R^7$ represents a single bond, or optionally substituted $C_{1-12}$ alkylene, cycloalkylene, arylene or aralkylene group; R represents a hydrogen atom, or optionally substituted $C_{1-12}$ alkyl, cycloalkyl, aryl or aralkyl group; and $Y^1$ represents a single bond or a carbonyl group).

An example of the polymer compound that has an ethylenically unsaturated bond in the side chain position, a hydrophilic group and a cyclic structure derived from a maleimide is one wherein the cyclic structure derived from a maleimide is a structure represented by the following formula (I):

(I)

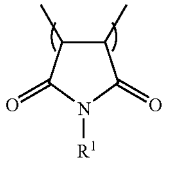

(in the formula, $R^1$ represents a hydrogen atom or an optionally substituted monovalent organic group). In the above formula (I), $R^1$ includes an optionally substituted aryl group.

The alkylene oxide structure shown by the following general formula (II) is an example of the hydrophilic group present in the aforementioned polymer compound (II)

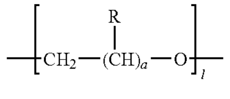

(in the formula, R represents a hydrogen atom or methyl group; a is 1, 3, or 5; and l is an integer of 1 to 9).

The ethylenically unsaturated bond in the side chain position of the above polymer compound is exemplified by the following formula (1), (2) or (3):

(1)

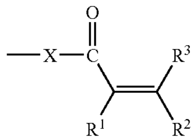

(2)

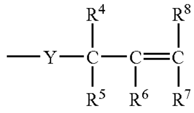

(3)

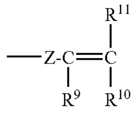

(in the formulas, X and Y each independently represent the oxygen atom, sulfur atom, or —$N(R^{12})$—; Z represents the oxygen atom, sulfur atom, —$N(R^{12})$—, or phenylene; and $R^1$ to $R^{12}$ each independently represent a monovalent substituent).

In the present invention, at least one selected from the group consisting of a polymer compound that has an ethylenically unsaturated bond in the side chain position, a hydrophilic group and a sulfonamide group and a polymer compound that has an ethylenically unsaturated bond in the side chain position, a hydrophilic group and a cyclic structure derived from a maleimide may function as a binder polymer in the photopolymerizable layer.

In a specific embodiment of the photopolymerizable layer under consideration, this photopolymerizable layer contains, in addition to the polymer compound described above, an infrared absorber, a polymerization initiator, and a polymerizable monomer. In another embodiment this polymerizable layer contains microcapsules or a microgel.

In an embodiment of the present invention, the mass ratio in the photopolymerizable layer between binder polymer including at least one selected from the group consisting of a polymer compound that has an ethylenically unsaturated bond in the side chain position, a hydrophilic group and a sulfonamide group and a polymer compound that has an ethylenically unsaturated bond in the side chain position, a hydrophilic group and a cyclic structure derived from a maleimide, and the polymerizable monomer (binder polymer/polymerizable monomer) is 3/2 to 1/3. In one embodiment, the mass ratio in the photopolymerizable layer between binder polymer that contains the polymer compound that has an ethylenically unsaturated bond in the side chain position, a hydrophilic group and a sulfonamide group, and the polymerizable monomer is 3/2 to 1/3. In another embodiment, the mass ratio in the photopolymerizable layer between binder polymer that contains the polymer compound that has an ethylenically unsaturated bond in the side chain position, a hydrophilic group and a cyclic structure derived from a maleimide, and the polymerizable monomer is 3/2 to 1/3.

An undercoat layer comprising a compound that has a group that adsorbs to the hydrophilic support and an addition-polymerizable ethylenic double bond may be disposed between the hydrophilic support and the photopolymerizable layer in the negative-working lithographic printing plate precursor of the present invention.

A photopolymerizable layer that can be removed by printing ink and/or fountain solution is a specific exemplary embodiment of the photopolymerizable layer in the negative-working lithographic printing plate precursor of the present invention; in a more specific embodiment, this photopolymerizable layer is removable by UV ink and/or fountain solution.

Such a negative-working lithographic printing plate precursor can be used in methods of lithographic printing that utilize on-press development. Accordingly, the present invention is also directed to a method of lithographic printing that uses the hereinabove-described negative-working lithographic printing plate precursor. More particularly, the present invention is a method of lithographic printing comprising mounting the aforementioned negative-working lithographic printing plate precursor on a press and thereafter subjecting the negative-working lithographic printing plate precursor to imagewise exposure with a laser, or subjecting the negative-working lithographic printing plate precursor to imagewise exposure with a laser and thereafter mounting the same on a press; removing unexposed areas of the photopolymerizable layer by feeding printing ink and fountain solution to the negative-working lithographic printing plate precursor to perform printing. In a specific example of the inventive method of lithographic printing, printing is carried out by removing unexposed areas of the polymerizable layer by supplying a UV ink and fountain solution to the negative-working lithographic printing plate precursor.

The objects cited above can be achieved by the present invention through the use of a polymer compound that has a sulfonamide group and further an ethylenically unsaturated bond in the side chain position and a hydrophilic group and/or a polymer compound that has an ethylenically unsaturated bond in the side chain position, a hydrophilic group and a cyclic structure derived from a maleimide.

While the action mechanism here is not certain, it is believed that due to the presence of the sulfonamide group or the cyclic structure derived from a maleimide in the polymer compound, the penetration/permeation of the fountain solution and printing ink in the nonimage areas is accelerated by the high polarity exhibited by the sulfonanide group or the cyclic structure derived from a maleimide, which facilitates removal.

It is also hypothesized that the presence of the sulfonamide group or the cyclic structure derived from a maleimide in the polymer molecule facilitates dispersion in the aqueous component by the components that have been removed and thereby acts to prevent the removed components from making scum. In addition, the presence of the hydrophilic group accelerates these properties, and the presence of the ethylenically unsaturated bond makes a printing durability favorable, and further improves developability by increasing flexibility of the side chain of the polymer.

Effect of the Invention

The negative-working lithographic printing plate precursor of the present invention exhibits an excellent on-press developability, can reduce the number of waste sheets of paper (i.e., the number of sheets of printing paper required when on-press development is started to reach a state in which ink is not transferred to the nonimage areas), exhibits an excellent fine line reproducibility, and can inhibit scum production, and thus enables good productivity and high-quality printing.

Moreover, the negative-working lithographic printing plate precursor of the present invention can provide long runs of high-quality printed material even when printing is carried out using a UV ink.

The negative-working lithographic printing plate precursor of the present invention also makes it possible to proceed via a method of lithographic printing that employs on-press development.

MODE FOR CARRYING OUT THE INVENTION

The Negative-Working Lithographic Printing Plate Precursor

The prerequisite for the negative-working lithographic printing plate precursor of the present invention is the presence of a laser-sensitive photopolymerizable layer on a hydrophilic support. The photopolymerizable layer and other constituent elements are described in detail in the following.

[The Photopolymerizable Layer]

In the negative-working lithographic printing plate precursor of the present invention, the photopolymerizable layer comprises essentially a polymer compound that has an ethylenically unsaturated bond in the side chain position, a hydrophilic group and a sulfonamide group and/or a polymer compound that has an ethylenically unsaturated bond in the side chain position, a hydrophilic group and a cyclic structure derived from a maleimide (where appropriate, said polymer compound is referred to below as the special polymer compound).

It is preferable that said polymer compound functions as a binder polymer in the image-foaming layer. It is used in the image-forming layer mainly for the purpose of forming a continuous layer. A polymer compound that has a chain structure is more preferred from the standpoint of the nonimage area fine line reproducibility. A polymer compound that has a crosslinked structure is more preferred from the standpoints of the developability, fine line reproducibility, and prevention of scum attachment.

Specific embodiments of the photopolymerizable layer according to the present invention include (i) the photopolymerizable layer comprising at least one polymer compound that has an ethylenically unsaturated bond in the side chain position, a hydrophilic group and a sulfonamide group, (ii) the photopolymerizable layer comprising at least one polymer compound that has an ethylenically unsaturated bond in the side chain position, a hydrophilic group and a cyclic structure derived from a maleimide, and (iii) the photopolymerizable layer comprising at least one polymer compound that has an ethylenically unsaturated bond in the side chain position, a hydrophilic group and a sulfonamide group, and at least one polymer compound that has an ethylenically unsaturated bond in the side chain position, a hydrophilic group and a cyclic structure derived from a maleimide.

The special polymer compound that has a sulfonamide group is preferably a polymer compound having a bond of $-SO_2-N-$ in a main chain or side chain thereof, and more preferably a polymer compound having a bond of $-SO_2-N-$ in a side chain thereof. The hydrophilic group is preferably in a side chain thereof.

In particular, the presence of this special polymer compound results in an excellent on-press developability, and an excellent nonimage area fine line reproducibility when printing is carried out using a UV ink.

The special polymer compound under consideration is obtained by the copolymerization, for example, in a suitable solvent and using a known polymerization initiator, of a sulfonamide group-containing polymerizable monomer and a hydrophilic group-containing polymerizable monomer.

Examples of the sulfonamide group-containing polymerizable monomer suitably used includes the compounds represented by the following general formulas (Ia) to (Ie) referred generally to general formula (I)):

(Ia)

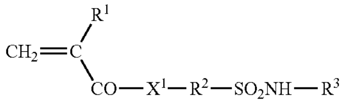

(Ib)

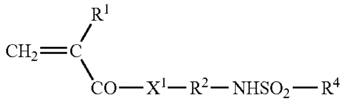

(Ic)

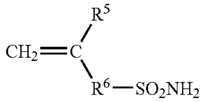

(Id)

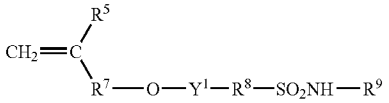

(Ie)

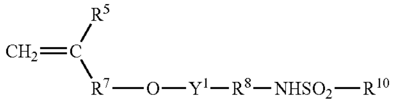

wherein $X^1$ represents O or NR; $R^1$ represents a hydrogen atom or a methyl group; $R^2$, $R^6$ and $R^8$ each independently represent optionally substituted $C_{1-12}$ alkylene, cycloalkylene, arylene or aralkylene group; $R^3$ and $R^9$ each independently represent a hydrogen atom or optionally substituted $C_{1-12}$ alkyl, cycloalkyl, aryl or aralkyl group; $R^4$ and $R^{10}$ each independently represent optionally substituted $C_{1-12}$ alkyl, cycloalkyl, aryl or aralkyl group; $R^5$ represents a hydrogen atom, a halogen atom or a methyl group; $R^7$ represents a single bond, or optionally substituted $C_{1-12}$ alkylene, cycloalkylene, arylene or aralkylene group; R represents a hydrogen atom, or optionally substituted $C_{1-12}$ alkyl, cycloalkyl, aryl or aralkyl group; and $Y^1$ represents a single bond or a carbonyl group.

Among the monomer represented by the formula (Ia) or (Ib), preferred used in the present invention includes those wherein $R^1$ represents a hydrogen atom or a methyl group, $R^2$ represents $C_{2-6}$ alkylene, cycloalkylene, or optionally substituted phenylene or naphthylene, $R^3$ represents a hydrogen atom, $C_{1-6}$ alkyl, cycloalkyl or optionally substituted phenyl or naphthyl, $R^4$ represents $C_{1-6}$ alkyl, cycloalkyl or optionally substituted phenyl or naphthyl, $X^1$ represents O or NR, and R represents a hydrogen atom, $C_{1-6}$ alkyl, cycloalkyl or optionally substituted phenyl or naphthyl.

These monomers include for example, methacrylamides such as N-(o-aminosulfonylphenyl)methacrylamide, N-(m-aminosulfonylphenyl)methacrylamide, N-(p-aminosulfonylphenyl)methacrylamide, N-(o-aminosulfonylphenyl) methacrylamide, N-(m-methylaminosulfonylphenyl) methacrylamide, N-(p-methylaminosulfonylphenyl) methacrylamide, N-(o-ethylaminosulfonylphenyl) methacrylamide, N-(m-ethylaminosulfonylphenyl) methacrylamide, N-(p-ethylaminosulfonylphenyl) methacrylamide, N-(o-n-propylaminosulfonylphenyl) methacrylamide, N-(m-n-propylaminosulfonylphenyl) methacrylamide, N-(p-n-propylaminosulfonylphenyl) methacrylamide, N-(o-i-propylaminosulfonylphenyl) methacrylamide, N-(m-i-propylaminosulfonylphenyl) methacrylamide, N-(p-i-propylaminosulfonylphenyl) methacrylamide, N-(o-n-butylaminosulfonylphenyl) methacrylamide, N-(m-n-butylaminosulfonylphenyl) methacrylamide, N-(p-n-butylaminosulfonylphenyl) methacrylamide, N-(o-i-butylaminosulfonylphenyl) methacrylamide, N-(m-i-butylaminosulfonylphenyl) methacrylamide, N-(p-i-butylaminosulfonylphenyl) methacrylamide, N-(o-sec-butylaminosulfonylphenyl) methacrylamide, N-(m-sec-butylaminosulfonylphenyl) methacrylamide, N-(p-sec-butylaminosulfonylphenyl) methacrylamide, N-(o-t-butylaminosulfonylphenyl) methacrylamide, N-(m-t-butylaminosulfonylphenyl) methacrylamide, N-(p-t-butylaminosulfonylphenyl) methacrylamide, N-(o-phenylaminosulfonylphenyl) methacrylamide, N-(m-phenylaminosulfonylphenyl) methacrylamide, N-(p-phenylaminosulfonylphenyl) methacrylamide, N-(o-(α-naphthylaminosulfonyl)phenyl) methacrylamide, N-(m-(α-naphthylaminosulfonyl)phenyl) methacrylamide, N-(p-(α-naphthylaminosulfonyl)phenyl) methacrylamide, N-(o-(β-naphthylaminosulfonyl)phenyl) methacrylamide, N-(m-(β-naphthylaminosulfonyl)phenyl) methacrylamide, N-(p-(β-naphthylaminosulfonyl)phenyl) methacrylamide, N-(1-(3-aminosulfonyl)naphthyl) methacrylamide, N-(1-(3-methylaminosulfonyl)naphthyl) methacrylamide, N-(1-(3-ethylaminosulfonyl)naphthyl) methacrylamide, N-(o-methylsulfonylaminophenyl) methacrylamide, N-(m-methylsulfonylaminophenyl) methacrylamide, N-(p-methylsulfonylaminophenyl) methacrylamide, N-(α-ethylsulfonylaminophenyl) methacrylamide, N-(m-ethylsulfonylaminophenyl) methacrylamide, N-(p-ethylsulfonylaminophenyl) methacrylamide, N-(o-phenylsulfonylaminophenyl) methacrylamide, N-(m-phenylsulfonylaminophenyl) methacrylamide, N-(p-phenylsulfonylaminophenyl) methacrylamide, N-(o-(p-methylphenylsulfonylamino) phenyl)methacrylamide, N-(m-(p-methylphenylsulfonylamino)phenyl)methacrylamide, N-(p-(p-methylphenylsulfonylamino)phenyl)methacrylamide, N-(p-(α-naphthylsulfonylamino)phenyl)methacrylamide, N-(p-(β-naphthylsulfonylamino)phenyl)methacrylamide, N-(2-methylsulfonylaminoethyl)methacrylamide, N-(2-ethylsulfonylaminoethyl)methacrylamide, N-(2-phenylsulfonylaminoethyl)methacrylamide, N-(2-p-methyl phenylsulfonylaminoethyl)methacrylamide, N-(2-α-naphthylsulfonylaminoethyl)methacrylamide, N-(2-β-naphthylsulfonylamino)ethylmethacrylamide, N-(m-dimethylaminosulfonylphenyl)methacrylamide, N-(p-dimehylaminosulfonylphenyl)methacrylamide, N-(o-diethylaminosulfonylphenyl)methacrylamide, N-(m-diethylaminosulfonylphenyl)methacrylamide, N-(p-diethylaminosulfonylphenyl)methacrylamide and the like, acrylamides having a similar substituent with the above mentioned ones, methacrylates such as o-aminosulfonylphenylmethacrylate, m-aminosulfonylphenylmethacrylate, p-aminosulfonylphenylmethacrylate, o-methylaminosulfonylphenylmethacrylate, m-methylaminosulfonylphenylmethacrylate, p-methylaminosulfonylphenylmethacrylate, o-ethylaminosulfonylphenylmethacrylate, m-ethylaminosulfonylphenylmethacrylate, p-ethylaminosulfonylphenylmethacrylate, o-n-propylaminosulfonylphenylmethacrylate, m-n-propylaminosulfonylphenylmethacrylate, p-n-propylaminosulfonylphenylmethacrylate, o-i-propylaminosulfonylphenylmethacrylate, m-i-propylaminosulfonylphenylmethacrylate, o-n-butylaminosulfonylphenylmethacrylate, m-n-butylaminosulfonylphenylmethacrylate, p-n-butylaminosulfonylphenylmethacrylate, m-i-butylaminosulfonylphenylmethacrylate, p-i-butylaminosulfonylphenylmethacrylate, m-sec-butylaminosulfonylphenylmethacrylate, p-sec-butylaminosulfonylphenylmethacrylate, m-t-butylaminosulfonylphenylmethacrylate, p-t-butylaminosulfonylphenylmethacrylate, o-phenylaminosulfonylphenylmethacrylate, m-phenylaminosulfonylphenylmethacrylate, p-phenylaminosulfonylphenylmethacrylate, m-(α-naphthylaminosulfonyl)phenylmethacrylate, p-(α-naphthylaminosulfonylphenyl)methacrylate, m-(β-naphthylaminosulfonyl)phenylmethacrylate, p-(β-naphthylaminosulfonyl)phenylmethacrylate, 1-(3-aminosulfonyl) naphthylmethacrylate, 1-(3-methylaminosulfonyl) naphthylmethacrylate, 1-(3-ethylaminosulfonyl) naphthylmethacrylate, o-methylsulfonylaminophenylmethacrylate, m-methylsulfonylaminophenylmethacrylate, p-methylsulfonylaminophenylmethacrylate, o-ethylsulfonylaminophenylmethacrylate, m-ethylsulfonylaminophenylmethacrylate, p-ethylsulfonylaminophenylmethacrylate, o-phenylsulfonylaminophenylmethacrylate, m-phenylsulfonylaminophenylmethacrylate, p-phenylsulfonylaminophenylmethacrylate, o-(p-methylphenylsulfonylamino)phenylmethacrylate, m-(p-methylphenylsulfonylamino)phenylmethacrylate, p-(p-methylphenylsulfonylamino)phenylmethacrylate, p-(α-naphthylsulfonylamino)phenylmethacryalte, p-(β-naphthylsulfonylamino)phenylmethacryalte, 2-methylsulfonylaminoethylmethacrylate, 2-ethylsulfonylaminoethylmethacrylate, 2-phenylsulfonylaminoethylmethacrylate, 2-p-methylphenylsulfonylaminoethylmethacrylate, 2-α-naphthylsulfonylaminoethylmethacrylate, 2-β-naphthylsulfonylaminoethylmethacrylate, o-dimethylaminosulfonylphenylmethacrylate, m-dimethylaminosulfonylphenylmethacrylate, p-dimethylaminosulfonylphenylmethacrylate, o-dimethylaminosulfonylphenylmethacrylate, m-diethylaminosulfonylphenylmethacrylate, p-diethylaminosulfonylphenylmethacrylate, and acrylates having a similar substituent with the above mentioned ones, and the like.

Among the monomer represented by the formulas (Ic) to (Ie), preferred includes those wherein $R^5$ represents a hydrogen atom, $R^6$ represents optionally substituted methylene, phenylene or naphthylene, $R^7$ represents a single bond or methylene group, $R^8$ represents $C_{1-6}$ alkylene, or optionally substituted phenylene or naphthylene, $R^9$ represents a hydrogen atom, $C_{1-6}$ alkyl, cycloalkyl, optionally substituted phenyl or naphthyl, $R^{10}$ represents $C_{1-6}$ alkyl, cycloalkyl, or optionally substituted phenyl or naphthyl, and $Y^1$ represents a single bond or a carbonyl group.

Specific examples of the compound represented by the formulas (Ic) to (Ie) are p-aminosulfonyl styrene, p-aminosulfonyl-α-methylstyrene, p-aminosulfonylphenylallylether, p-(N-methylaminosulfonyl)phenylallylether, p-(N-dimethylaminosulfonyl)phenylallylether, methylsulfonylamino vinyl acetate ester, phenylsulfonylamino vinyl acetate ester, methylsulfonylamino allyl acetate estser, phenylsulfonylamino allyl acetate estser, p-methylsulfonylaminophenyl allyl ether, and the like.

Only a single sulfonamide group-containing structural unit may be used in the special polymer compound according to the present invention, or two or more sulfonamide group-containing structural units may be present in the special polymer compound. Viewed in particular from the perspective of on-press developability, the fine line reproducibility (especially scumming of nonimage areas sandwiched between fine lines, when UV ink comprising a polymerizable monomer is used), and dispersion ability of development scum, the special polymer compound contains preferably 1 to 80 mol %, more preferably 10 to 80 mol %, and most preferably 20 to 70 mol % sulfonamide group-containing structural unit.

The special polymer compound that has a cyclic structure derived from a maleimide is preferably a polymer compound whose cyclic structure derived from a maleimide is a unsubstituted maleimide or a cyclic structure derived from maleimide having diverse substituent on the nitrogen atom, and these structures may be preferably represented by the following formula (I):

(I)

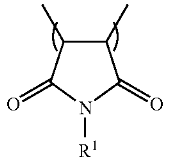

wherein, $R^1$ represents a hydrogen atom or an optionally substituted monovalent organic group, and in terms of the resistance to chemicals, $R^1$ preferably represents an optionally substituted monovalent organic group.

Monovalent organic group suitably used includes $C_{1-12}$ alkyl group and $C_{6-14}$ aryl group, and the aryl group is preferable in terms of improvement of the resistance to chemicals, and specifically phenyl group is preferable.

Substituents that can be introduced into the organic group include acidic group showing an alkali-solubility such as hydroxyl, carboxyl, sulfonamide, active imide groups and the like, a polar substituent having a hydrogen atom that can perform hydrogen bond or a heteroatom such as amide, cyano, nitro, carboxylate ester, sulfonate ester, acyl groups and the like, a hydrocarbon group such as alkyl, aryl groups and the like, and heterocyclic group wherein the ring thereof contains an atom such as nitrogen, oxygen, sulfur and the like. Hydroxyl or sulfonamide group is preferable for a substituent into an aryl group.

The cyclic structure derived from a maleimide suitably used in the special polymer compound according to the present invention includes the followings, however the present invention is not limited thereto.

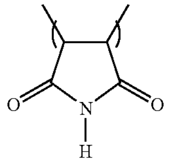
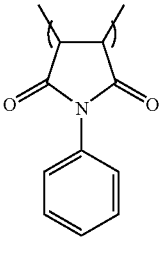
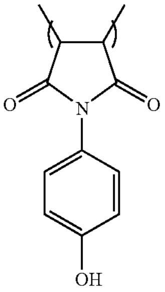

-continued

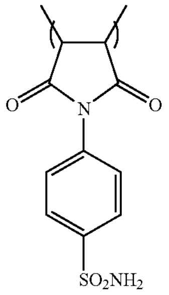

Only a single cyclic structure derived from a maleimide may be used in the special polymer compound according to the present invention, or two or more cyclic structure derived from a maleimide may be present in the special polymer compound. Viewed in particular from the perspective of on-press developability, the fine line reproducibility (especially scumming of nonimage areas sandwiched between fine lines, when a UV ink comprising a polymerizable monomer is used), and dispersion ability of development scum, the special polymer compound contains preferably 1 to 80 mol %, more preferably 30 to 70 mol % cyclic structure derived from a maleimide.

The special polymer compound used by the present invention also contains a hydrophilic group. This hydrophilic group speeds up the on-press developability of the photopolymerizable layer and additionally, it acts to lessen the problems of impaired press maintainability and impaired printing quality that are caused when components of the on-press-developed photopolymerizable layer form a scum on the dampening roller and ink roller.

This hydrophilic group can be exemplified by the hydroxyl group, carboxyl group, carboxylate group, hydroxyethyl group, alkylene oxide structures, hydroxypropyl group, polyoxyethyl group, polyoxypropyl group, amino group, aminoethyl group, aminopropyl group, ammonium group, amide group, carboxymethyl group, sulfonic acid group, phosphoric acid group, and so forth, wherein preferred examples are the amide group, hydroxyl group, polyoxyethyl group, and alkylene oxide structures. Alkylene oxide structures given by the following general formula (II) are the most preferred. The special polymer compound preferably has this alkylene oxide structure in side chain position.

This alkylene oxide structure exhibits a suitable hydrophilicity while lacking an ionic group, and for this reason provides an excellent balance between image area durability and on-press developability. Moreover, because it also exhibits flexibility due to its straight chain structure, it additionally provides an excellent behavior in terms of not inhibiting microfine-sizing and dispersion of the on-press development scum produced on the rollers in the press.

(II)

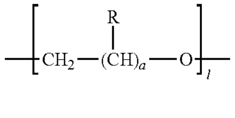

In formula (II), R represents the hydrogen atom or methyl; a is 1, 3, or 5; and l represents an integer from 1 to 9. l is an integer preferably from 1 to 8, more preferably from 1 to 7, even more preferably from 1 to 6, and most preferably from 2 to 4.

The following are specific examples of monomers for introducing a hydrophilic group as described above into the special polymer compound: acrylamide, methacrylamide, N,N-dimethylacrylamide, N-isopropylacrylamide, N-vinylpyrrolidone, N-vinylacetamide, N-acryloylmorpholine, 2-hydroxyethyl acrylate, 2-hydroxyethyl methacrylate, polyoxyethylene monomethacrylate, polyoxyethylene monoacrylate, polyoxypropylene monomethacrylate, and polyoxypropylene monoacrylate. A single one of these or two or more may be used. The content of the hydrophilic group-containing structural unit in the special polymer compound is preferably 1 to 70 mol %, more preferably 10 to 60 mol %, and most preferably 20 to 50 mol %. When too little is present, a satisfactory developability and a satisfactory fine line reproducibility are not obtained; when too much is present, the special polymer compound becomes overly flexible and the printing durability may be unsatisfactory.

In order to improve the film properties of the photopolymerizable layer and improve the on-press developability, at least one ethylenically unsaturated bond is present in side chain position on the special polymer compound according to the present invention. The group having said ethylenically unsaturated bond may be represented, for example, by the formulas (1) to (3) below. In the image areas, these ethylenically unsaturated bond-containing structures, through their reaction with other polymerizable compounds (e.g., monomer present in the photopolymerizable layer), serve to ensure a satisfactory chemical resistance and printing durability. On the other hand, in the nonimage areas, the flexibility is increased due to their presence in side chain position, which enables an improved on-press developability for the unexposed areas.

(1)

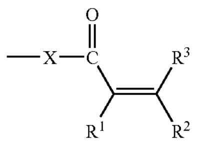

(2)

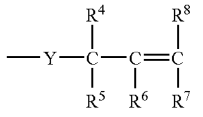

(3)

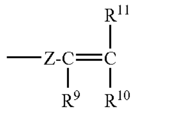

(In the formulas, X and Y each independently represent the oxygen atom, sulfur atom, or —N($R^{12}$)—. Z represents the oxygen atom, sulfur atom, —N($R^{12}$)—, or phenylene. $R^1$ to $R^{12}$ each independently represent a monovalent substituent.)

$R^1$ to $R^3$ in general formula (1) each independently represent a monovalent substituent. For example, $R^1$ can be the hydrogen atom or a monovalent organic group, for example, a possibly substituted alkyl group, whereamong the hydrogen atom, methyl group, methylalkoxy groups, and methyl ester groups are preferred. $R^2$ and $R^3$ are each independently, for example, the hydrogen atom, a halogen atom, the amino group, dialkylamino, the carboxyl group, alkoxycarbonyl, the sulfo group, the nitro group, the cyano group, possibly substituted alkyl, possibly substituted aryl, possibly substituted alkoxy, possibly substituted aryloxy, possibly substituted alkylamino, possibly substituted arylamino, possibly substituted alkylsulfonyl, and possibly substituted arylsulfonyl; preferred thereamong are the hydrogen atom, the carboxyl group, alkoxycarbonyl, possibly substituted alkyl, and possibly substituted aryl. In the case of substitution, the substituents that can be introduced here can be exemplified by methoxycarbonyl, ethoxycarbonyl, isopropyloxycarbonyl, methyl, ethyl, phenyl, and so forth. X represents the oxygen atom, sulfur atom, or —N($R^{12}$)—, and $R^{12}$ can be, for example, possibly substituted alkyl.

$R^4$ to $R^8$ in general formula (2) each independently represent a monovalent substituent, for example, the hydrogen atom, a halogen atom, the amino group, dialkylamino, the carboxyl group, alkoxycarbonyl, the sulfo group, the nitro group, the cyano group, possibly substituted alkyl, possibly substituted aryl, possibly substituted alkoxy, possibly substituted aryloxy, possibly substituted alkylamino, possibly substituted arylamino, possibly substituted alkylsulfonyl, possibly substituted arylsulfonyl, and so forth. Preferred thereamong are the hydrogen atom, the carboxyl group, alkoxycarbonyl, possibly substituted alkyl, possibly and substituted aryl. In the case of substitution, the substituents that can be introduced are exemplified by those provided for general formula (1). Y represents the oxygen atom, sulfur atom, or —N($R^{12}$)—. $R^{12}$ can be as described for general formula (1).

$R^9$ to $R^{11}$ in general formula (3) each independently represent a monovalent substituent, for example, the hydrogen atom, a halogen atom, the amino group, dialkylamino, the carboxyl group, alkoxycarbonyl, the sulfo group, the nitro group, the cyano group, possibly substituted alkyl, possibly substituted aryl, possibly substituted alkoxy, possibly substituted aryloxy, possibly substituted alkylamino, possibly substituted arylamino, possibly substituted alkylsulfonyl, and possibly substituted arylsulfonyl, whereamong the hydrogen atom, carboxyl group, alkoxycarbonyl, possibly substituted alkyl, and possibly substituted aryl are preferred. In the case of substitution, the substituents here are exemplified by those provided for general formula (1). Z represents the oxygen atom, sulfur atom, —N($R^{12}$)—, or phenylene. $R^{12}$ can be as described for general formula (1).

The methacryloyloxy group represented by general formula (1) is preferred among the preceding.

In those instances in which an ethylenically unsaturated bond-containing structural unit as described above is introduced into the special polymer compound, its content according to iodine titration (measurement of the content of radically polymerizable unsaturated double bonds) is preferably 0.1 to 10.0 mmol, more preferably 1.0 to 7.0 mmol, and most preferably 2.0 to 5.5 mmol, in each case per 1 g of the special polymer compound. An excellent sensitivity and an excellent storage stability are obtained in the cited range.

In order to improve various properties, such as the image strength, and insofar as the effects of the present invention are not impaired, in another preferred embodiment at least one other radically polymerizable monomer is copolymerized into the special polymer compound used by the present invention in addition to the substituent-bearing monomer already described in the preceding. Monomer that can be copolymerized into the special polymer binder in the present invention can be exemplified by monomer selected from acrylate esters, methacrylate esters, N,N-disubstituted-acrylamides, N,N-disubstituted-methacrylamides, styrenes, acrylonitriles, and methacrylonitriles.

Specific examples are as follows: acrylate esters such as alkyl acrylates (the alkyl preferably has from 1 to 20 carbons) and so forth, as specifically exemplified by methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate, furfuryl acrylate, tetrahydrofurfuryl acrylate, and so forth, as well as aryl acrylates such as phenyl acrylate and so forth; methacrylate esters such as alkyl methacrylates (the alkyl preferably has from 1 to 20 carbons) and so forth, for example, methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate, tetrahydrofurfuryl methacrylate, and so forth, as well as aryl methacrylates such as phenyl methacrylate, cresyl methacrylate, naphthyl methacrylate, and so forth; styrenes such as styrene, alkylstyrenes, and so forth, for example, methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene, acetoxymethylstyrene, and so forth, and also alkoxystyrenes such as methoxystyrene, 4-methoxy-3-methylstyrene, dimethoxystyrene, and so forth, as well as halostyrenes such as chlorostyrene, dichlorostyrene, trichlorostyrene, tetrachlorostyrene, pentachlorostyrene, bromostyrene, dibromostyrene, iodostyrene, fluorostyrene, trifluorostyrene, 2-bromo-4-trifluoromethylstyrene, 4-fluoro-3-trifluoromethylstyrene; acrylonitrile; and methacrylonitrile.

The special polymer compound used by the present invention may also contain an ester group with the following formula (III) or an amide group with the following formula (IV) in the molecule.

(III)

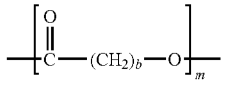

(IV)

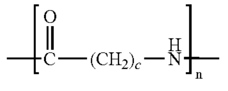

In the preceding formulas, b is an integer from 2 to 5; c is an integer from 2 to 7; and m and n each independently represent integers from 1 to 100.

Preferred for use among the preceding radically polymerizable monomers are the acrylate esters, methacrylate esters, and styrenes. One or two or more of these can be used, and a suitable content for these copolymerization components is 0 to 95 mol % and particularly preferably 20 to 90 mol %.

The special polymer compound used in the present invention may be a block copolymer, random copolymer, or graft copolymer.

The solvent used in the synthesis of the special polymer compound used by the present invention can be exemplified by ethylene dichloride, cyclohexanone, methyl ethyl ketone, acetone, methanol, ethanol, propanol, butanol, ethylene glycol monomethyl ether, ethylene glycol monoethyl ether, 2-methoxyethy acetate, 1-methoxy-2-propanol, 1-methoxy-2-propyl acetate, N,N-dimethylformamide, N,N-dimethylacetamide, dimethyl sulfoxide, toluene, ethyl acetate, methyl lactate, ethyl lactate, and so forth. A single one of these solvents or a mixture of two or more may be used.

The mass-average molecular weight Mw of the special polymer compound used by the present invention is preferably at least 2,000 and more preferably is in the range of 5,000 to 300,000. The range of 20,000 to 300,000 is even more preferred from the standpoint of the chemical resistance, while the range of 20,000 to 100,000 is most preferred from the standpoint of the on-press developability. In addition, the special polymer binder according to the present invention may contain unreacted monomer. The proportion of the monomer in the special polymer binder in such a case is desirably no more than 15 mass %.

The content of the special polymer compound present in the photopolymerizable layer in the negative-working lithographic printing plate precursor of the present invention is preferably 5 to 95 mass % as the solids fraction, and more preferably 10 to 85 mass % as the solids fractions. An excellent image area strength and an excellent image formability are obtained in the cited range.

Specific examples of the special polymer compound used by the present invention are shown below, but this polymer compound used by the present invention is not limited to the following examples, and use can be made of appropriate changes in the structure and quantity of addition brought about by the combination with the components of the coating fluid for producing the printing plate precursor.

(1)

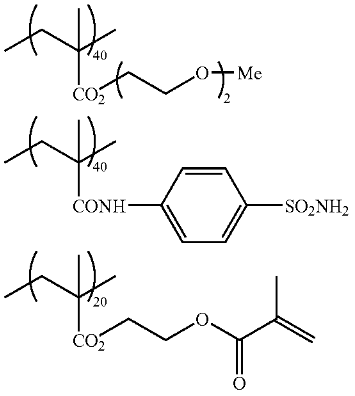

(2)

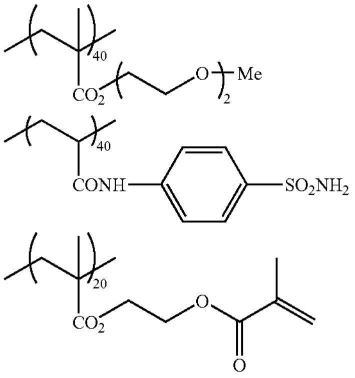

(3)

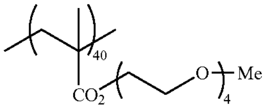

-continued

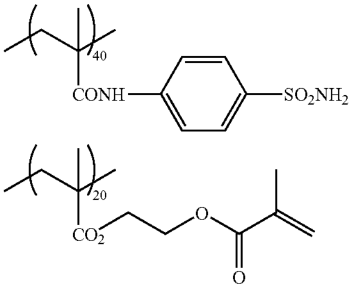

(4)

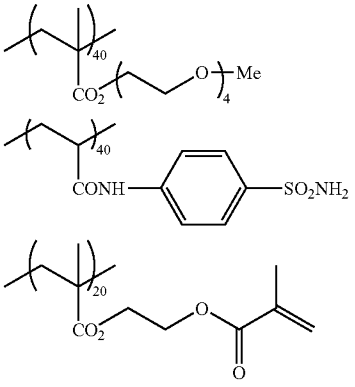

(5)

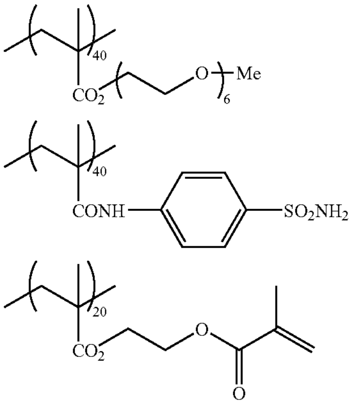

(6)

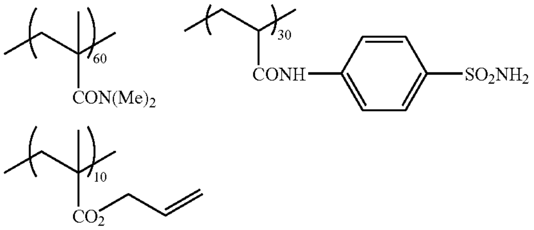

(7)

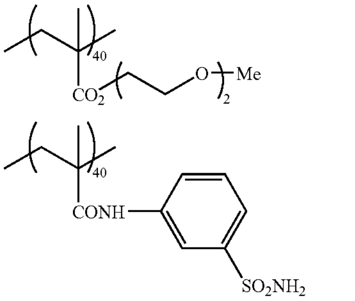

-continued
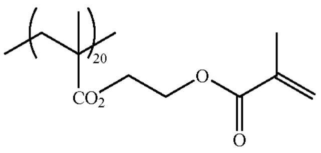
(8)
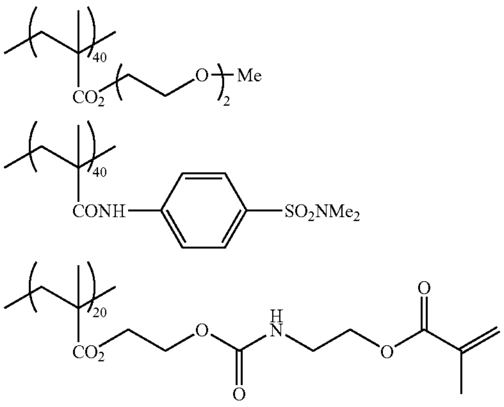
(9)
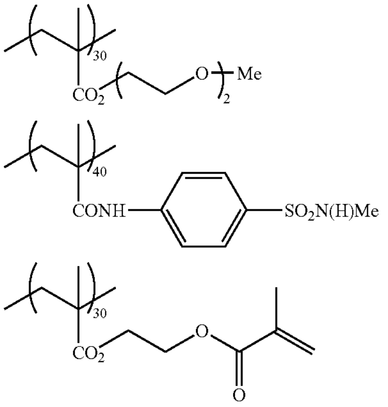
(10)
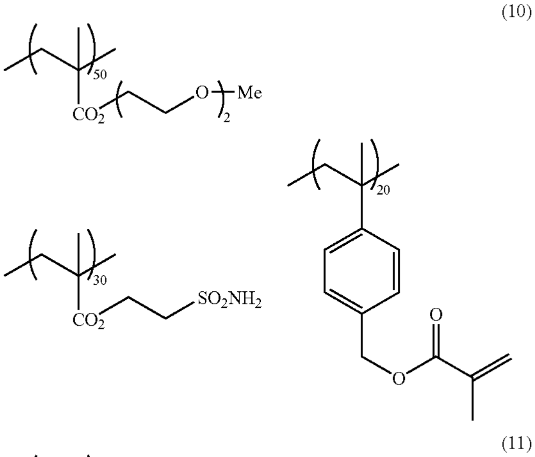
(11)
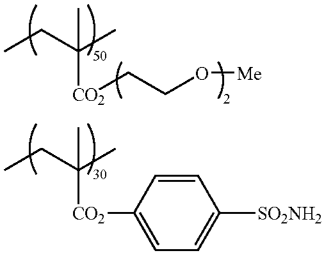
-continued
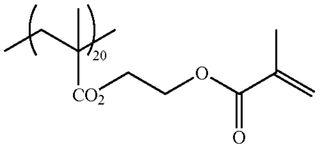
(12)
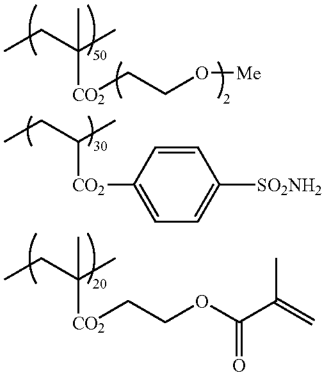
(13)
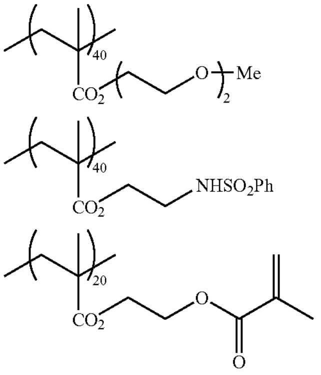
(14)
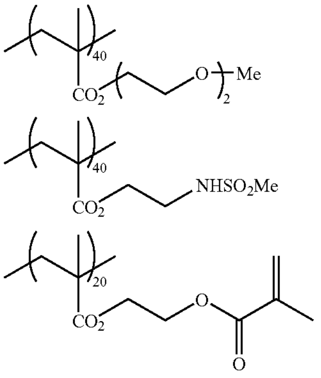
(15)
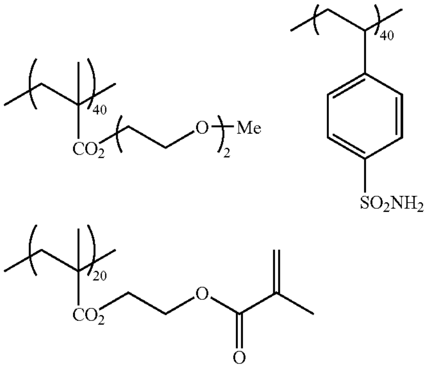

-continued
(16)
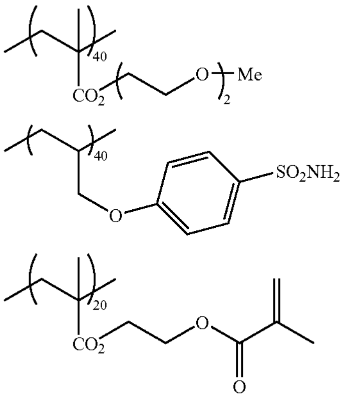
(17)
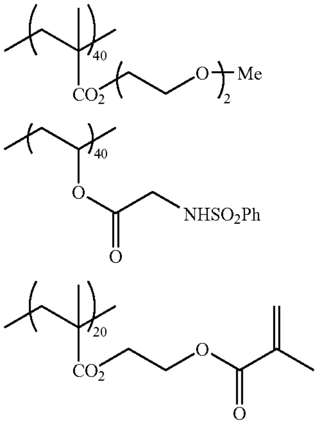
(18)
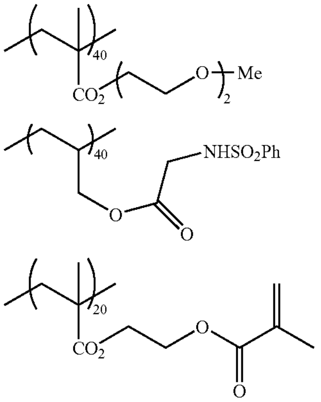
(19)
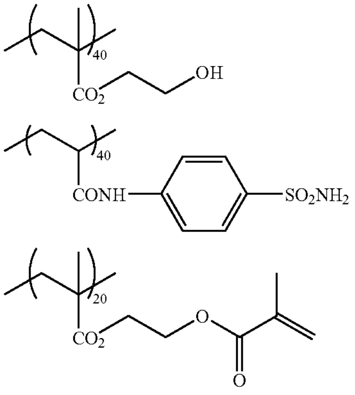
-continued
(20)
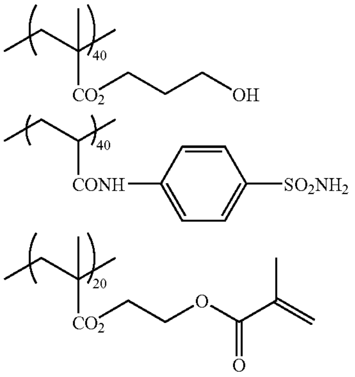
(21)
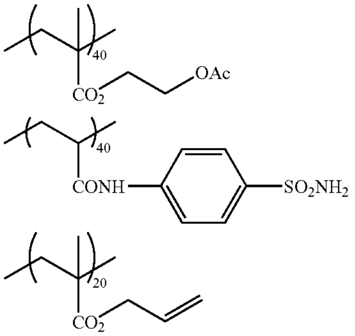
(22)
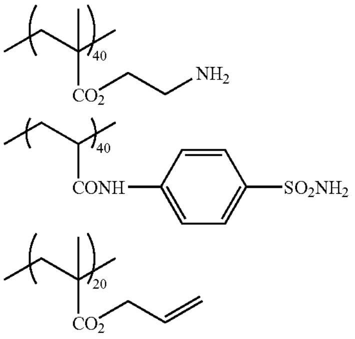
(23)
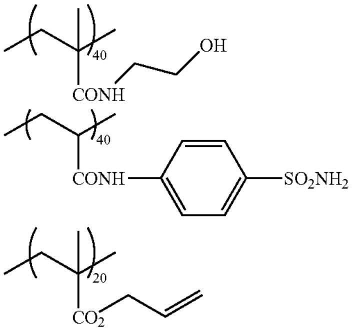
(24)
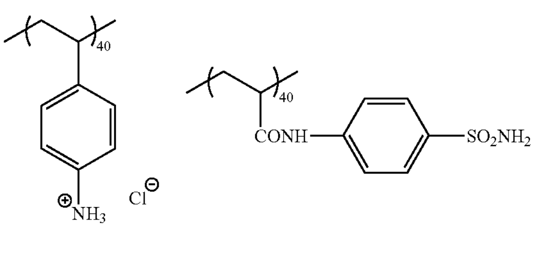

-continued
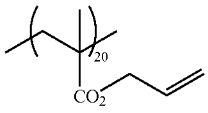
(25)
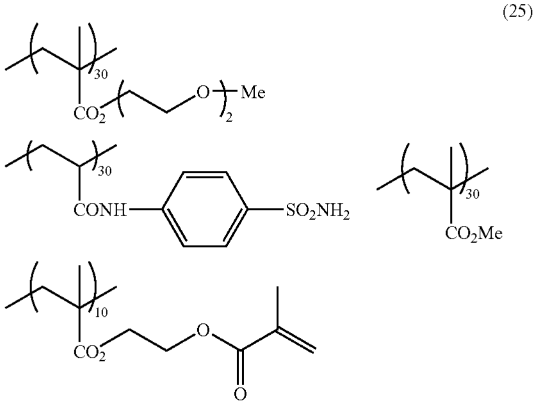
(26)
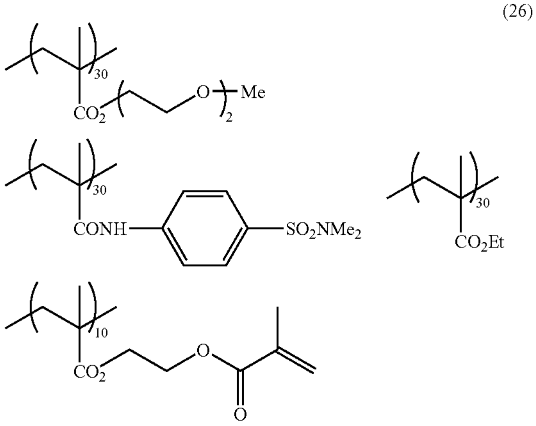
(27)
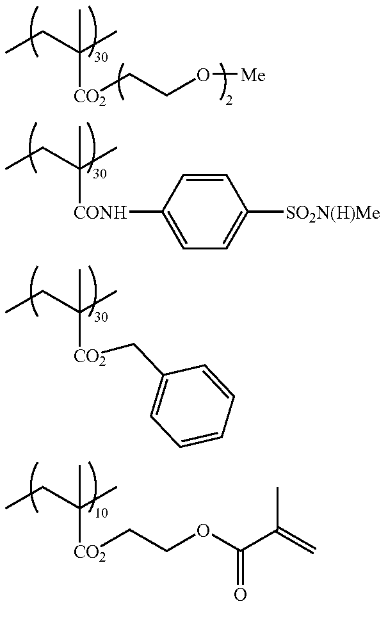
(28)
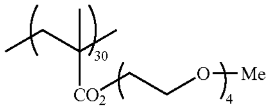
-continued
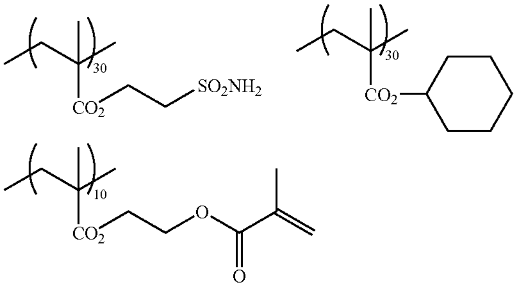
(29)
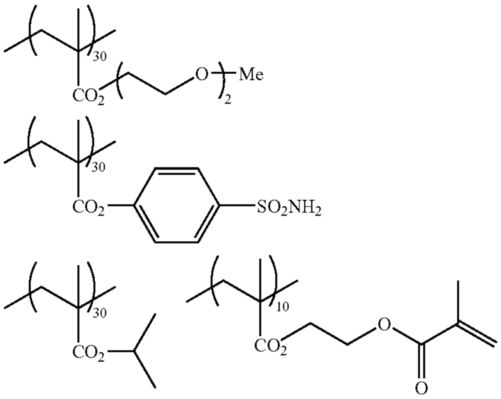
(30)
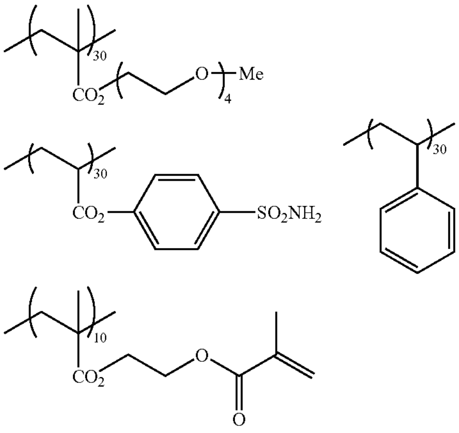
(37)
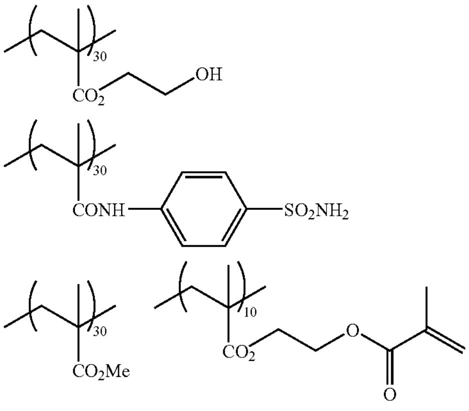
(38)
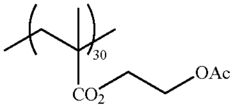

-continued
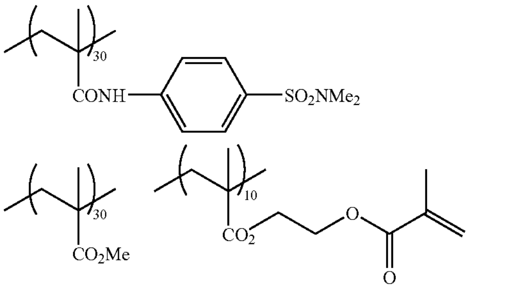
(39)
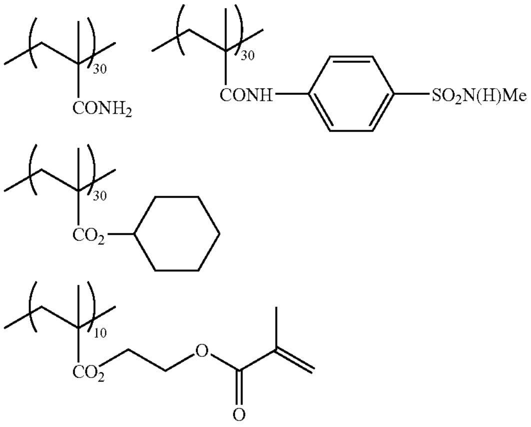
(40)
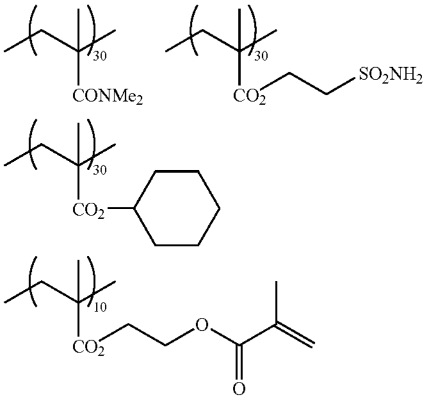
(41)
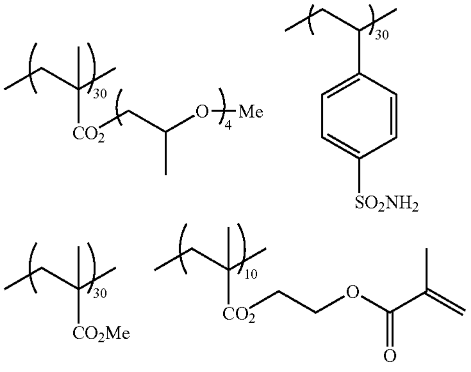
(42)
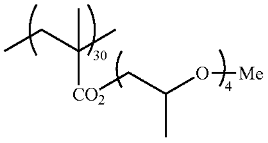
-continued
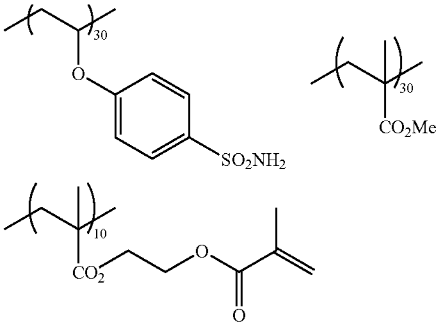
(43)
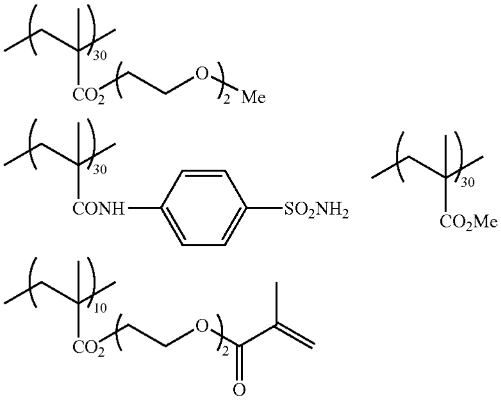
(44)
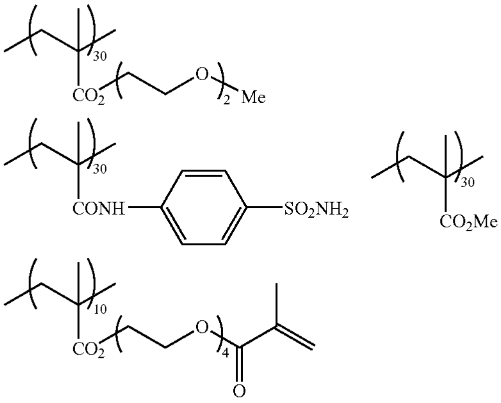
(45)
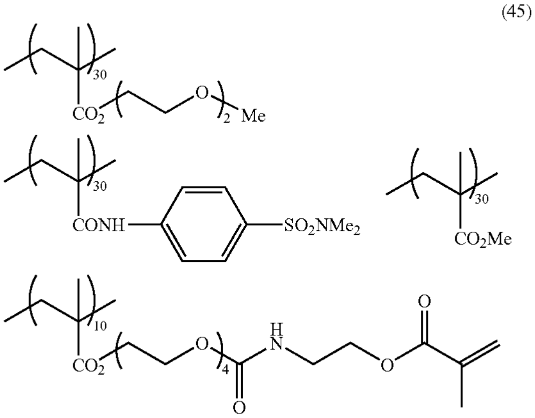
(46)
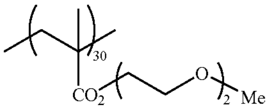

-continued
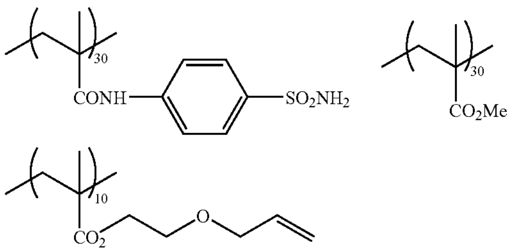
(47)
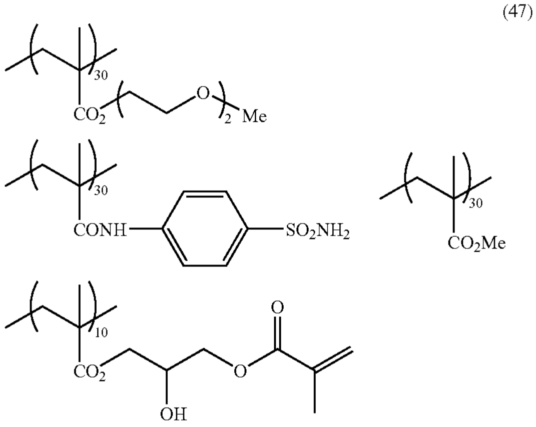
(48)
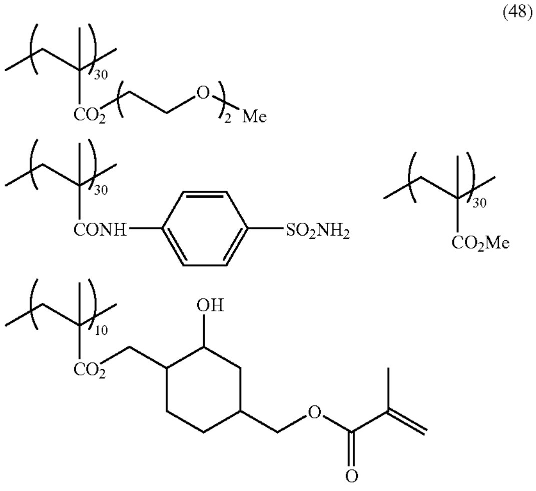
(49)
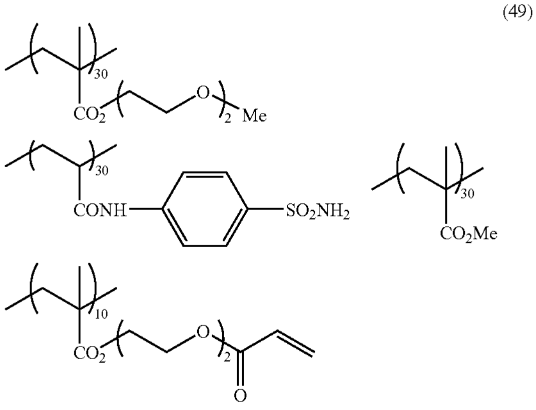
(50)
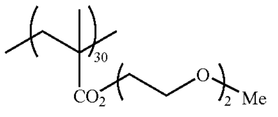
-continued
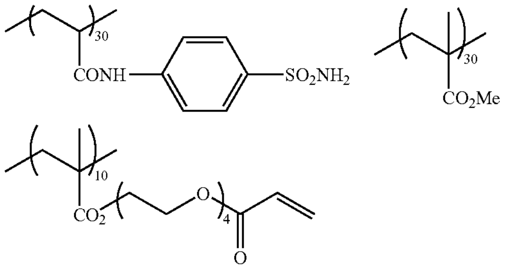
(51)
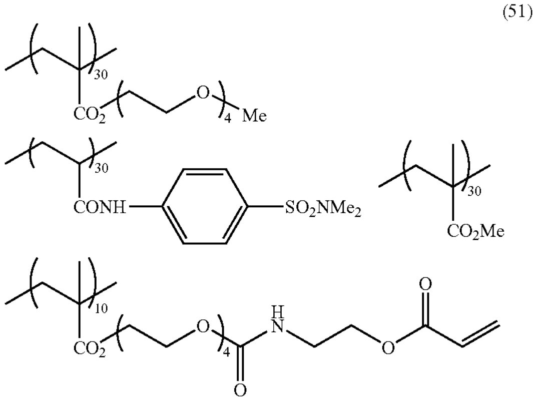
(52)
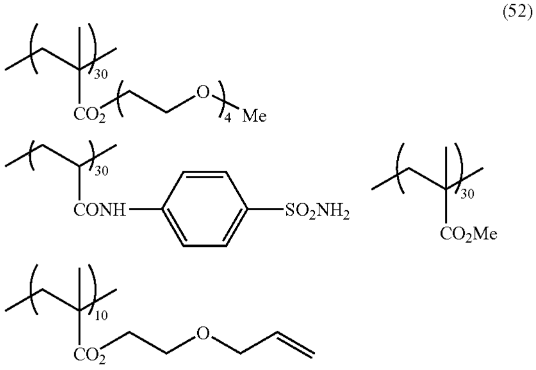
(53)
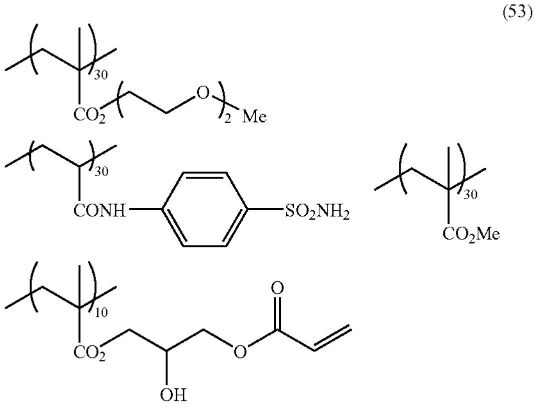
(54)
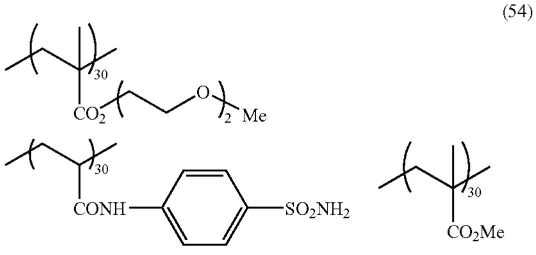

-continued
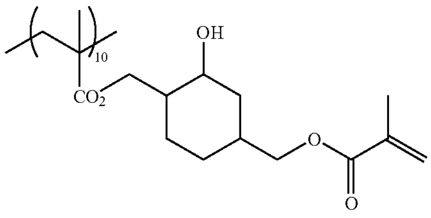
(55)
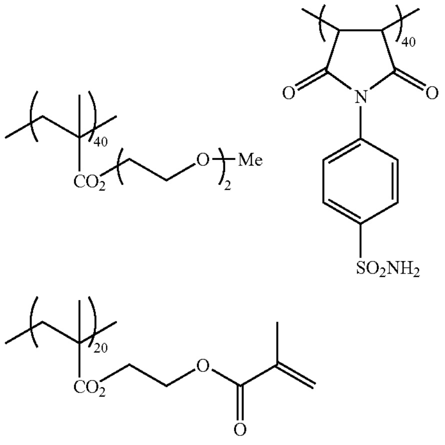
(56)
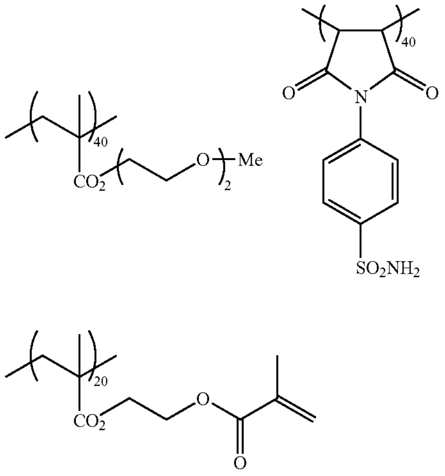
(57)
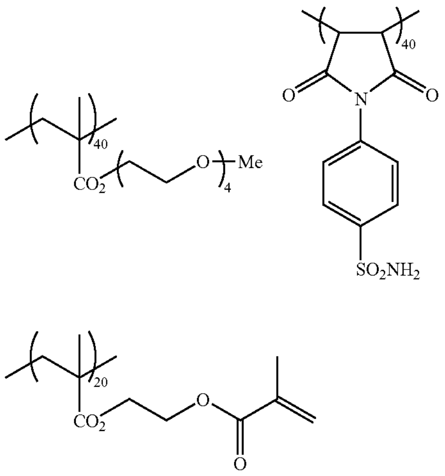
-continued
(58)
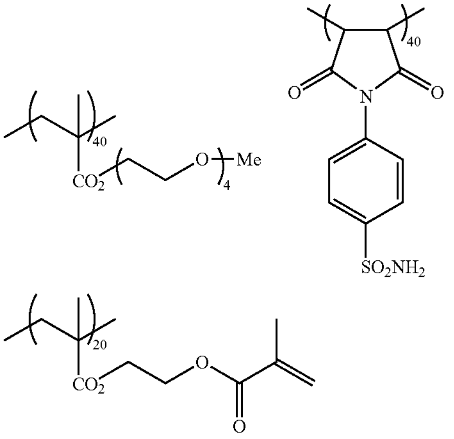
(59)
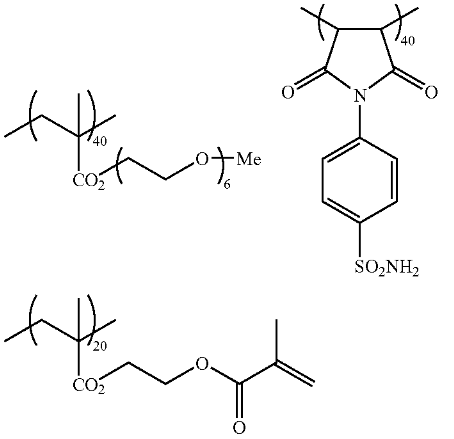
(60)
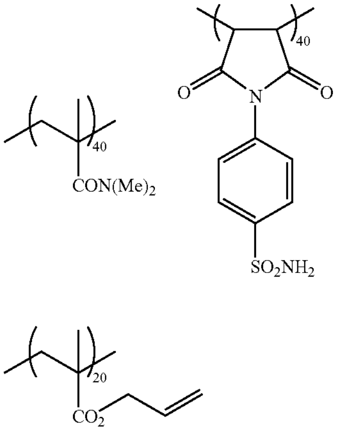
(61)
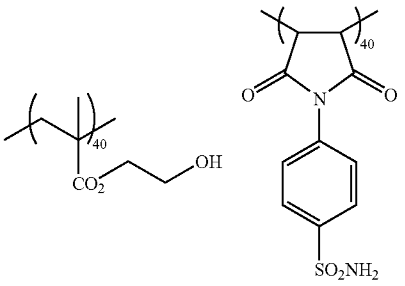

-continued
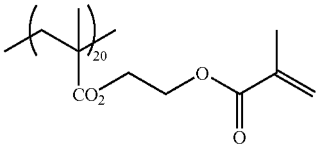
(62)
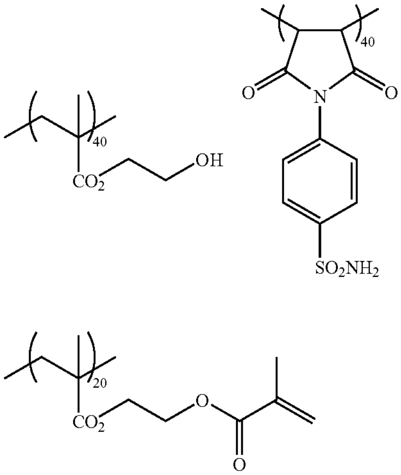
(63)
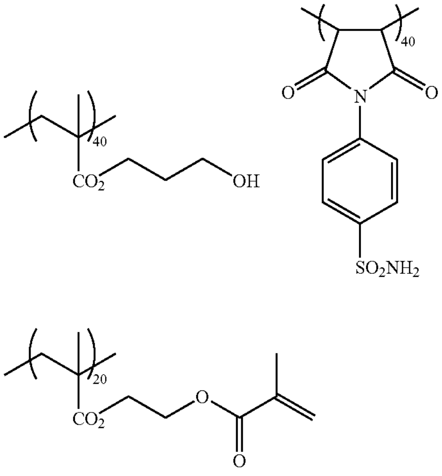
(64)
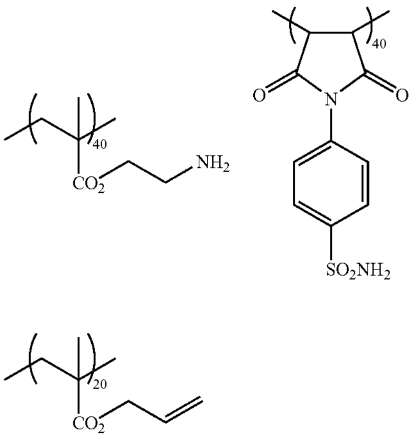
-continued
(65)
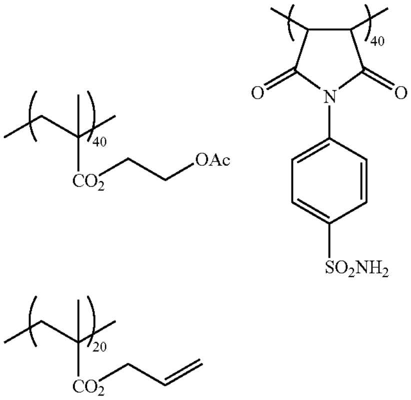
(66)
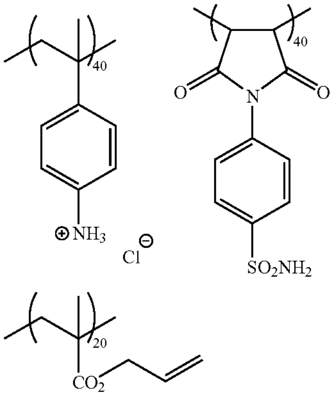
(67)
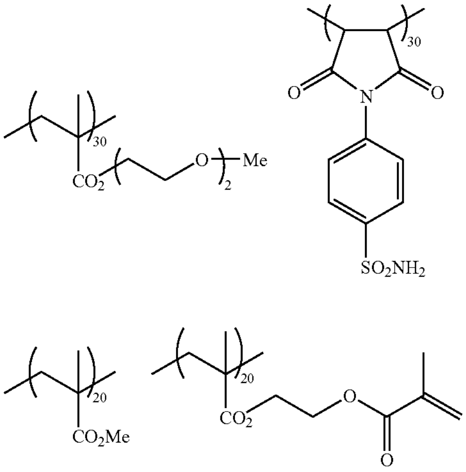
(68)
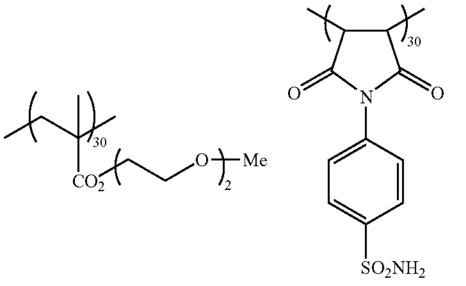

-continued
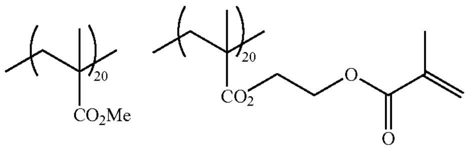
(69)
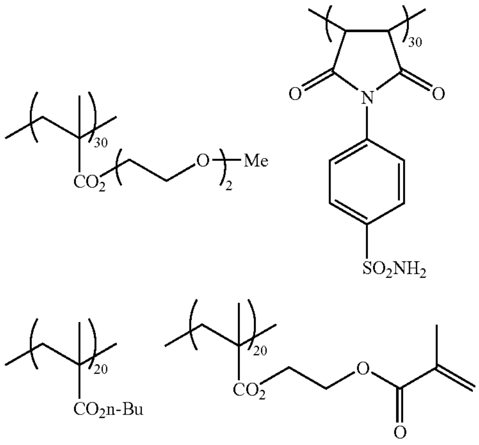
(70)
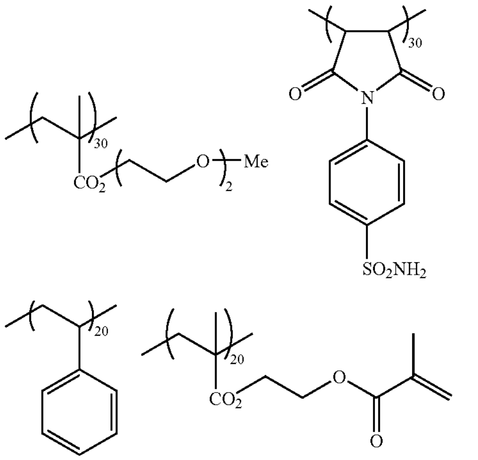
(71)
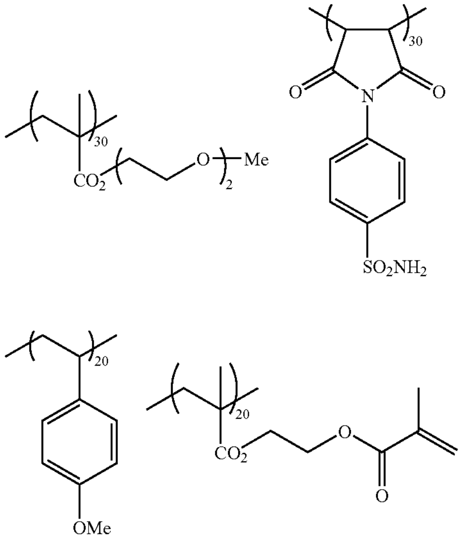
-continued
(72)
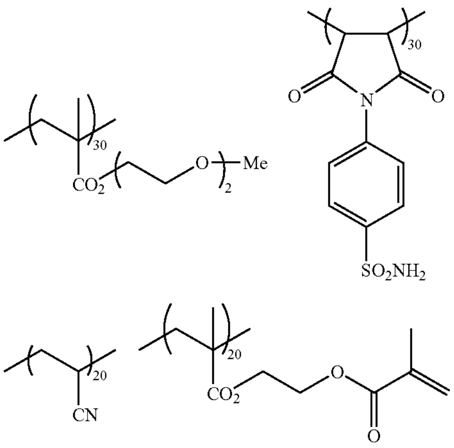
(73)
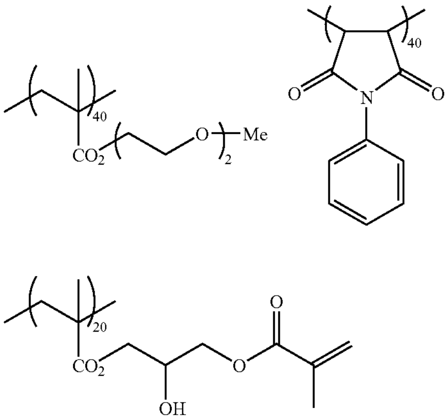
(74)
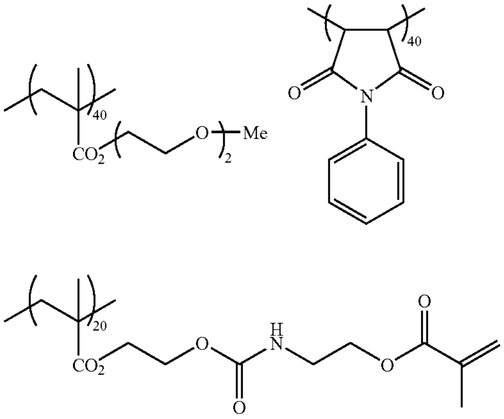
(75)
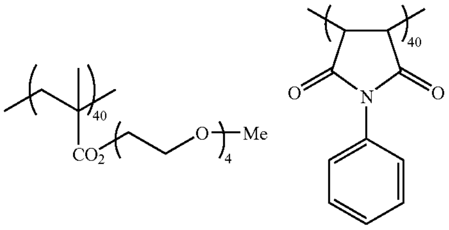

-continued
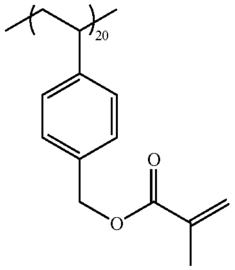
(76)
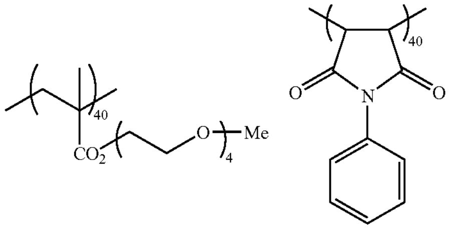
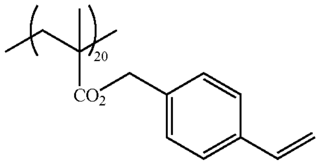
(77)
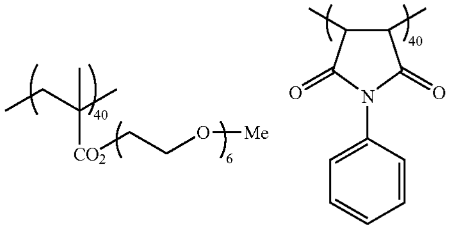
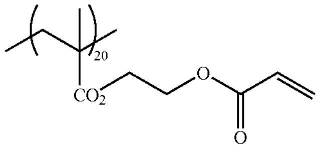
(78)
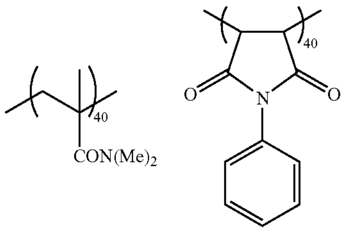
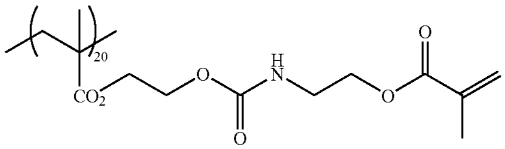
(79)
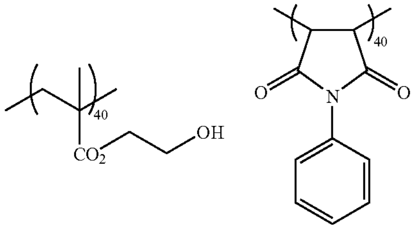
-continued
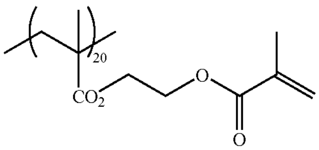
(80)
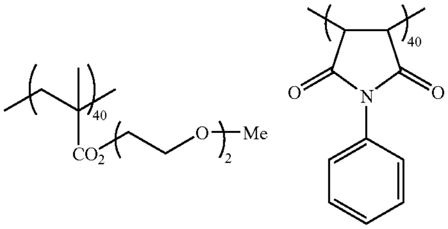
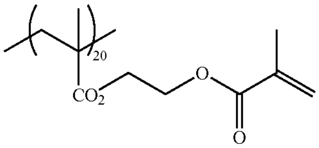
(81)
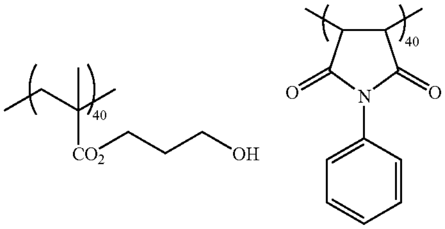
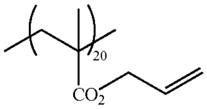
(82)
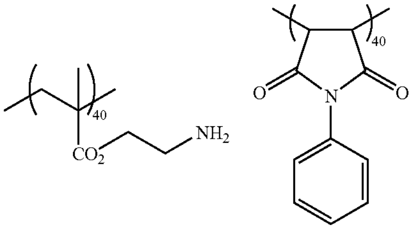
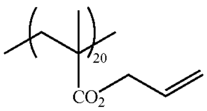
(83)
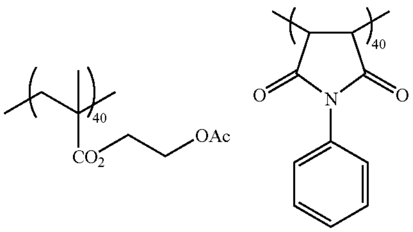
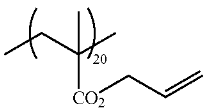

-continued (84)

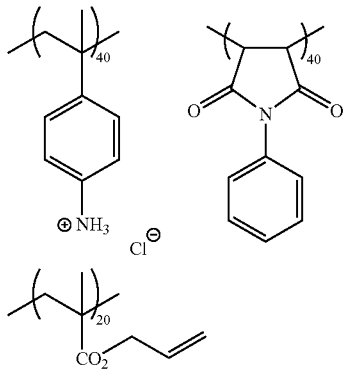

[Other Binder Polymers]

Along with the special polymer compound described in the preceding, heretofore known binder polymers may be used without limitation in the negative-working lithographic printing plate precursor of the present invention, whereamong chain-form organic polymers having a film-forming capacity are preferred. Examples of such binder polymers are acrylic resins, polyvinyl acetal resins, polyurethane resins, polyurea resins, polyimide resins, polyamide resins, epoxy resins, methacrylic resins, polystyrene resins, novolac-type phenolic resins, polyester resins, synthetic rubbers, and natural rubbers.

The binder polymer may be crosslinkable in order to improve the film strength of the image areas. A crosslinkable functional group, e.g., an ethylenically unsaturated bond, may be introduced into the main chain of the polymer or in side chain position on the polymer in order to impart crosslinkability to the binder polymer. The crosslinkable functional group may be introduced through copolymerization.

Examples of polymers that have ethylenically unsaturated bonds in the molecular main chain are poly-1,4-butadiene, poly-1,4-isoprene, and so forth.

Examples of polymers that have ethylenically unsaturated bonds in side chain position on the molecule are polymers of an ester or amide of acrylic acid or methacrylic acid wherein the ester or amide residue (R in —COOR or CONHR) contains an ethylenically unsaturated bond.

Examples of the ethylenically unsaturated bond-containing residue (the R cited above) are as follows: $-CR^1=CR^2R^3$, $-(CH_2)_nCR^1=CR^2R^3$, $-(CH_2O)_nCH_2CR^1=CR^2R^3$, $-(CH_2CH_2O)_nCH_2CR^1=CR^2R^3$, $-(CH_2)_nNH-CO-O-CH_2CR^1=CR^2R^3$, $-(CH_2)_n-O-CO-CR^1=CR^2R^3$, and $(CH_2CH_2O)_2-X$ (in these formulas, $R^1$ to $R^3$ each represent the hydrogen atom, a halogen atom, or $C_{1-20}$ alkyl, aryl, alkoxy, or aryloxy; $R^1$ may be bonded with $R^2$ or $R^3$ to form a ring; n is an integer from 1 to 10; and X is the dicyclopentadienyl residue).

The following are specific examples of the ester residue: $-CH=CH_2$, $-C(CH_3)=CH_2$, $-CH_2CH=CH_2$ (described in Japanese Patent Publication No. Hei 7-21633), $-CH_2CH_2O-CH_2CH=CH_2$, $CH_2C(CH_3)=CH_2$, $-CH_2CH=CH-C_6H_5$, $-CH_2CH_2OCOCH=CH-C_6H_5$, $-CH_2CH_2-NHCOO-CH_2CH=CH_2$, and $CH_2CH_2O-X$ (X in the formula represents the dicyclopentadienyl residue).

The following are specific examples of the amide residue: $-CH=CH_2$, $-C(CH_3)=CH_2$, $-CH_2CH=CH_2$, $-CH_2CH_2-Y$ (Y in the formula represents the cyclohexene residue), and $-CH_2CH_2-OCO-CH=CH_2$.

For example, a free radical (polymerization-initiating radical or the propagating radical in the polymerization process based on the polymerizable monomer) adds to the crosslinkable functional group in the crosslinkable binder polymer; addition polymerization occurs between polymers, either directly or through a polymer chain from the polymerizable monomer; and curing occurs through the formation of crosslinks between the polymer molecules. Alternatively, an atom in the polymer (for example, a hydrogen atom on a carbon atom adjacent to the functional crosslinking group) is abstracted by a free radical to produce polymer radicals and these bond to each other to bring about curing by the formation of crosslinks between polymer molecules.

The crosslinkable group content in the binder polymer (content of the radically polymerizable unsaturated double bonds as determined by iodine titration) is preferably 0.1 to 10.0 mmol, more preferably 1.0 to 7.0 mmol, and most preferably 2.0 to 5.5 mmol, in each case per 1 g of the binder polymer. An excellent sensitivity and an excellent storage stability are obtained in the cited range.

Viewed from the perspective of improving the on-press developability, the binder polymer preferably has a high solubility or dispersibility in the ink and/or fountain solution.

The binder polymer is preferably hydrophilic in order to improve the solubility or dispersibility in fountain solutions, on the other hand, in terms of balance with ink-receptivity, the combined used of an oleophilic binder polymer and a hydrophilic binder polymer is also effective in the present invention.

Suitable examples of hydrophilic binder polymers are binder polymers that contain a hydrophilic group such as the hydroxyl group, the carboxyl group, a carboxylate group, hydroxyethyl, polyoxyethyl, hydroxypropyl, polyoxypropyl, the amino group, aminoethyl, aminopropyl, the ammonium group, an amide group, carboxymethyl, the sulfo group, a phosphate group, and so forth.

The following are specific examples: gum arabic, casein, gelatin, starch derivatives, carboxymethyl cellulose and its sodium salt, cellulose acetate, sodium alginate, vinyl acetate-maleic acid copolymers, styrene-maleic acid copolymers, polyacrylic acids and their salts, polymethacrylic acids and their salts, homopolymers and copolymers of hydroxyethyl methacrylate, homopolymers and copolymers of hydroxyethyl acrylate, homopolymers and copolymers of hydroxypropyl methacrylate, homopolymers and copolymers of hydroxypropyl acrylate, homopolymers and copolymers of hydroxybutyl methacrylate, homopolymers and copolymers of hydroxybutyl acrylate, polyethylene glycols, hydroxypropylene polymers, polyvinyl alcohols, hydrolyzed polyvinyl acetate that has a degree of hydrolysis of at least 60 mol % and preferably at least 80 mol %, polyvinyl formal, polyvinyl butyral, polyvinylpyrrolidone, homopolymers and copolymers of acrylamide, homopolymers and copolymers of methacrylamide, homopolymers and copolymers of N-methylolacrylamide, polyvinylpyrrolidone, alcohol-soluble nylon, polyethers between 2,2-bis(4-hydroxyphenyl)propane and epichlorohydrin, and so forth.

The binder polymer has a mass-average molecular weight preferably of at least 5000 and more preferably from 10,000 to 300,000 and a number-average molecular weight preferably of at least 1000 and more preferably from 2000 to 250,000. The polydispersity (mass-average molecular weight/number-average molecular weight) is preferably 1.1 to 10.

The binder polymer may be a random polymer or a block polymer, wherein random polymers are preferred. A single binder polymer may be used, or two or more may be used in combination.

The binder polymer can be acquired as a commercial product or can be acquired by synthesis by known methods. The solvent used during this synthesis can be exemplified by tetrahydrofuran, ethylene dichloride, cyclohexanone, methyl ethyl ketone, acetone, methanol, ethanol, ethylene glycol monomethyl ether, ethylene glycol monoethyl ether, 2-methoxyethyl acetate, diethylene glycol dimethyl ether, 1-methoxy-2-propanol, 1-methoxy-2-propyl acetate, N,N-dimethylformamide, N,N-dimethylacetamide, toluene, ethyl acetate, methyl lactate, ethyl lactate, dimethyl sulfoxide, and water. A single one of these may be used or a mixture of two or more may be used.

Known compounds, such as azo-type initiators, peroxide initiators, and so forth, can be used as the radical polymerization initiator used for synthesis of the binder polymer.

In those instances in the present invention where an additional binder polymer is used in conjunction with the previously described special polymer binder, the content of this binder polymer is 0 to 80 mass %, preferably 0 to 50 mass %, and more preferably 0 to 30 mass %, in each case with reference to the total solids fraction in the photopolymerizable layer. An excellent image area strength and an excellent image formability are obtained in the cited range.

[Infrared Absorber]

In instances where image formation is carried out using a laser light source that emits infrared radiation at, for example, 760 to 1200 nm, the photopolymerizable layer of the lithographic printing plate precursor of the present invention preferably contains an infrared absorber. The infrared absorber functions to convert the absorbed infrared radiation to heat. The heat thereby produced causes thermal degradation of the polymerization initiator (radical generator), vide infra, with the production of a radical. The infrared absorber used in the present invention can be a dye or pigment that presents an absorption maximum at a wavelength of 760 to 1200 nm.

The dye can be exemplified by commercially available dyes and by known dyes described in the literature (for example, *Dye Handbook*, edited by The Society of Synthetic Organic Chemistry, Japan, 1970). Specific examples are dyes such as azo dyes, metal complex salt azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts, metal thiolate complexes, and so forth.

Preferred dyes can be exemplified by the cyanine dyes described in Japanese Patent Application Publication Nos. Sho 58-125246, Sho 59-84356, and Sho 60-78787; the methine dyes described in Japanese Patent Application Publication Nos. Sho 58-173696, Sho 58-181690, and Sho 58-194595; the naphthoquinone dyes described in Japanese Patent Application Publication Nos. Sho 58-112793, Sho 58-224793, Sho 59-48187, Sho 59-73996, Sho 60-52940, and Sho 60-63744; the squarylium dyes described in Japanese Patent Application Publication No. Sho 58-112792; and the cyanine dyes described in British Patent 434,875.

The use is also preferred of the near infrared absorbers/sensitizers described in U.S. Pat. No. 5,156,938; the substituted arylbenzo(thio)pyrylium salts described in U.S. Pat. No. 3,881,924; the trimethine thiapyrylium salts described in Japanese Patent Application Publication No. Sho 57-142645 (U.S. Pat. No. 4,327,169); the pyrylium compounds described in Japanese Patent Application Publication Nos. Sho 58-181051, Sho 58-220143, Sho 59-41363, Sho 59-84248, Sho 59-84249, Sho 59-146063, and Sho 59-146061; the cyanine dyes described in Japanese Patent Application Publication No. Sho 59-216146; the pentamethine thiopyrylium salts described in U.S. Pat. No. 4,283,475; and the pyrylium compounds described in Japanese Patent Publication Nos. Hei 5-13514 and Hei 5-19702. Other preferred dye examples are the near infrared-absorbing dyes represented by formulas (I) and (II) in U.S. Pat. No. 4,756,993.

Other preferred examples of the infrared-absorbing dyes for the present invention are the special indolenine cyanine dyes described in Japanese Patent Application Publication No. 2002-278057, as exemplified below.

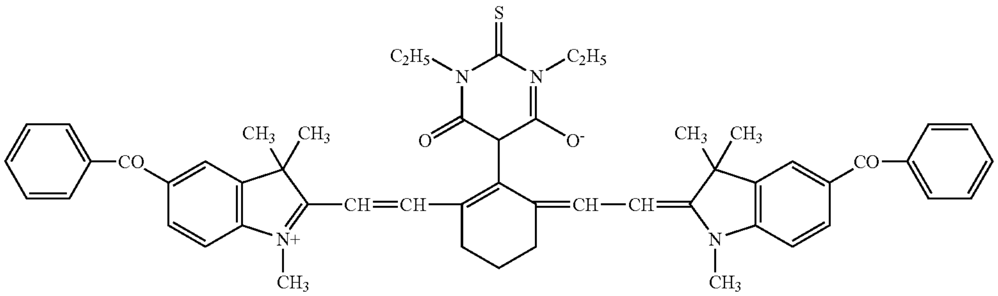

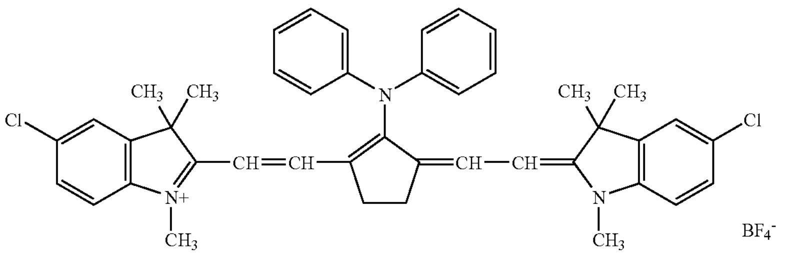

-continued

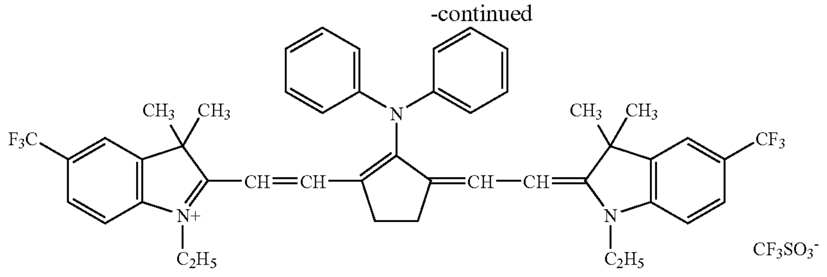

The following are particularly preferred among the dyes cited above: cyanine dyes, squarylium dyes, pyrylium dyes, nickel thiolate complexes, and indolenine cyanine dyes. The cyanine dyes and indolenine cyanine dyes are more preferred, while the cyanine dyes given by the following general formula (i) are a particularly preferred example.

(i)

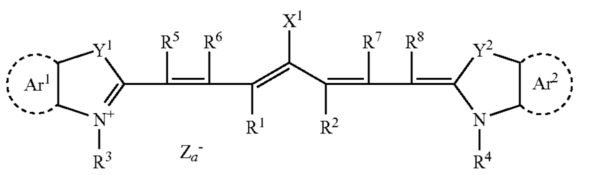

$X^1$ in general formula (i) represents the hydrogen atom, a halogen atom, —$NPh_2$, $X^2$-$L^1$, or the group depicted below.

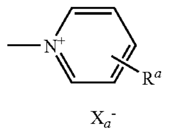

$X^2$ represents an oxygen atom, nitrogen atom, or sulfur atom; $L^1$ represents $C_{1-12}$ hydrocarbyl, a heteroatom-containing aromatic ring, or heteroatom-containing $C_{1-12}$ hydrocarbyl. This heteroatom represents N, S, O, a halogen atom, or Se.

$X_a^-$ has the same definition as the $Z_a^-$ described below, while $R^a$ represents a substituent selected from the hydrogen atom, alkyl, aryl, substituted and unsubstituted amino, and halogen atoms.

$R^1$ and $R^2$ in general formula (i) each independently represent $C_{1-12}$ hydrocarbyl. Based on a consideration of the storage stability of the coating fluid for forming the recording layer, $R^1$ and $R^2$ are preferably hydrocarbyl that contains at least two carbon atoms and are particularly preferably bonded to each other to form a 5-membered ring or 6-membered ring.

$Ar^1$ and $Ar^2$ each independently represent possibly substituted aromatic hydrocarbyl. The benzene ring and naphthalene ring are preferred for the aromatic hydrocarbyl. Preferred substituents in the case of substitution are hydrocarbyl containing no more than 12 carbons, halogen atoms, and alkoxy groups containing no more than 12 carbons. $Y^1$ and $Y^2$ each independently represent the sulfur atom or a dialkylmethylene group that has no more than 12 carbons. $R^3$ and $R^4$ each independently represent possibly substituted hydrocarbyl having no more than 20 carbons. Preferred substituents in the case of substitution are alkoxy groups having no more than 12 carbons, the carboxyl group, and the sulfo group. $R^5$, $R^6$, $R^7$, and $R^8$ each independently represent the hydrogen atom or hydrocarbyl having no more than 12 carbons. The hydrogen atom is preferred based on the ease of starting material acquisition. $Z_a^-$ represents a counteranion. However, $Z_a^-$ is not required when the cyanine dye with general formula (i) has an anionic substituent within its structure and charge neutralization is then not required. Based on a consideration of the storage stability of the coating fluid for forming the recording layer, $Z_a^-$ is preferably a halogen ion, the perchlorate ion, the tetrafluoroborate ion, the hexafluorophosphate ion, or a sulfonate ion and particularly preferably is the perchlorate ion, the hexafluorophosphate ion, or an arylsulfonate ion.

Specific examples of cyanine dyes with general formula (i) that can be suitably used in the present invention are, for example, the dyes described in paragraphs from 0017 to 0019 of Japanese Patent Application Publication No. 2001-133969.

Additional, particularly preferred examples are the special indolenine cyanine dyes described in the previously mentioned Japanese Patent Application Publication No. 2002-278057.

The pigment used in the present invention may be a commercially available pigment or a pigment as described in the Colour Index (C. I.) database, *The Handbook of Modern Pigments* (Edited by the Japan Association of Pigment Technology, 1977), *Modern Pigment Applications Technology* (CMC, 1986), or *Printing Ink Technology* (CMC, 1984).

With regard to type, the pigment can be, for example, a black pigment, yellow pigment, orange pigment, brown pigment, red pigment, purple pigment, blue pigment, green pigment, fluorescent pigment, metal powder pigment, or polymer-bonded dye. Specific examples are insoluble azo pigments, azo lake pigments, condensed azo pigments, chelate azo pigments, phthalocyanine-based pigments, anthraquinone-based pigments, perylene-based pigments, perinone-based pigments, thioindigo-based pigments, quinacridone-based pigments, dioxazine-based pigments, isoindolinone-based pigments, quinophthalone-based pigments, dyed lake pigments, azine pigments, nitroso pigments, nitro pigments, natural pigments, fluorescent pigments, inorganic pigments, carbon black, and so forth. Carbon black is preferred among these pigments.

These pigments may be used without a surface treatment or may be used after a surface treatment. Examples of the surface treatment method include coating the surface with a resin or wax, attaching a surfactant, and bonding a reactive material (e.g., silane coupling agent, epoxy compound, polyisocyanate) to the surface of the pigment. These surface treatment methods are described in *Properties and Applications of Metal Soaps* (Saiwai Shobo), *Printing Ink Technology* (CMC, 1984), and *Modern Pigment Applications Technology* (CMC, 1986).

The particle diameter of the pigment is preferably from 0.01 μm to 10 μm, more preferably from 0.05 μm to 1 μm, and particularly preferably from 0.1 μm to 1 μm. Good stability by the pigment dispersion in the coating fluid for forming the photopolymerizable layer and good uniformity on the part of the photopolymerizable layer are obtained in the cited range.

The known dispersion technologies used, for example, for ink production or toner production, can be used as the method of dispersing the pigment. The dispersing apparatus can be exemplified by ultrasonic dispersers, sand mills, attritors, pearl mills, super mills, ball mills, impellers, dispersers, KD mills, colloid mills, dynatrons, three-roll mills, and pressure kneaders. The details are described in *Modern Pigment Applications Technology* (CMC, 1986).

The infrared absorber may be incorporated in the same layer as other components or may be incorporated in a separately disposed layer. The infrared absorber is incorporated during production of the negative-working lithographic printing plate precursor in such a manner that the absorbance of the photopolymerizable layer at the wavelength of maximum absorption in the wavelength range of 760 to 1200 nm is in the range from 0.3 to 1.2 as measured by a reflection method. The range from 0.4 to 1.1 is preferred. An excellent film strength by the image areas and an excellent adhesion to the support are obtained in the cited range, as is the development of a uniform polymerization reaction across the thickness of the photopolymerizable layer.

The absorbance of the photopolymerizable layer can be adjusted through the quantity of infrared absorber addition to the photopolymerizable layer and through the thickness of the photopolymerizable layer. The absorbance can be measured by the usual methods. Measurement can be carried out, for example, by the following methods: the photopolymerizable layer is formed on a reflective support, e.g., aluminum, in a thickness determined as appropriate in the range required of the post-drying coating rate for lithographic printing plates, and the reflection density is then measured with an optical densitometer or measurement is carried out using a spectrophotometer by reflection using an integrating sphere.

[Polymerization Initiator]

A polymerization initiator can be used in the photopolymerizable layer of the present invention. The polymerization initiator used here is a compound that generates radicals under the action of thermal energy or light energy or both and that thereby initiates and promotes the polymerization of compounds that contain a polymerizable unsaturated bond. The polymerization initiator can be selected as appropriate, in view of the wavelength of the light source used, from the various polymerization initiators known from, for example, patents and the literature, or a combined system of two or more polymerization initiators (polymerization initiation system) can be selected as appropriate.

The radical-generating compounds can be exemplified by organic halides, carbonyl compounds, organoperoxides, azo-type polymerization initiators, azide compounds, metallocene compounds, hexaarylbiimidazole compounds, organoboric acid compounds, disulfone compounds, oxime ester compounds, and onium salt compounds.

The organic halides can be specifically exemplified by the compounds described in Wakabayashi et al., *Bull. Chem. Soc. Japan,* 42, 2924 (1969); U.S. Pat. No. 3,905,815; Japanese Patent Publication No. Sho 46-4605; Japanese Patent Application Publication Nos. Sho 48-36281, Sho 55-32070, Sho 60-239736, Sho 61-169835, Sho 61-169837, Sho 62-58241, Sho 62-212401, Sho 63-70243, and Sho 63-298339; and M. P. Hutt, *Journal of Heterocyclic Chemistry,* 1, No. 3 (1970). Trihalomethyl-substituted oxazole compounds and s-triazine compounds are particularly preferred.

s-triazine derivatives having at least one mono-, di-, or tri-halogen-substituted methyl group bonded to the s-triazine ring are more preferred, and specific examples are 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl-4,6-bis(trichloromethyl)-s-triazine, 2-(p-isopropyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, 2-methoxy-4,6-bis(tribromomethyl)-s-triazine, and so forth.

The aforementioned carbonyl compounds can be exemplified by benzophenone derivatives, e.g., benzophenone, Michler's ketone, 2-methylbenzophenone, 3-methylbenzophenone, 4-methylbenzophenone, 2-chlorobenzophenone, 4-bromobenzophenone, 2-carboxybenzophenone, and so forth; acetophenone derivatives, e.g., 2,2-dimethoxy-2-phenylacetophenone, 2,2-diethoxyacetophenone, 1-hydroxycyclohexyl phenyl ketone, α-hydroxy-2-methylphenylpropanone, 1-hydroxy-1-methylethyl(p-isopropylphenyl) ketone, 1-hydroxy-1-(p-dodecylphenyl)ketone, 2-methyl-(4'-(methylthio)phenyl)-2-morpholino-1-propanone, 1,1,1-trichloromethyl(p-butylphenyl)ketone, and so forth; thioxanthone derivatives, e.g., thioxanthone, 2-ethylthioxanthone, 2-isopropylthioxanthone, 2-chlorothioxanthone, 2,4-dimethylthioxanthone, 2,4-diethylthioxanthone, 2,4-diisopropylthioxanthone, and so forth; and benzoic acid ester derivatives, e.g., ethyl p-dimethylaminobenzoate, ethyl p-diethylaminobenzoate, and so forth.

The aforementioned azo compounds can be exemplified, inter alia, by the azo compounds described in Japanese Patent Application Publication No. Hei 8-108621.

The aforementioned organoperoxides can be exemplified by trimethylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butyl hydroperoxide, cumene hydroperoxide, diisopropylbenzene hydroperoxide, 2,5-dimethylhexane-2,5-dihydroperoxide, 1,1,3,3-tetramethylbutyl hydroperoxide, tert-butylcumyl peroxide, dicumyl peroxide, 2,5-dimethyl-2,5-di(tert-butylperoxy)hexane, 2,5-oxanoyl peroxide, succinic peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, 3,3',4,4'-tetra(tert-butylperoxycarbonyl)benzophenone, 3,3',4,4'-tetra(tert-hexylperoxycarbonyl)benzophenone, 3,3',4,4'-tetra(p-isopropylcumylperoxycarbonyl)benzophenone, carbonyl di(tert-butylperoxydihydrogen diphthalate), carbonyl di(tert-hexylperoxydihydrogen diphthalate), and so forth.

The aforementioned metallocene compounds can be exemplified by the titanocene compounds described in Japanese Patent Application Publication Nos. Sho 59-152396, Sho 61-151197, Sho 63-41484, Hei 2-249, Hei 2-4705, and Hei 5-83588, for example, dicyclopentadienyl-Ti-bisphenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-triafluorophen-1-yl, dimethylcyclopentadienyl-Ti-bis-2,3,5,6-tetrafluorophen-1-yl, and dimethylcyclopentadienyl-Ti-bis-2,3,4,5,6-pentafluorophen-1-yl; additional examples are the iron-arene complexes described in Japanese Patent Application Publication Nos. Hei 1-304453 and Hei 1-152109.

The aforementioned hexaarylbiimidazole compounds can be exemplified by the compounds described in Japanese Patent Publication No. Hei 6-29285 and U.S. Pat. Nos. 3,479,185, 4,311,783, and 4,622,286, and specifically 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, 2,2'-bis(o-trifluorphenyl)-4,4',5,5'-tetraphenylbiimidazole, and so forth.

The aforementioned organoborate salt compounds can be specifically exemplified by the organoborate salts described in Japanese Patent Application Publication Nos. Sho 62-143044, Sho 62-150242, Hei 9-188685, Hei 9-188686, Hei 9-188710, 2000-131837, and 2002-107916, Japanese Patent No. 2,764,769, Japanese Patent Application Publication No. 2002-116539, and Martin Kunz, RadTech '98 Proceedings, Apr. 19-22, 1998, Chicago; the organoboron sulfonium complexes and organoboron oxosulfonium complexes described in Japanese Patent Application Publication Nos. Hei 6-157623, Hei 6-175564, and Hei 6-175561; the organoboron iodonium complexes described in Japanese Patent Application Publication Nos. Hei 6-175554 and Hei 6-175553; the organoboron phosphonium complexes described in Japanese Patent Application Publication No. Hei 9-188710; and the organoboron transition metal coordination complexes described in Japanese Patent Application Publication Nos. Hei 6-348011, Hei 7-128785, Hei 7-140589, Hei 7-306527, and Hei 7-292014.

The aforementioned disulfone compounds can be exemplified by the compounds described in Japanese Patent Application Publication Nos. Sho 61-166544 and 2003-328465.

The aforementioned oxime ester compounds can be exemplified by the compounds described in *J. C. S. Perkin II,* 1653-1660 (1979), *J. C. S. Perkin II;* 156-162 (1979), *Journal of Photopolymer Science and Technology,* 202-232 (1995), and Japanese Patent Application Publication No. 2000-66385; by the compounds described in Japanese Patent Application Publication No. 2000-80068; and specifically by the compounds given by the structural formulas provided below.

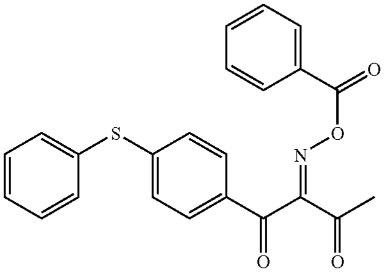

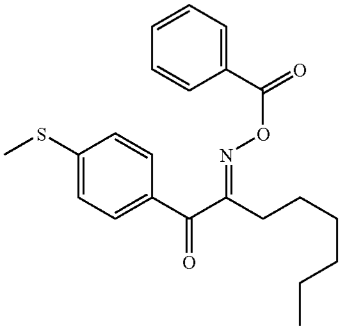

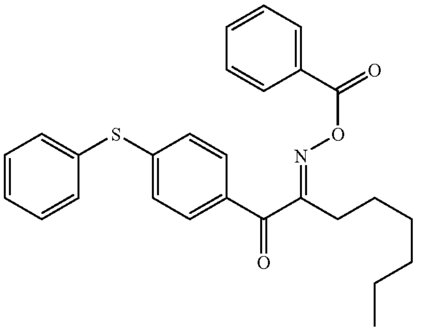

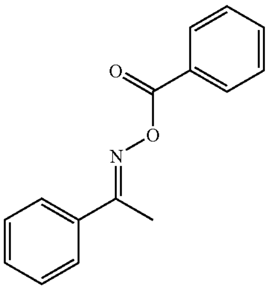

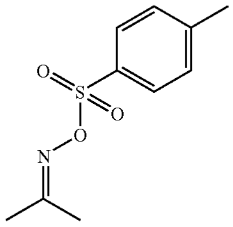

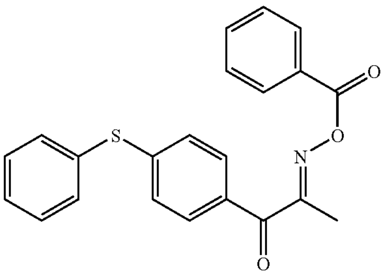

-continued
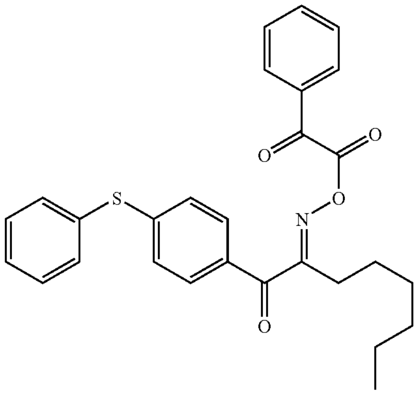
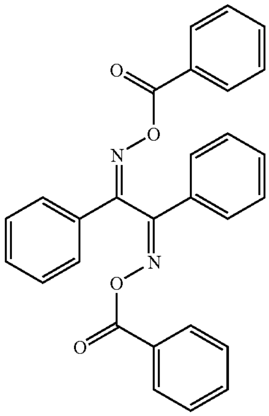
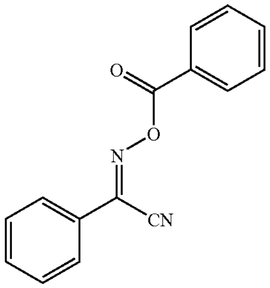
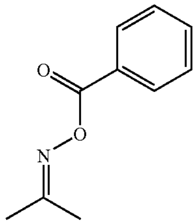
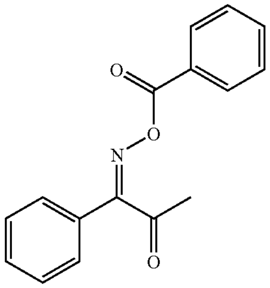
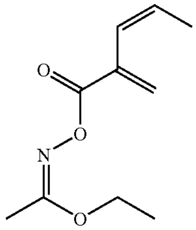
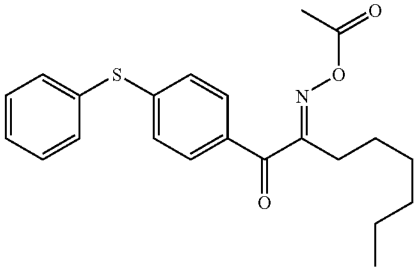
-continued
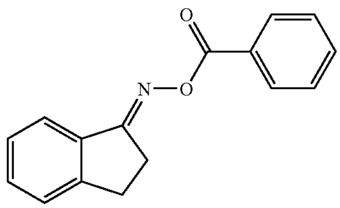
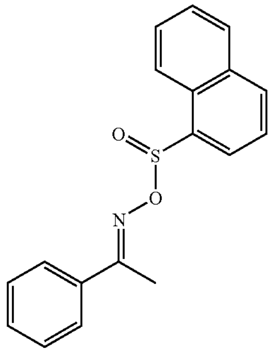
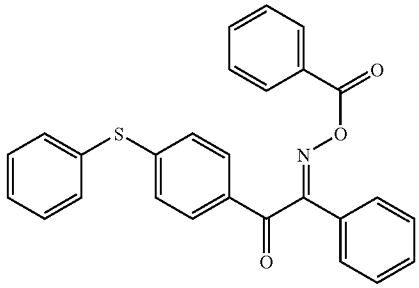
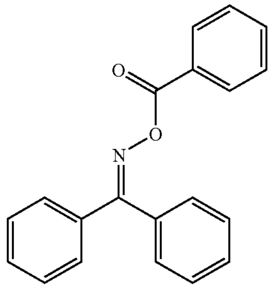
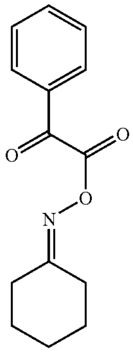
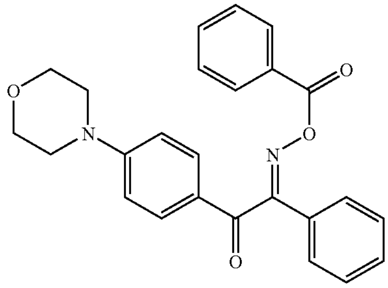

-continued

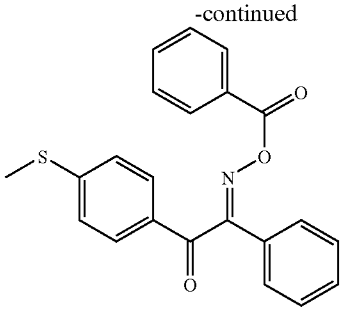

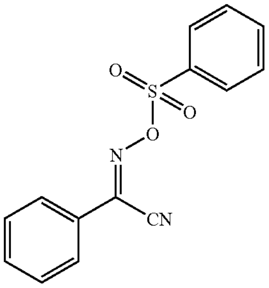

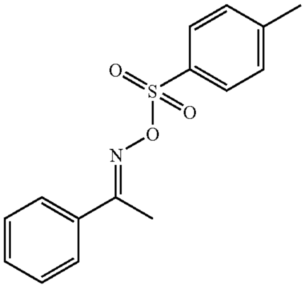

The aforementioned onium salt compounds can be exemplified by onium salts such as the diazonium salts described in S. I. Schlesinger, *Photogr. Sci. Eng.,* 18, 387 (1974) and T. S. Bal et al., *Polymer;* 21, 423 (1980); the ammonium salts described in U.S. Pat. No. 4,069,055 and Japanese Patent Application Publication No. Hei 4-365049; the phosphonium salts described in U.S. Pat. Nos. 4,069,055 and 4,069,056; the iodonium salts described in European Patent No. 104,143, and Japanese Patent Application Publication Nos. Hei 2-150848 and 2-296514; the sulfonium salts described in European Patent Nos. 370,693, 390,214, 233,567, 297,443, and 297,442, U.S. Pat. Nos. 4,933,377, 4,760,013, 4,734,444, and 2,833,827, and German Patent Nos. 2,904,626, 3,604, 580 and 3,604,581;

the selenonium salts described in J. V. Crivello et al., *Macromolecules,* 10(6), 1307 (1977) and J. V. Crivello et al., *J. Polymer Sci., Polymer Chem. Ed,* 17, 1047 (1979); and the arsonium salts described in C. S. Wen et al., *The Proc. Conf Rad. Curing. ASIA*, p. 478, Tokyo, October (1988).

Viewed from the standpoints of reactivity and stability, the aforementioned oxime ester compounds and diazonium salts, iodonium salts, sulfonium salts, and ammonium salts are particularly preferred examples. These onium salts function in the present invention not as an acid generator, but rather as an ionic radical polymerization initiator.

The onium salts represented by the following general formulas (RI-I) to (RI-IV) are onium salts that are well suited for use in the present invention.

(RI-I)

$$Ar^{11}-N^{+}\equiv N \quad Z^{11-}$$

(RI-II)

$$Ar^{21}-I^{+}-Ar^{22} \quad Z^{21-}$$

(RI-III)

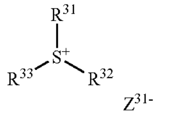

(RI-IV)

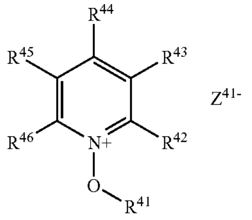

$Ar^{11}$ in formula (RI-I) represents an aryl group that has 20 or fewer carbons and that may have from 1 to 6 substituents. Preferred substituents can be exemplified by alkyl having from 1 to 12 carbons, alkenyl having from 1 to 12 carbons, alkynyl having from 1 to 12 carbons, aryl having from 1 to 12 carbons, alkoxy having from 1 to 12 carbons, aryloxy having from 1 to 12 carbons, halogen, alkylamino having from 1 to 12 carbons, dialkylamino having from 1 to 12 carbons, alkylamide or arylamide having from 1 to 12 carbons, a carbonyl group, the carboxyl group, the cyano group, a sulfonyl group, thioalkyl having from 1 to 12 carbons, and thioaryl having from 1 to 12 carbons. $Z^{11-}$ represents a monovalent anion and is a halogen ion, perchlorate ion, hexafluorophosphate ion, tetrafluoroborate ion, sulfonate ion, sulfinate ion, thiosulfonate ion, or sulfate ion. Viewed from the perspective of stability and the inspectability of the printed out image, the perchlorate ion, hexafluorophosphate ion, tetrafluoroborate ion, sulfonate ion, and sulfinate ion are preferred.

$Ar^{21}$ and $Ar^{22}$ in formula (RI-II) each independently represent an aryl group that has 20 or fewer carbons and that may have from 1 to 6 substituents. Preferred substituents can be exemplified by alkyl having from 1 to 12 carbons, alkenyl having from 1 to 12 carbons, alkynyl having from 1 to 12 carbons, aryl having from 1 to 12 carbons, alkoxy having from 1 to 12 carbons, aryloxy having from 1 to 12 carbons, halogen, alkylamino having from 1 to 12 carbons, dialkylamino having from 1 to 12 carbons, alkylamide or arylamide having from 1 to 12 carbons, a carbonyl group, the carboxyl group, the cyano group, a sulfonyl group, thioalkyl having from 1 to 12 carbons, and thioaryl having from 1 to 12 carbons. $Z^{21-}$ represents a monovalent anion and is a halogen ion, perchlorate ion, hexafluorophosphate ion, tetrafluoroborate ion, sulfonate ion, sulfinate ion, thiosulfonate ion, or sulfate ion. Viewed from the perspective of stability, the perchlorate ion, hexafluorophosphate ion, tetrafluoroborate ion, sulfonate ion, sulfinate ion, and carboxylate ion are preferred.

$R^{31}$, $R^{32}$, and $R^{33}$ in formula (RI-III) each independently represent alkyl, alkenyl, or alkynyl or an aryl group that has 20 or fewer carbons and that may have from 1 to 6 substituents, wherein aryl is preferred from the standpoints of reactivity and stability. Preferred substituents can be exemplified by alkyl having from 1 to 12 carbons, alkenyl having from 1 to 12 carbons, alkynyl having from 1 to 12 carbons, aryl having from 1 to 12 carbons, alkoxy having from 1 to 12 carbons, aryloxy having from 1 to 12 carbons, halogen, alkylamino having from 1 to 12 carbons, dialkylamino having from 1 to 12 carbons, alkylamide or arylamide having from 1 to 12 carbons, a carbonyl group, the carboxyl group, the cyano group, a sulfonyl group, thioalkyl having from 1 to 12 carbons, and thioaryl having from 1 to 12 carbons. $Z^{31-}$ represents a monovalent anion and is a halogen ion, perchlorate ion, hexafluorophosphate ion, tetrafluoroborate ion, sulfonate ion, sulfinate ion, thiosulfonate ion, or sulfate ion. Viewed from the perspective of stability and the printed-out image inspectability, the perchlorate ion, hexafluorophosphate ion, tetrafluoroborate ion, sulfonate ion, sulfinate ion, and carboxylate ion are preferred, while the carboxylate ion described in Japanese Patent Application Publication No. 2001-343742 is more preferred and the carboxylate ion described in Japanese Patent Application Publication No. 2002-148790 is particularly preferred.

$R^{41}$ in formula (RI-IV) represents possibly substituted $C_{1-20}$ alkyl. $R^{42}$, $R^{43}$, $R^{44}$, $R^{45}$, and $R^{46}$ each independently represent alkyl, alkenyl, or alkynyl or an aryl group that has 20 or fewer carbons and that may have from 1 to 6 substituents, wherein aryl is preferred from the standpoints of reactivity and stability. Preferred substituents can be exemplified by alkyl having from 1 to 12 carbons, alkenyl having from 1 to 12 carbons, alkynyl having from 1 to 12 carbons, aryl having from 1 to 12 carbons, alkoxy having from 1 to 12 carbons, aryloxy having from 1 to 12 carbons, halogen, alkylamino having from 1 to 12 carbons, dialkylamino having from 1 to 12 carbons, alkylamide or arylamide having from 1 to 12 carbons, a carbonyl group, the carboxyl group, the cyano group, a sulfonyl group, thioalkyl having from 1 to 12 carbons, and thioaryl having from 1 to 12 carbons. $R^{41}$ may be connected to $R^{43}$ to form a ring; $R^{42}$ may be connected to $R^{43}$ to form a ring; $R^{43}$ may be connected to $R^{44}$ to form a ring; $R^{44}$ may be connected to $R^{45}$ to form a ring; and $R^{45}$ may be connected to $R^{46}$ to form a ring. $Z^{41-}$ represents a monovalent anion and is a halogen ion, perchlorate ion, hexafluorophosphate ion, tetrafluoroborate ion, sulfonate ion, sulfinate ion, thiosulfonate ion, or sulfate ion. Viewed from the perspective of stability and the printed-out image inspectability, the perchlorate ion, hexafluorophosphate ion, tetrafluoroborate ion, sulfonate ion, sulfinate ion, and carboxylate ion are preferred.

Examples are provided below of onium salts suitable for use as a polymerization initiator in the present invention, but the present invention is not limited to these.

(N-1)

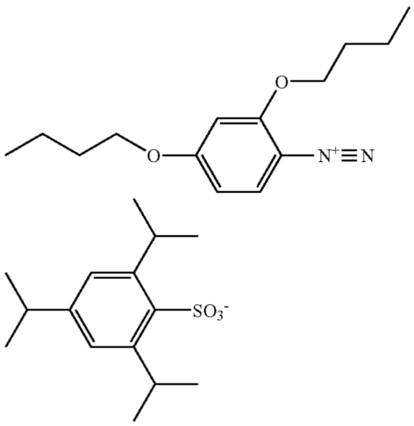

-continued (N-2)

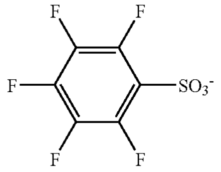

(N-3)

$PF_6^-$ (N-4)

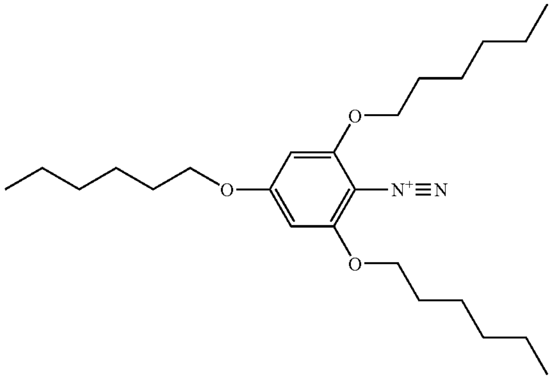

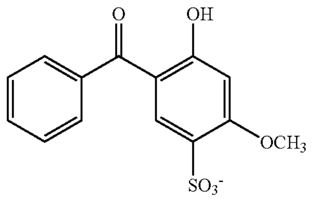

(N-5)

$ClO_4^-$ (N-6)

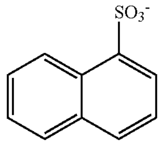

(N-7)

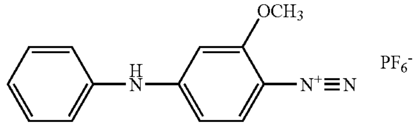

(N-8)

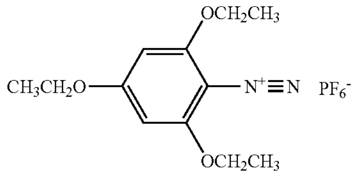

(N-9)

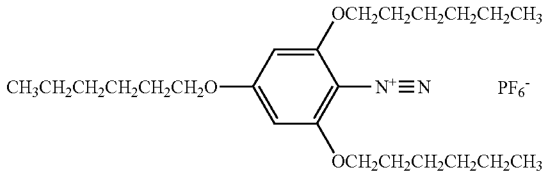

-continued
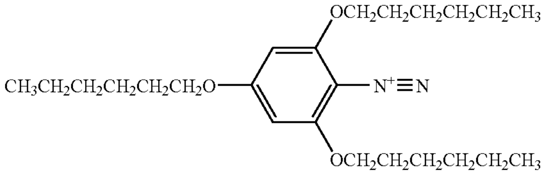
(N-10)
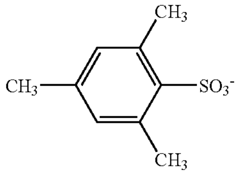
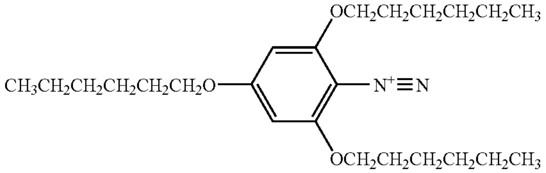
(N-11)
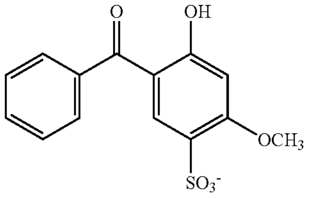
(I-1)
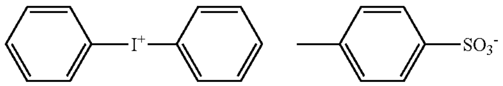
(I-2)
$PF_6^-$
(I-3)
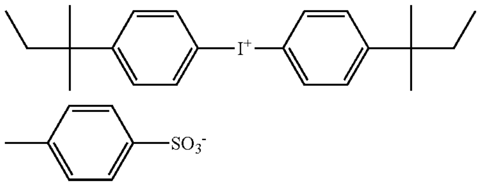
(I-4)
$ClO_4^-$
(I-5)
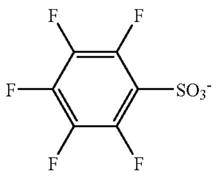
(I-6)
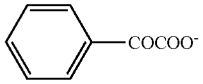
(I-7)
$CF_3SO_3^-$
(I-8)
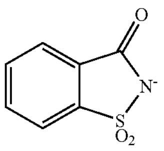
-continued
(I-9)
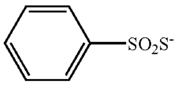
(I-10)
$PF_6^-$
(I-11)
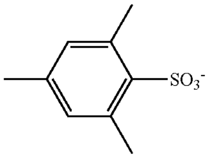
(I-12)
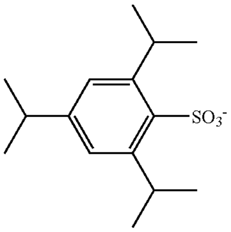
(I-13)
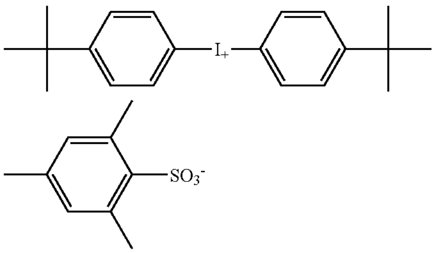
(I-14)
$ClO_4^-$
(I-15)
$PF_6^-$
(I-16)
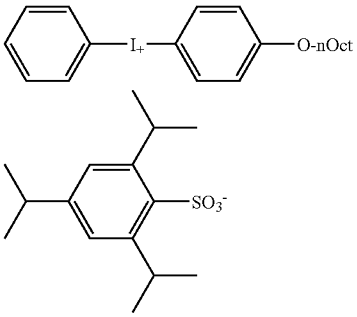
(I-17)
$CF_3COO^-$
(I-18)
$CF_3SO_3^-$
(I-19)
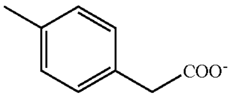
(I-20)
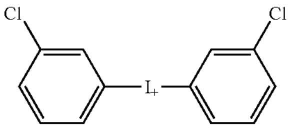
$BF_4^-$
(I-21)
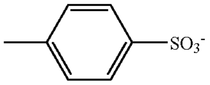

-continued
(I-22)
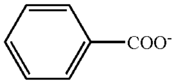
(I-23)
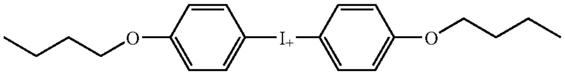
$C_4F_9COO^-$
(I-24)
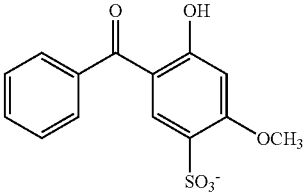
(I-25)
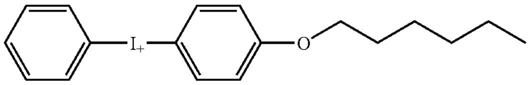
$PF_6^-$
(I-26)
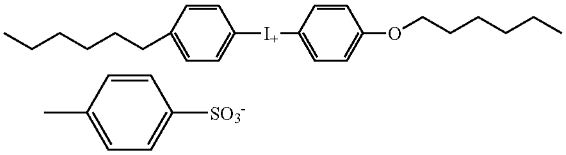
(S-1)
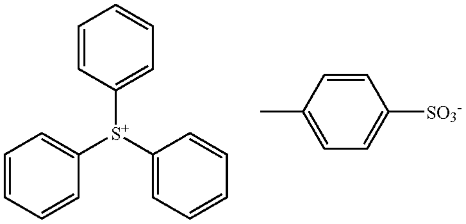
(S-2)
$PF_6^-$
(S-3)
$ClO_4^-$
(S-4)
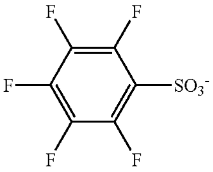
(S-5)
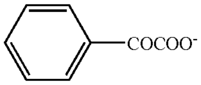
(S-6)
$CF_3SO_3^-$
(S-7)
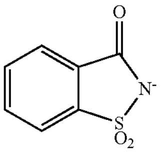
-continued
(S-8)
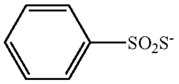
(S-9)
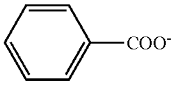
(S-10)
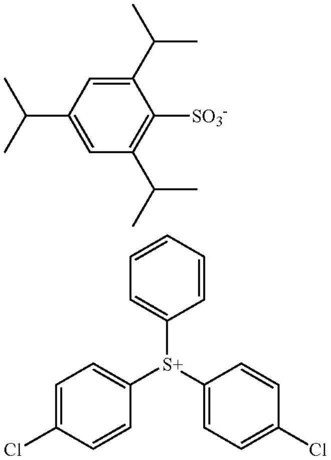
(S-11)
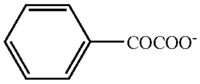
(S-12)
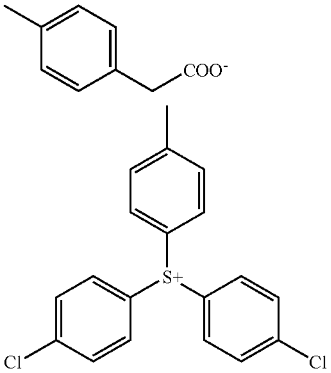
(S-13)
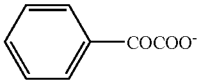
(S-14)
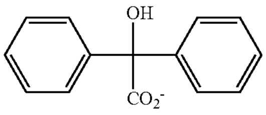
(S-15)
$BF_4^-$
(S-16)
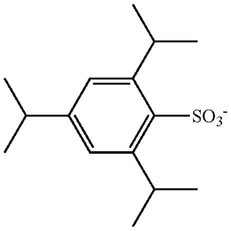

-continued
(S-17)
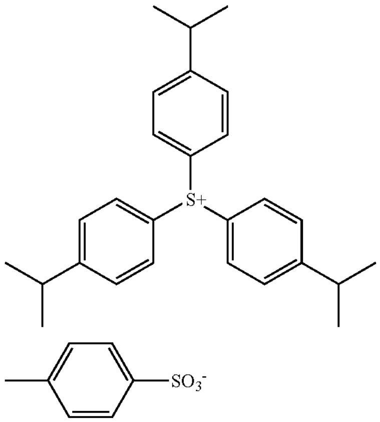
(S-18)
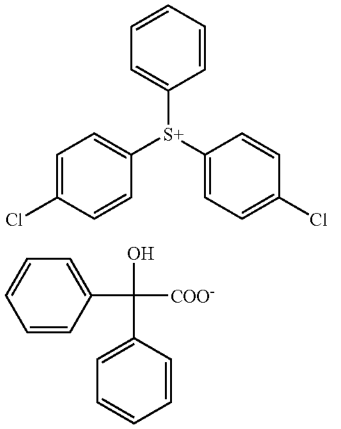
(A-1)
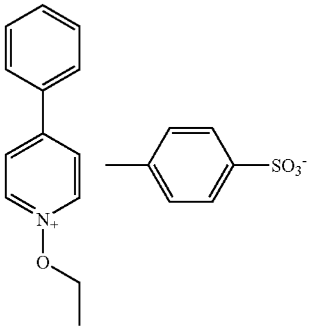
(A-2)
$PF_6^-$
(A-3)
$ClO_4^-$
(A-4)
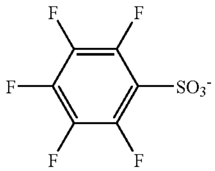
(A-5)
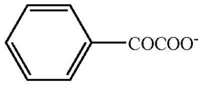
(A-6)
$CF_3SO_3^-$
-continued
(A-7)
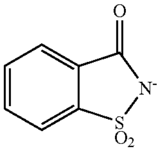
(A-8)
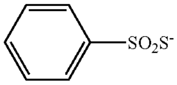
(A-9)
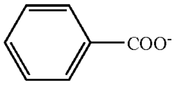
(A-10)
$PF_6^-$
(A-11)
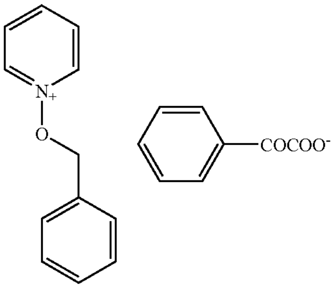
(A-12)
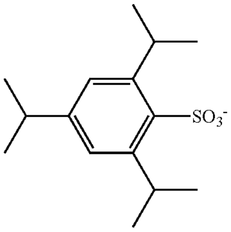
(A-13)
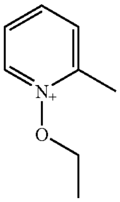
$PF_6^-$
(A-14)
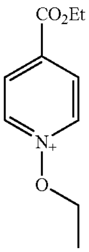
$PF_6^-$
(A-15)
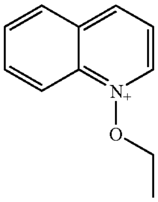
$PF_6^-$ -continued (A-16)

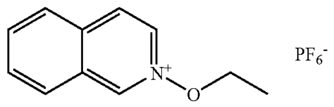

Among the polymerization initiators considered hereabove, onium salts having an inorganic anion as the counterion, for example, $PF_6^-$ or $BF_4^-$, are preferred from the standpoint of improving the inspectability of the printed out image. Diaryliodonium and ammonium are preferred as the onium moiety due to the excellent printing durability this provides.

These polymerization initiators can be added at 0.1 to 50 mass %, preferably 0.5 to 30 mass %, and particularly preferably 1 to 20 mass %, in each case based on the total solids fraction comprising the photopolymerizable layer. An excellent sensitivity and an excellent resistance to scumming in the nonimage areas during printing are obtained in the cited range. A single one of these polymerization initiators may be used or two or more may be used in combination. The polymerization initiator may be incorporated in the same layer with other components or may be incorporated in a separately disposed layer.

[Polymerizable Monomer]

The photopolymerizable layer in the present invention preferably contains a polymerizable monomer in order to efficiently carry out the curing reaction. Polymerizable monomers that can be used by the present invention are addition-polymerizable compounds that have at least one ethylenically unsaturated double bond and are selected from compounds that have at least one and preferably at least two ethylenically unsaturated bonds in terminal position. This group of compounds is widely known in the pertinent industrial field, and these can be used in the present invention without particular limitation. These compounds have, for example, the following chemical configurations: monomer, prepolymer (i.e., dimer, trimer, and oligomer), mixtures of the preceding, copolymers of the preceding, and so forth. Examples of the monomers and their copolymers are unsaturated carboxylic acids (for example, acrylic acid, methacrylic acid, itaconic acid, crotonic acid, isocrotonic acid, maleic acid, and so forth) and their esters and amides, preferably esters between an unsaturated carboxylic acid and an aliphatic polyhydric alcohol compound and amides between an unsaturated carboxylic acid and an aliphatic polyvalent amine compound. Also suitable for use are the addition reaction products from a monofunctional or multifunctional isocyanate or epoxide and an unsaturated carboxylic acid ester or amide that has a nucleophilic substituent such as, for example, the hydroxyl group, amino group, mercapto group, and so forth, and the dehydration condensation reaction products from a monofunctional or multifunctional carboxylic acid and an unsaturated carboxylic acid ester or amide that has a nucleophilic substituent such as, for example, the hydroxyl group, amino group, mercapto group, and so forth. Also suitable are the addition reaction products from a monofunctional or multifunctional alcohol, amine, or thiol and an unsaturated carboxylic acid ester or amide that has an electrophilic substituent such as, for example, the isocyanate group, epoxy group, and so forth, and substitution reaction products from a monofunctional or multifunctional alcohol, amine, or thiol and an unsaturated carboxylic acid ester or amide that has a leaving group such as, for example, a halogen group, tosyloxy group, and so forth. Another set of usable examples is provided by the group of compounds generated by replacing the unsaturated carboxylic acid cited above with, for example, an unsaturated phosphonic acid, styrene, vinyl ether, and so forth.

The following are specific examples of monomers that are esters between an aliphatic polyhydric alcohol compound and an unsaturated carboxylic acid: acrylate esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, and so forth;

Methacrylate esters such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis [p-(3-methacryloxy-2-hydroxypropoxy)phenyl] dimethylmethane, bis[p-(methacryloxyethoxy)phenyl] dimethylmethane, tri(methacryloyloxyethyl)isocyanurate, and so forth;

Itaconate esters such as ethylene glycol diitaconate, propylene glycol diitaconate, 1,3-butanediol diitaconate, 1,4-butanediol diitaconate, tetramethylene glycol diitaconate, pentaerythritol diitaconate, sorbitol tetraitaconate, and so forth; crotonate esters such as ethylene glycol dicrotonate, tetramethylene glycol dicrotonate, pentaerythritol dicrotonate, sorbitol tetracrotonate, and so forth; isocrotonate esters such as ethylene glycol diisocrotonate, pentaerythritol diisocrotonate, sorbitol tetraisocrotonate, and so forth; and maleate esters such as ethylene glycol dimaleate, triethylene glycol dimaleate, pentaerythritol dimaleate, sorbitol tetramaleate, and so forth.

Examples of other suitable esters are the aliphatic alcohol-based esters described in Japanese Patent Publication No. Sho 51-47334 and Japanese Patent Application Publication No. Sho 57-196231; esters having an aromatic skeleton as described in Japanese Patent Application Publication Nos. Sho 59-5240, Sho 59-5241, and Hei 2-226149; and the amino group-containing esters described in Japanese Patent Application Publication No. Hei 1-165613. In addition, the above described ester monomers can also be used in the form of mixtures.

The following are specific examples of monomers that are amides between an aliphatic polyvalent amine compound and an unsaturated carboxylic acid: methylenebisacrylamide, methylenebismethacrylamide, 1,6-hexamethylenebisacrylamide, 1,6-hexamethylenebismethacrylamide, diethylenetriamine trisacrylamide, xylylenebisacrylamide, xylylenebismethacrylamide, and so forth. Other examples of preferred amide-type monomers are those having a cyclohexylene structure as described in Japanese Patent Publication No. Sho 54-21726.

Also suitable are urethane-type addition-polymerizable compounds produced using the addition reaction between isocyanate and the hydroxyl group; a specific example here is the vinyl urethane compound containing at least two polymerizable vinyl groups in each molecule, as described in Japanese Patent Publication No. Sho 48-41708, that is generated by the addition of hydroxyl-functional vinyl monomer represented by general formula (ii) below to a polyisocyanate compound that contains at least two isocyanate groups in each molecule $$CH_2{=}C(R^4)COOCH_2CH(R^5)OH \quad \text{(ii)}$$

(wherein $R^4$ and $R^5$ represent H or $CH_3$).

The following are also suitable: the urethane acrylates as described in Japanese Patent Application Publication No. Sho 51-37193 and Japanese Patent Publication Nos. Hei 2-32293 and Hei 2-16765 and the urethane compounds having an ethylene oxide-type skeleton as described in Japanese Patent Publication Nos. Sho 58-49860, Sho 56-17654, Sho 62-39417, and Sho 62-39418. In addition, a photopolymerizable composition that exhibits a very good photosensitive speed can be obtained by using the addition-polymerizable compounds having an amino structure or sulfide structure in the molecule that are described in Japanese Patent Application Publication Nos. Sho 63-277653, Sho 63-260909, and Hei 1-105238.

Other examples are the polyester acrylates as described in each of Japanese Patent Application Publication No. Sho 48-64183 and Japanese Patent Publication Nos. Sho 49-43191 and Sho 52-30490, as well as multifunctional acrylates and methacrylates such as epoxy acrylates as yielded by the reaction of epoxy resin with acrylic acid or methacrylic acid. Other examples are the special unsaturated compounds described in Japanese Patent Publication Nos. Sho 46-43946, Hei 1-40337, and Hei 1-40336 and the vinylphosphonic acid-type compounds described in Japanese Patent Application Publication No. Hei 2-25493. Structures containing a perfluoroalkyl group as described in Japanese Patent Application Publication No. Sho 61-22048 are suitably used in some cases. Also usable are the compounds introduced as photocurable monomers and oligomers in the *Journal of the Adhesion Society of Japan*, Volume 20, Number 7, pages 300 to 308 (1984).

The specifics of how these addition-polymerizable monomers are used, for example, their structure, whether a single such monomer or a combination of these monomers is used, the quantity of addition, and so forth, can be freely established in conformity with the properties designed for the final lithographic printing plate precursor. Selection can be made, for example, based on the following considerations.

Based on a consideration of the sensitivity, a structure is preferred that has a large unsaturated group content per molecule, and difunctional and above is preferred in many cases. In addition, trifunctional and above is preferred for the purpose of raising the strength of the image areas, that is, the cured film. It may also be effective to adjust both the sensitivity and strength by using combinations of monomers that have different numbers of functionalities•different polymerizable groups (for example, acrylate esters, methacrylate esters, styrenic compounds, vinyl ether-type compounds). The selection of the addition-polymerizable compound and its method of use are also important factors for the compatibility and dispersibility with respect to the other components (for example, binder polymer, initiator, colorant, and so forth) in the photopolymerizable layer. For example, it may be possible to improve the compatibility by the use of two or more compounds in combination and/or by the use of a low-purity compound. Moreover, it may be possible to select a particular structure with the goal of improving the adhesiveness with, inter alia, a protective layer, infra, and/or the substrate.

The polymerizable monomer is used preferably at 5 to 80 mass % and more preferably 25 to 75 mass %, in each case with reference to the nonvolatile components in the photopolymerizable layer. A single polymerizable compound may be used or two or more may be used in combination. In addition to the preceding, within the context of the use strategy for the polymerizable monomer, a suitable structure, composition, and quantity of addition can be freely selected based on a consideration of, for example, the magnitude of polymerization inhibition by oxygen, the resolution, the fogging behavior, the change in refractive index, the surface tackiness, and so forth. Depending on the circumstances, a layer structure•coating method such as undercoating and/or overcoating may also be implemented.

The polymerizable monomer is used in the photopolymerizable layer preferably in an amount that provides a binder polymer/polymerizable monomer mass ratio of 4/1 to 1/3, more preferably in an amount that provides a binder polymer/polymerizable monomer mass ratio of 3/1 to 1/3, and most preferably in an amount that provides a binder polymer/polymerizable monomer mass ratio of 3/2 to 1/3. This binder polymer is either the above-described special polymer compound by itself, or, when an additional binder polymer is used in combination with the special polymer compound, refers to the sum of the special polymer compound and the additional binder polymer.

[Microcapsules•Microgel]

Various embodiments can be used for the method of incorporating the previously described photopolymerizable layer constituent components and the other components, infra, into the photopolymerizable layer. One embodiment is, for example, a molecular dispersion-type photopolymerizable layer obtained by dissolving the constituent components in an appropriate solvent and carrying out coating, as described in Japanese Patent Application Publication No. 2002-287334. Another embodiment is, for example, a microcapsule-type photopolymerizable layer in which all or a portion of the constituent components are present in the photopolymerizable layer incorporated in microcapsules, as described in Japanese Patent Application Publication Nos. 2001-277740 and 2001-277742. The constituent components can also be present in a microcapsule-type photopolymerizable layer outside the microcapsules. In a preferred embodiment of the microcapsule-type photopolymerizable layer, the hydrophobic constituent components are incorporated in microcapsules while the hydrophilic constituent components are present outside the microcapsules. In another embodiment, the photopolymerizable layer contains crosslinked resin particles, i.e., a microgel. This microgel can contain a portion of the constituent components within the microgel and/or on its surface. In particular, an embodiment that employs a microgel made reactive by disposing polymerizable monomer on its surface is particularly preferred from the standpoints of the image-forming sensitivity and printing durability.

The photopolymerizable layer preferably contains microcapsules or a microgel in order to obtain a photopolymerizable layer that is removable by printing ink and/or fountain solution (i.e., is on-press developable).

Known methods can be employed to microcapsulate the constituent components of the photopolymerizable layer or to formulate these components as a microgel.

The microcapsule production method can be exemplified by the following, but is not limited to the following: the use of coacervation as described in U.S. Pat. Nos. 2,800,457 and 2,800,458; interfacial polymerization as described in U.S. Pat. No. 3,287,154 and Japanese Patent Publication Nos. Sho 38-19574 and Sho 42-446; polymer precipitation as described in U.S. Pat. Nos. 3,418,250 and 3,660,304; the use of an isocyanate polyol wall material as described in U.S. Pat. No. 3,796,669; the use of an isocyanate wall material as described in U.S. Pat. No. 3,914,511; the use of a urea/formaldehyde-type or urea/formaldehyde/resorcinol-type wall-forming material as described in U.S. Pat. Nos. 4,001,140, 4,087,376, and 4,089,802; the use of a melamine-formaldehyde resin or hydroxycellulose wall material as described in U.S. Pat. No. 4,025,445; in situ polymerization of monomer as described in Japanese Patent Publication Nos. Sho 36-9163 and Sho 51-9079; spray drying as described in GB Patent No. 930422 and U.S. Pat. No. 3,111,407; and electrolytic dispersion and cooling as described in GB Patent Nos. 952807 and 967074.

A preferred microcapsule wall for use in the present invention has 3-dimensional crosslinking and is solvent swellable. From this standpoint, the microcapsule wall material is preferably polyurea, polyurethane, polyester, polycarbonate, polyamide, or a mixture of the preceding, with polyurea and polyurethane being particularly preferred. In addition, a compound having a crosslinkable functional group (e.g., an ethylenically unsaturated bond) capable of introduction into the binder polymer may be introduced into the microcapsule wall.

The microgel production method can be the interfacial polymerization-based granulation described in Japanese Patent Publication Nos. Sho 38-19574 and Sho 42-446 or granulation based on nonaqueous dispersion polymerization as described in Japanese Patent Application Publication No. Hei 5-61214. However, there is no limitation to these methods.

The known microcapsule production methods described above can be used for the aforementioned interfacial polymerization-based method.

A preferred microgel for use in the present invention is granulated using interfacial polymerization and has 3-dimensional crosslinking. From this standpoint, the material used is preferably polyurea, polyurethane, polyester, polycarbonate, polyamide, or a mixture or the preceding, with polyurea and polyurethane being particularly preferred.

The average particle size of the microcapsule or microgel is preferably from 0.01 to 3.0 μm, more preferably from 0.05 to 2.0 μm, and particularly preferably from 0.10 to 1.0 μm. Good resolution and good timewise stability are obtained within the cited range.

[Surfactant]

The use of surfactant in the photopolymerizable layer is preferred in the present invention in order to promote the on-press developability when printing is started and in order to improve the coating planarity. The surfactant can be a nonionic surfactant, anionic surfactant, cationic surfactant, amphoteric surfactant, or fluorosurfactant. A single surfactant may be used or two or more surfactants may be used in combination.

There are no particular limitations on the nonionic surfactant used in the present invention and the heretofore known nonionic surfactants may be employed. Examples are as follows: polyoxyethylene alkyl ethers, polyoxyethylene alkylphenyl ethers, polyoxyethylene polystyrylphenyl ethers, polyoxyethylene polyoxypropylene alkyl ethers, glycerol/fatty acid partial esters, sorbitan/fatty acid partial esters, pentaerythritol/fatty acid partial esters, propylene glycol/fatty acid monoesters, sucrose/fatty acid partial esters, polyoxyethylene sorbitan/fatty acid partial esters, polyoxyethylene sorbitol/fatty acid partial esters, polyethylene glycol/fatty acid esters, polyglycerol/fatty acid partial esters, polyoxyethylenated castor oil, polyoxyethylene glycerol/fatty acid partial esters, fatty acid diethanolamides, N,N-bis-2-hydroxyalkylamines, polyoxyethylenealkylamines, triethanolamine/fatty acid esters, trialkylamine oxides, polyethylene glycols, and polyethylene glycol/polypropylene glycol copolymers.

There are no particular limitations on the anionic surfactant used in the present invention and the heretofore known anionic surfactants may be employed. Examples are as follows: fatty acid salts, abietic acid salts, hydroxyalkanesulfonic acid salts, alkanesulfonic acid salts, dialkyl sulfosuccinate salts, straight-chain alkylbenzenesulfonate salts, branched alkylbenzenesulfonate salts, alkylnaphthalenesulfonate salts, alkylphenoxypolyoxyethylenepropylsulfonate salts, polyoxyethylene alkylsulfophenyl ether salts, sodium N-methyl-N-oleyltaurate, the disodium salt of N-alkylsulfosuccinic acid monoamide, salts of petroleum sulfonic acids, sulfated beef tallow oil, the salts of sulfate esters of the alkyl esters of fatty acids, the salts of alkyl sulfate esters, the salts of sulfate esters of polyoxyethylene alkyl ethers, the salts of sulfate esters of fatty acid monoglycerides, the salts of sulfate esters of polyoxyethylene alkylphenyl ethers, the salts of sulfate esters of polyoxyethylene styrylphenyl ethers, the salts of alkyl phosphate esters, the salts of polyoxyethylene alkyl ether phosphate esters, the salts of polyoxyethylene alkylphenyl ether phosphate esters, partially saponified styrene-maleic anhydride copolymers, partially saponified olefin-maleic anhydride copolymers, and the formaldehyde condensates of naphthalenesulfonates.

There are no particular limitations on the cationic surfactant used in the present invention and the heretofore known cationic surfactants may be employed. Examples are as follows: alkylamine salts, quaternary ammonium salts, polyoxyethylenealkylamine salts, and polyethylenepolyamine derivatives.

There are no particular limitations on the amphoteric surfactant used in the present invention and the heretofore known amphoteric surfactants may be employed. Examples are as follows: carboxybetaines, aminocarboxylic acids, sulfobetaines, amino sulfate esters, and imidazolines.

The polyoxyethylene employed in the surfactants listed above may be replaced with polyoxyalkylene (e.g., polyoxymethylene, polyoxypropylene, polyoxybutylene, and so forth), and the resulting surfactants may also be used in the present invention.

A fluorosurfactant that contains a perfluoroalkyl group in the molecule is a more preferred surfactant. Such fluorosurfactants can be exemplified by anionic fluorosurfactants such as perfluoroalkylcarboxylate salts, perfluoroalkylsulfonate salts, perfluoroalkyl phosphate esters, and so forth; amphoteric fluorosurfactants such as perfluoroalkylbetaines and so forth; cationic fluorosurfactants such as perfluoroalkyltrimethylammonium salts and so forth; and nonionic fluorosurfactants such as perfluoroalkylamine oxides, perfluoroalkyl/ethylene oxide adducts, oligomers that contain both a perfluoroalkyl group and a hydrophilic group, oligomers that contain both a perfluoroalkyl group and an oleophilic group, oligomers that contain a perfluoroalkyl group and a hydrophilic group and an oleophilic group, urethanes that contain both a perfluoroalkyl group and an oleophilic group, and so forth. Also suitable are the fluorosurfactants described in Japanese Patent Application Publication Nos. Sho 62-170950, Sho 62-226143, and Sho 60-168144.

A single surfactant may be used or a combination of two or more surfactants may be used.

The surfactant content is preferably 0.001 to 10 mass % and more preferably 0.01 to 7 mass %, in each case with reference to the total solids fraction in the photopolymerizable layer.

[Colorant]

Various compounds other than those previously cited may also be added on an optional basis in the present invention. For example, a dye that absorbs strongly in the visible light region can be used as an image colorant. Specific examples are Oil Yellow #101, Oil Yellow #103, Oil Pink #312, Oil Green BG, Oil Blue BOS, Oil Blue #603, Oil Black BY, Oil Black BS, and Oil Black T-505 (the preceding are products of Orient Chemical Industries, Ltd.), as well as Victoria Pure Blue, Crystal Violet (CI 42555), Methyl Violet (CI 42535), Ethyl Violet, Rhodamine B (CI 145170B), Malachite Green (CI 42000), Methylene Blue (CI 52015), and the dyes described in Japanese Patent Application Publication No. Sho 62-293247. Also suitable for use are pigments such as phthalocyanine pigments, azo pigments, carbon black, titanium oxide, and so forth.

The addition of these colorants is preferred because their addition facilitates discrimination of the image areas from the nonimage areas after image formation. The quantity of addition is 0.01 to 10 mass % with reference to the total solids fraction of the image recording material.

[Print-Out Agent]

A compound that changes color under the action of acid or radicals can be added to the photopolymerizable layer of the present invention in order to produce a print-out image. Various dyes, for example, diphenylmethane types, triphenylmethane types, thiazine types, oxazine types, xanthene types, anthraquinone types, iminoquinone types, azo types, and azomethine types, are effectively used as this compound.

Specific examples as follows: dyes such as Brilliant Green, Ethyl Violet, Methyl Green, Crystal Violet, Basic Fuchsine, Methyl Violet 2B, Quinaldine Red, Rose Bengal, Methanyl Yellow, Thymol Sulfophthalein, Xylenol Blue, Methyl Orange, Paramethyl Red, Congo Red, Benzopurpurin 4B, α-Naphthyl Red, Nile Blue 2B, Nile Blue A, Methyl Violet, Malachite Green, Parafuchsine, Victoria Pure Blue BOH (Hodogaya Chemical Co., Ltd.), Oil Blue #603 (Orient Chemical Industries, Ltd.), Oil Pink #312 (Orient Chemical Industries, Ltd.), Oil Red 5B (Orient Chemical Industries, Ltd.), Oil Scarlet #308 (Orient Chemical Industries, Ltd.), Oil Red OG (Orient Chemical Industries, Ltd.), Oil Red RR (Orient Chemical Industries, Ltd.), Oil Green #502 (Orient Chemical Industries, Ltd.), Spiron Red BEH Special (Hodogaya Chemical Co., Ltd.), m-Cresol Purple, Cresol Red, Rhodamine B, Rhodamine 6G, Sulforhodamine B, Auramine, 4-p-diethylaminophenyliminonaphthoquinone, 2-carboxyanihno-4-p-diethylaminophenyliminonaphthoquinone, 2-carboxystearylamino-4-p-N,N-bis(hydroxyethyl)aminophenyliminonaphthoquinone, 1-phenyl-3-methyl-4-p-diethylaminophenylimino-5-pyrazolone, and 1-p-naphthyl-4-p-diethylaminophenylimino-5-pyrazolone; also, leuco dyes such as p,p',p"-hexamethyltriaminotriphenylmethane (Leuco Crystal Violet) and Pergascript Blue SRB (Ciba Geigy Ltd.).

In addition to the preceding, the leuco dyes known as materials for heat-sensitive paper and pressure-sensitive paper are suitably used. Specific examples are as follows: Crystal Violet lactone, Malachite Green lactone, benzoyl leuco Methylene Blue, 2-(N-phenyl-N-methylamino)-6-(N-p-tolyl-N-ethyl)aminofluoran, 2-anilino-3-methyl-6-(N-ethyl-p-tolidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N—N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-aminofluoran, 3-(N,N-diethylamino)-7-(4-chloroanilino)fluoran, 3-(N,N-diethylamino)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis(1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide, and 3-(4-diethylaminophenyl)-3-(1-ethyl-2-methylindol-3-yl)phthalide.

A suitable quantity of addition for the dye that undergoes acid- or radical-induced color change is in each case 0.01 to 10 mass % with reference to the solids fraction in the photopolymerizable layer.

[Polymerization Inhibitor]

A small amount of a thermal polymerization inhibitor is preferably added to the photopolymerizable layer of the present invention in order to prevent unwanted thermal polymerization of the polymerizable monomer during production or storage of the photopolymerizable layer.

Suitable examples of the thermal polymerization inhibitor are hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol), and N-nitroso-N-phenylhydroxylamine/aluminum salt.

The quantity of addition for the thermal polymerization inhibitor is preferably approximately 0.01 mass % to approximately 5 mass % with reference to the total solids fraction of the photopolymerizable layer.

[Higher Fatty Acid Derivatives and so Forth]

In order to prevent oxygen-mediated inhibition of the polymerization, for example, a higher fatty acid or derivative thereof, such as behenic acid or behenamide, may be added to the photopolymerizable layer of the present invention; this becomes partitioned to the surface of the photopolymerizable layer in the drying process that follows coating. The quantity of addition of the higher fatty acid derivative is preferably approximately 0.1 mass % to approximately 10 mass % with reference to the total solids fraction of the photopolymerizable layer.

[Plasticizer]

The photopolymerizable layer of the present invention may contain a plasticizer in order to improve the on-press developability.

Suitable examples of the plasticizer are as follows: phthalate esters such as dimethyl phthalate, diethyl phthalate, dibutyl phthalate, diisobutyl phthalate, dioctyl phthalate, octyl capryl phthalate, dicyclohexyl phthalate, ditridecyl phthalate, butyl benzyl phthalate, diisodecyl phthalate, diallyl phthalate, and so forth; glycol esters such as dimethyl glycol phthalate, ethyl phthalyl ethyl glycolate, methyl phthalyl ethyl glycolate, butyl phthalyl butyl glycolate, triethylene glycol dicaprylate, and so forth; phosphate esters such as tricresyl phosphate, triphenyl phosphate, and so forth; esters of dibasic fatty acids such as diisobutyl adipate, dioctyl adipate, dimethyl sebacate, dibutyl sebacate, dioctyl azelate, dibutyl maleate, and so forth; and also polyglycidyl methacrylate, triethyl citrate, glycerol triacetate, and butyl laurate.

The plasticizer content is preferably no more than approximately 30 mass % with respect to the total solids fraction in the photopolymerizable layer.

[Finely Divided Inorganic Particles]

The photopolymerizable layer of the present invention may contain finely divided inorganic particles in order to improve the cured film strength in the image areas and improve the on-press develop ability of the nonimage areas.

Suitable examples of the finely divided inorganic particles are silica, alumina, magnesium oxide, titanium oxide, magnesium carbonate, calcium alginate, and mixtures of the preceding. Even though these lack the ability to convert light to heat, they can be used to strengthen the film and, through surface roughening, to reinforce the interfacial adhesion.

The finely divided inorganic particles preferably have an average particle size of 5 nm to 10 μm and more preferably 0.5 to 3 μm. Within the cited range, the finely divided inorganic particles can be stably dispersed in the photopolymerizable layer and can satisfactorily maintain the film strength of the photopolymerizable layer and can also form nonimage areas that exhibit an excellent hydrophilicity and thus are resistant to scumming during printing.

The finely divided inorganic particles under consideration can be easily acquired as commercial products, e.g., as a colloidal dispersion of silica.

The content of the finely divided inorganic particles is preferably no more than 20 mass % and more preferably no more than 10 mass %, in each case with reference to the total solids fraction of the photopolymerizable layer.

[Low Molecular Weight Hydrophihc Compound]

The photopolymerizable layer of the present invention may contain a low molecular weight hydrophilic compound in order to improve the on-press developability and improve the gum developability. The low molecular weight hydrophilic compound can be exemplified by water-soluble organic compounds, e.g., glycols such as ethylene glycol, diethylene glycol, triethylene glycol, propylene glycol, dipropylene glycol, tripropylene glycol, and so forth, as well as the ether and ester derivatives of the preceding; polyhydroxy compounds such as glycerol, pentaerythritol, and so forth; organic amines such as triethanolamine, diethanolamine, monoethanolamine, and so forth, as well as their salts; organosulfonic acids such as toluenesulfonic acid, benzenesulfonic acid, and so forth, as well as their salts; organophosphonic acids such as phenylphosphonic acid and so forth, as well as their salts; organic carboxylic acids such as tartaric acid, oxalic acid, citric acid, malic acid, lactic acid, gluconic acid, amino acids, and so forth, as well as their salts; and isocyanuric acid derivatives. Among the preceding, the isocyanuric acid derivatives can improve the on-press developability without degrading the printing durability and their use is therefore preferred.

[Formation of the Photopolymerizable Layer]

The photopolymerizable layer of the present invention is formed by dissolving or dispersing the required components of the photosensitive composition as described above in solvent to form a coating fluid; coating this coating fluid on a support; and drying. The solvent used here can be exemplified by ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone, toluene, water, and so forth, but the solvent is not limited to the preceding. A single one of these solvents or a mixture of these solvents may be used. The solids concentration in the coating fluid is preferably 1 to 50 mass %.

The photopolymerizable layer of the present invention may also be formed by preparing a plurality of coating fluids in which the same or different components (=the components described above) are dispersed or dissolved in the same solvent or different solvents and by carrying out coating and drying a plurality of times.

The application rate (solids fraction) for the photopolymerizable layer on the support that is obtained after coating and drying will vary with the intended use, but 0.3 to 3.0 $g/m^2$ is generally preferred. An excellent sensitivity is obtained in the cited range, as are excellent film-formation properties for the photopolymerizable layer.

A variety of methods can be used for the coating method. Examples are bar coater coating, spin coating, spray coating, curtain coating, dip coating, air knife coating, blade coating, roll coating, and so forth.

<The Support>

The support used for the lithographic printing plate precursor of the present invention is a dimensionally stable sheet or plate but is not otherwise particularly limited. The support can be exemplified by paper, plastic-laminated paper (the plastic can be exemplified by polyethylene, polypropylene, polystyrene, and so forth), metal plate or sheet (e.g., aluminum, zinc, copper, and so forth), plastic film (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate, polyvinyl acetal, and so forth), and paper or plastic film on which any of the aforementioned metals has been laminated or vapor-deposited. The support is preferably a polyester film or an aluminum plate. Aluminum plate is preferred therebetween for its excellent dimensional stability and relatively low cost.

The aluminum plate is a pure aluminum plate, an alloy plate containing aluminum as its main component along with trace amounts of heteroelements, or plastic laminated with a thin film of aluminum or aluminum alloy. Heteroelements that may be present in the aluminum alloy can be exemplified by silicon, iron, manganese, copper, magnesium, chromium, zinc, bismuth, nickel, titanium, and so forth. The heteroelement content in the alloy is preferably no more than 10 mass %. Although a pure aluminum plate is preferred in the present invention, the production of absolutely pure aluminum is problematic from the standpoint of refining technology, and the aluminum plate may therefore contain trace amounts of heteroelements. The aluminum plate is not limited with regard to composition, and any aluminum plate of material in the public domain can be used as appropriate.

The thickness of the support is preferably from 0.1 to 0.6 mm, more preferably from 0.15 to 0.4 mm, and even more preferably from 0.15 to 0.3 mm.

Prior to its use, the aluminum plate is preferably subjected to a surface treatment such as a roughening treatment or an anodic oxidation treatment. Securing adhesion between the photopolymerizable layer and the support and securing an improved hydrophilicity are facilitated by the implementation of a surface treatment. Prior to executing a roughening treatment on the aluminum plate, the aluminum plate may as desired be submitted to a degreasing treatment with, for example, surfactant, organic solvent, aqueous base solution, and so forth, in order to remove rolling oil from the surface.

Various methods can be employed to roughen the surface of the aluminum plate, for example, mechanical surface roughening, electrochemical surface roughening (roughening by electrochemical dissolution of the surface), and chemical surface roughening (roughening by selective chemical dissolution of the surface).

Known methods, such as ball grinding, brush grinding, blast grinding, and buff grinding, can be used as the method for carrying out mechanical surface roughening.

Electrochemical roughening can be carried out, for example, using alternating current or direct current in an electrolytic bath that contains an acid such as hydrochloric acid or nitric acid. Another example is a method that uses a mixed acid as described in Japanese Patent Application Publication No. Sho 54-63902.

The surface-roughened aluminum plate may optionally be subjected to an alkali etching treatment using an aqueous solution of potassium hydroxide, sodium hydroxide, and so forth, followed by neutralization and then as desired an anodic oxidation treatment in order to improve the abrasion resistance.

The various electrolytes that can bring about the formation of a porous oxide film can be used as the electrolyte employed for anodic oxidation of the aluminum plate. Sulfuric acid, hydrochloric acid, oxalic acid, chromic acid, or a mixed acid of the preceding is typically used. The concentration of these electrolytes is determined as appropriate in accordance with the type of electrolyte.

The anodic oxidation conditions vary as a function of the electrolyte used and thus cannot be unconditionally specified; however, the following are generally preferred: electrolyte concentration=1 to 80 mass % solution, bath temperature=5 to 70° C., current density=5 to 60 A/$dm^2$, voltage=1 to 100 V, electrolysis time=10 seconds to 5 minutes. The quantity of anodic-oxidation film formation is preferably from 1.0 to 5.0 g/$m^2$ and more preferably is from 1.5 to 4.0 g/$m^2$. An excellent printing durability and an excellent resistance to damage in the nonimage areas of the lithographic printing plate are obtained in the cited range.

As necessary, the surface of the aluminum plate may be subjected to a hydrophilization treatment after the anodic oxidation treatment has been completed. This hydrophilization treatment can employ, for example, the alkali metal silicate method described in U.S. Pat. Nos. 2,714,066, 3,181,461, 3,280,734, and 3,902,734. In this method, the support is treated, by immersion or electrolysis, in an aqueous solution of, for example, sodium silicate. Examples of other methods are treatment with potassium fluozirconate as described in Japanese Patent Publication No. Sho 36-22063 and treatment with polyvinylphosphonic acid as described in U.S. Pat. Nos. 3,276,868, 4,153,461, and 4,689,272.

The center-line average roughness of the support is preferably from 0.10 to 1.2 μm. A good adhesion to the photopolymerizable layer, good printing durability, and good scumming resistance are obtained in the cited range.

In addition, the support preferably has a color density of 0.15 to 0.65 expressed as the reflection density value. An excellent capacity to inspect the plate after development is obtained within the cited range, as are excellent image-forming characteristics due to the prevention of halation during imagewise photoexposure.

<Backcoat Layer>

After surface treatment has been carried out on the support or after the undercoat layer has been formed on the support, a backcoat may as necessary be provided on the back side of the support.

Preferred examples of the backcoat are the coating layer comprising an organic polymer compound as described in Japanese Patent Application Publication No. Hei 5-45885, and the coating layer comprising a metal oxide obtained by the hydrolysis and polycondensation of an organometal compound or inorganic metal compound as described in Japanese Patent Application Publication No. Hei 6-35174. In particular, the use of alkoxy compounds of silicon, e.g., $Si(OCH_3)_4$, $Si(OC_2H_5)_4$, $Si(OC_3H_7)_4$, $Si(OC_4H_9)_4$, and so forth, is preferred because these starting material can be easily and inexpensively acquired.

<Undercoat Layer>

The lithographic printing plate precursor of the present invention may as necessary be provided with an undercoat layer between the photopolymerizable layer and the support. This undercoat layer facilitates delamination of the photopolymerizable layer from the support in the unexposed areas and thereby improves the on-press developability in the case of the on-press-developable lithographic printing plate precursor. In addition, when photoexposure is carried out with an infrared laser, the undercoat layer functions as a heat insulating layer; as a consequence, the heat generated by photoexposure is prevented from diffusing to the support and is thereby efficiently utilized, accruing the advantage of supporting an increase in the sensitivity.

When, in particular, a UV ink is employed, the undercoat layer in the present invention preferably contains, with the goal of improving the fine line reproducibility, a compound that contains both an addition-polymerizable ethylenic double bond and a group adsorptive to the surface of the hydrophilic support.

Preferred compounds for forming the undercoat layer (undercoat compounds) can be specifically exemplified by silane coupling agents that contain an addition-polymerizable ethylenic double bond reactive group, as described in Japanese Patent Application Publication No. Hei 10-282679, and phosphorus compounds containing an ethylenic double bond reactive group, as described in Japanese Patent Application Publication No. Hei 2-304441.

The most preferred undercoat compounds can be exemplified by polymer resins obtained by the copolymerization of adsorptive group-containing monomer, hydrophilic group-containing monomer, and crosslinking group-containing monomer.

A group that adsorbs to the surface of the hydrophilic support is an essential component of the polymer resin for undercoat formation. The presence/absence of adsorptivity to the surface of the hydrophilic support can be determined, for example, by the following method.

A coating solution is prepared by dissolving the test compound in a good solvent and this coating solution is coated and dried on the support so as to provide a post-drying coating rate of 30 mg/$m^2$. The support coated with the test compound is then thoroughly rinsed with the good solvent, and the residual quantity of the test compound that has not been removed by rinsing is subsequently measured in order to determine the quantity adsorbed to the support. Measurement of this residual quantity can be carried out by a direct determination of the residual quantity of the compound, or the quantity of the test compound that has dissolved in the rinse solution can be determined and used to calculate the residual quantity. Determination of the compound can be carried out, for example, by x-ray fluorescence measurements, reflection absorption spectroscopic measurements, liquid chromatographic measurement, and so forth. A compound that is adsorptive to the support will have a residue of at least 1 mg/$m^2$ even when the cited rinsing treatment is carried out.

The group adsorptive to the surface of the hydrophilic support is a functional group that can produce a chemical bond (for example, an ionic bond, hydrogen bond, coordination bond, or a bond due to intermolecular forces) with a substance (for example, a metal or metal oxide) or a functional group (for example, the hydroxyl group) present at the surface of the hydrophilic support. The adsorptive group is preferably an acid group or a cationic group.

The acid group preferably has an acid dissociation constant (pKa) no greater than 7. Examples of the acid group are the phenolic hydroxyl group, the carboxyl group, $—SO_3H$, $—OSO_3H$, $—PO_3H_2$, $—OPO_3H_2$, $—CONHSO_2—$, $—SO_2NHSO_2—$, and $COCH_2COCH_3$. Particularly preferred among the preceding are $OPO_3H_2$ and $PO_3H_2$. This acid group may also be a metal salt.

The cationic group is preferably an onium group. Examples of onium groups are ammonium, phosphonium, arsonium, stibonium, oxonium, sulfonium, selenonium, stannonium, and iodonium. Preferred thereamong are ammonium, phosphonium, and sulfonium. Ammonium and phosphonium are more preferred, and ammonium is most preferred.

Compounds represented by the following general formula (iii) and general formula (iv) are particularly preferred examples of adsorptive group-containing monomers.

(iii)

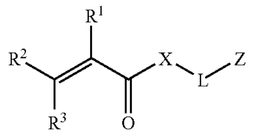

(iv)

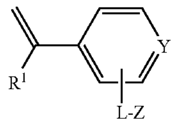

$R^1$, $R^2$, and $R^3$ in the preceding formulas are each independently the hydrogen atom, a halogen atom, or $C_{1-6}$ alkyl. $R^1$, $R^2$, and $R^3$ are each independently preferably the hydrogen atom or $C_{1-6}$ alkyl, more preferably the hydrogen atom or $C_{1-3}$ alkyl, and most preferably the hydrogen atom or methyl group. $R^2$ and $R^3$ are particularly preferably the hydrogen atom. Z is a functional group that adsorbs to the surface of the hydrophilic support.

X in formula (iii) is the oxygen atom (—O—) or imino (—NH—). X is more preferably the oxygen atom. L in formula (iii) is a divalent linking group. L is preferably a divalent aliphatic group (alkylene, substituted alkylene, alkenylene, substituted alkenylene, alkynylene, substituted alkynylene), divalent aromatic group (arylene, substituted arylene), or divalent heterocyclic group, or a combination of the preceding with the oxygen atom (—O—), sulfur atom (—S—), imino (—NH—), substituted imino (—NR— wherein R is an aliphatic group, aromatic group, or heterocyclic group), or carbonyl (—CO—).

The aforementioned aliphatic group may have a cyclic structure or a branched structure. The number of carbons in the aliphatic group is preferably 1 to 20, more preferably 1 to 15, and most preferably 1 to 10. A saturated aliphatic group is more preferred for the aliphatic group than an unsaturated aliphatic group. The aliphatic group may bear a substituent, and this substituent can be exemplified by halogen atoms, the hydroxyl group, aromatic groups, and heterocyclic groups.

The number of carbons in the aromatic group is preferably 6 to 20, more preferably 6 to 15, and most preferably 6 to 10. The aromatic group may bear a substituent, and this substituent can be exemplified by halogen atoms, the hydroxyl group, aliphatic groups, aromatic groups, and heterocyclic groups.

The aforementioned heterocyclic group preferably has a five-membered ring or six-membered ring for its heterocyclic ring. In addition, this heterocyclic ring may be condensed with an aliphatic ring, aromatic ring, or another heterocyclic ring. The heterocyclic group may bear a substituent, and this substituent can be exemplified by halogen atoms, the hydroxyl group, the oxo group (=O), the thioxo group (=S), the imino group (=NH), substituted imino (=N—R wherein R is an aliphatic group, aromatic group, or heterocyclic group), aliphatic groups, aromatic groups, and heterocyclic groups.

L is preferably a divalent linking group that contains a plurality of polyoxyalkylene structures. The polyoxyalkylene structure is more preferably a polyoxyethylene structure. In other words, L preferably contains $—(OCH_2CH_2)_n—$ (n is an integer with a value of at least 2).

Y in formula (iv) is the carbon atom or nitrogen atom. In those instances where Y=nitrogen atom and L is connected to Y and a quaternary pyridinium group is thereby created, such a group is itself adsorptive and Z then becomes unnecessary and may be a hydrogen atom. L is a divalent linking group defined in the same manner as for formula (iii) or is a single bond.

The adsorptive functional group is as described above.

Examples of representative compounds with formula (iii) or (iv) are provided below.

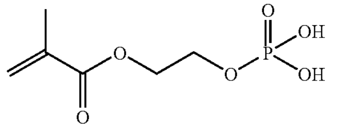

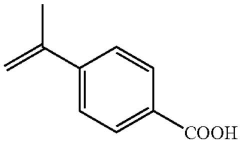

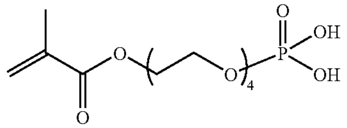

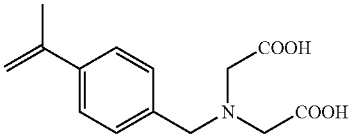

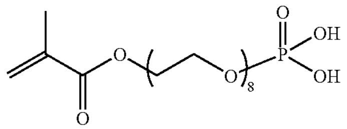

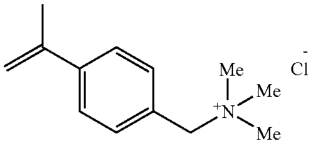

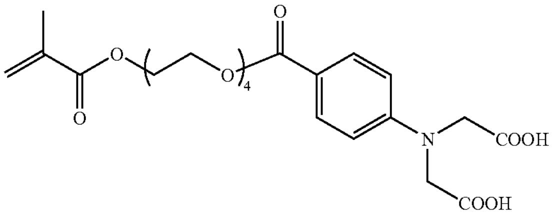

-continued

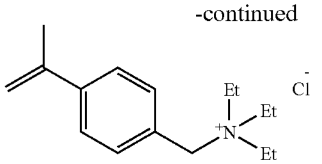

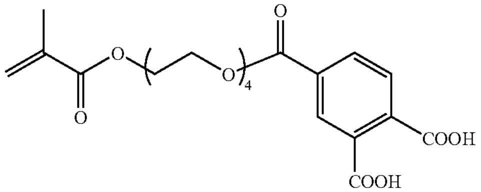

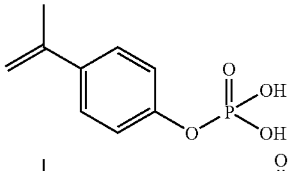

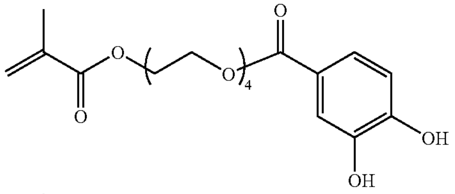

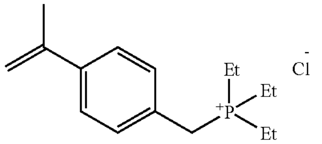

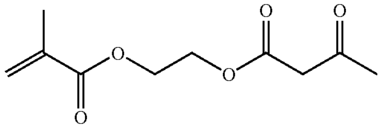

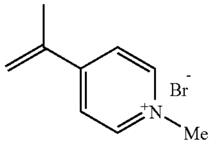

Suitable examples of the hydrophilic group in undercoat polymer resins usable in the present invention are the hydroxyl group, carboxyl group, carboxylate group, hydroxyethyl, polyoxyethyl, hydroxypropyl, polyoxypropyl, the amino group, aminoethyl, aminopropyl, the ammonium group, amide groups, carboxymethyl, the sulfo group, the phosphate group, and so forth. Monomer containing the highly hydrophilic sulfo group is preferred among the preceding. The following are specific examples of sulfo group-containing monomers: the sodium and amine salts of methallyloxybenzenesulfonic acid, allyloxybenzenesulfonic acid, allylsulfonic acid, vinylsulfonic acid, p-styrenesulfonic acid, methallylsulfonic acid, acrylamide-t-butylsulfonic acid, 2-acrylamido-2-methylpropanesulfonic acid, and (3-acryloyloxypropyl)butylsulfonic acid. Sodium 2-acrylamido-2-methylpropanesulfonate is preferred among the preceding for its hydrophilicity and handling during synthesis.

The polymer resin used to form the undercoat layer in the present invention preferably has a crosslinking group. An improved adhesion with the image areas is provided by the crosslinking group. In order to endow the polymer resin used to form the undercoat layer with the ability to crosslink, a crosslinking functional group, e.g., an ethylenically unsaturated bond, may be introduced into side chain position on the polymer, and/or the crosslinking functional group may be introduced by forming a salt structure with a compound that has an ethylenically unsaturated bond and a substituent that carries a charge opposite that of a polar substituent in the polymer resin.

Examples of polymers that have ethylenically unsaturated bonds in side chain position on the molecule are polymers of an ester or amide of acrylic acid or methacrylic acid wherein the ester or amide residue (R in —COOR or CONHR) contains an ethylenically unsaturated bond.

Examples of the ethylenically unsaturated bond-containing residue (the R cited above) are as follows: $-CR^1=CR^2R^3$, $-(CH_2)_nCR_1=CR_2R_3$, $-(CH_2O)_nCH_2CR_1=CR_2R_3$, $-(CH_2CH_2O)_nCH_2CR_1=CR_2R_3$, $-(CH_2)_nNH-CO-O-CH_2CR_1=CR_2R_3$, $-(CH_2)_n-O-CO-CR_1=CR_2R_3$, and $(CH_2CH_2O)_2-X$ (in these formulas, $R_1$ to $R_3$ each represent the hydrogen atom, a halogen atom, or $C_{1-20}$ alkyl, aryl, alkoxy, or aryloxy; $R_1$ may be bonded with $R_2$ or $R_3$ to form a ring; n is an integer from 1 to 10; and X is the dicyclopentadienyl residue).

The following are specific examples of the ester residue: $-CH=CH_2$, $-C(CH_3)=CH_2$, $-CH_2CH=CH_2$ (described in Japanese Patent Publication No. Hei 7-21633), $-CH_2CH_2O-CH_2CH=CH_2$, $-CH_2C(CH_3)=CH_2$, $-CH_2CH=CH-C_6H_5$, $-CH_2CH_2OCOCH=CH-C_6H_5$, $-CH_2CH_2NHCOO-CH_2CH=CH_2$, and $CH_2CH_2O-X$ (X in the formula represents the dicyclopentadienyl residue).

The following are specific examples of the amide residue: $-CH=CH_2$, $-C(CH_3)=CH_2$, $-CH_2CH=CH_2$, $-CH_2CH_2O-$(Y in the formula represents the cyclohexene residue), and $-CH_2CH_2OCO-CH=CH_2$.

The aforementioned crosslinking group-containing ester or amide of acrylic acid or methacrylic acid is well suited for use as the crosslinking group-containing monomer for the polymer resin for undercoat layer formation.

The content of the crosslinking group in the polymer resin for undercoat layer formation (i.e., the content of the radically polymerizable unsaturated double bond, as yielded by iodine titration) is preferably 0.1 to 10.0 mmol per 1 g of the polymer resin, more preferably 1.0 to 7.0 mmol per 1 g of the polymer resin, and most preferably 2.0 to 5.5 mmol per 1 g of the polymer resin. An excellent combination of sensitivity and scumming behavior and an excellent storage stability are obtained in the cited range.

The polymer resin for undercoat layer formation has a mass-average molecular weight preferably of at least 5000 and more preferably of 10,000 to 300,000 and has a number-average molecular weight preferably of at least 1000 and more preferably of 2000 to 250,000. The polydispersity (mass-average molecular weight/number-average molecular weight) is preferably 1.1 to 10.

The polymer resin for undercoat layer formation may be a random polymer, block polymer, graft polymer, and so forth, wherein a random polymer is preferred.

A single polymer resin for undercoat layer formation may be used or a mixture of two or more may be used. The coating solution for undercoat layer formation is obtained by dissolving the aforementioned polymer resin for undercoat formation in organic solvent (for example, methanol, ethanol, acetone, methyl ethyl ketone, and so forth) and/or water. The coating solution for undercoat layer formation may also contain an infrared absorber.

Various known methods can be used to coat the support with the coating solution for undercoat layer formation. Examples of these methods are coating with a bar coater, spin coating, spray coating, curtain coating, dip coating, air knife coating, blade coating, roll coating, and so forth.

The coating rate (solids fraction) for the undercoat layer is preferably 0.1 to 100 mg/$m^2$ and more preferably 1 to 30 mg/$m^2$.

<Protective Layer>

A protective layer (overcoat layer) may optionally be provided on the photopolymerizable layer of the lithographic printing plate precursor of the present invention in order to provide an oxygen-blocking action, prevent damage to the photopolymerizable layer, and prevent the ablation that can occur during photoexposure with a high intensity laser.

The photoexposure of lithographic printing plates is generally carried out in the air. Low molecular weight compounds present in the air, such as oxygen and basic substances, can inhibit the photoexposure-induced image-forming reactions in the photopolymerizable layer. The protective layer prevents these low molecular weight compounds (e.g., oxygen and basic substances) from mixing into the photopolymerizable layer and as a result prevents reactions that would inhibit image formation in the air. Thus, the characteristics desired for the protective layer are the ability to reduce the permeability of the low molecular weight compounds (e.g., oxygen), an excellent transmittance for the light used for photoexposure, an excellent adhesion to the photopolymerizable layer, and the ability to be easily removed in the on-press development treatment process following photoexposure. Protective layers having such characteristics are described in, for example, U.S. Pat. No. 3,458,311 and Japanese Patent Publication No. Sho 55-49729.

The material used for the protective layer is suitably selected from water-soluble polymers and water-insoluble polymers. Specific examples are water-soluble polymers, e.g., polyvinyl alcohol, modified polyvinyl alcohol, polyvinylpyrrolidone, polyvinylimidazole, polyacrylic acid, polyacrylamide, the partial saponification products of polyvinyl acetate, ethylene-vinyl alcohol copolymers, water-soluble cellulose derivatives, gelatin, starch derivatives, gum arabic, and so forth, as well as polymers such as polyvinylidene chloride, poly(meth)acrylonitrile, polysulfone, polyvinyl chloride, polyethylene, polycarbonate, polystyrene, polyamide, cellophane, and so forth. As necessary, these may also be used in combinations of two or more.

Water-soluble polymer compounds that exhibit an excellent crystallinity are relatively useful materials among the materials listed above. Preferred specific examples are polyvinyl alcohol, polyvinylpyrrolidone, polyvinylimidazole, water-soluble acrylic resins, e.g., polyacrylic acid, gelatin, gum arabic, and so forth. In terms of being coatable using water as the solvent and being easy to remove by the fountain solution during printing, polyvinyl alcohol, polyvinylpyrrolidone, and polyvinylimidazole are preferred among the preceding. Among these latter polymers, polyvinyl alcohol (PVA) provides the best results with respect to the basic characteristics, i.e., oxygen-barrier performance and removability during development.

Polyvinyl alcohols that can be used for the protective layer may be partially substituted with an ester, ether, or acetal as long as the unsubstituted vinyl alcohol unit is present in substantially the amount that provides the necessary water solubility. Other copolymer components may be present to some degree under the same conditions. For example, the use is also preferred of polyvinyl alcohol with various degrees of polymerization that randomly contains any of various hydrophilic modified sites, such as anion-modified sites that have been modified with an anion (e.g., the carboxyl group or sulfo group), cation-modified sites that have been modified with a cation (e.g., an amino group or ammonium group), silanol-modified sites, thiol-modified sites, and so forth, and polyvinyl alcohols with various degrees of polymerization that have various modified sites at the polymer chain terminals, e.g., the aforementioned anion-modified sites, the aforementioned cation-modified sites, silanol-modified sites, and thiol-modified sites as well as alkoxyl-modified sites, sulfide-modified sites, ester-modified sites between the vinyl alcohol and an organic acid, ester-modified sites between the aforementioned anion-modified site and, for example, an alcohol, epoxy-modified sites, and so forth.

These modified polyvinyl alcohols are preferably compounds that have been from 71 to 100 mol % hydrolyzed and that have a degree of polymerization in the range from 300 to 2,400. Specific examples are PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613, and L-8 (from Kuraray Co., Ltd.). The following are additional examples of modified polyvinyl alcohols: KL-318, KL-118, KM-618, KM-118, and SK-5102, which each have anion-modified sites; C-318, C-118, and CM-318, which each have cation-modified sites; M-205 and M-115, which each have terminal thiol-modified sites; MP-103, MP-203, MP-102, and MP-202, which each have terminal sulfide-modified site; HL-12E and HL-1203, which have terminal ester (higher aliphatic acid)-modified sites; and R-1130, R-2105, and R-2130, which each have reactive silane-modified sites.

The protective layer also preferably contains a layer compound. This layer compound denotes particles that have a thin plate shape and is exemplified by the mica group, for example, synthetic micas and natural micas with the following general formula $$A(B,C)_{2\text{-}5}D_4O_{10}(OH,F,O)_2$$

(wherein A represents any selection from Li, K, Na, Ca, Mg, and organic cations; B and C represent any selection from Fe(II), Fe(III), Mn, Al, Mg, and V; and D represents Si or Al), and by talc as represented by the formula $3MgO.4SiO.H_2O$, taeniolite, montmorillonite, saponite, hectorite, and zirconium phosphate.

The natural micas cited above are exemplified by muscovite, paragonite, phlogopite, biotite, and lepidolite. The synthetic micas can be exemplified by non-swellable micas, e.g., fluorophlogopite $KMg_3(ASi_3O_{10})F_2$ and potassium tetrasilicic mica $KMg_{2.5}(Si_4O_{10})F_2$, and swellable micas, for example, Na tetrasilicic mica $NaMg2.5(Si_4O_{10})F_2$, Na or Li taeniolite $(Na,Li)Mg_2Li(Si_4O_{10})F_2$, and montmorillonite series Na or Li hectorite $(Na,Li)_{1/8}Mg_{2.5}Li_{1/8}(Si_4O_{10})F_2$. Synthetic smectites are also useful.

Among the layer compounds described above, fluorine-containing swellable micas that are synthetic layer compounds are particularly useful. Thus, swellable clay minerals, e.g., mica, montmorillonite, saponite, hectorite, and bentonite, have a layer structure comprising a unit crystal lattice layer having a thickness of 10 to 15 Å, and metal atom substitution within the lattice is much greater than in other clay minerals. As a result, a positive charge deficiency is produced in the lattice layer, and cations such as $Li^+$, $Na^+$, $Ca^{2+}$, and $Mg^{2+}$ and organic cations (e.g., amine salts, quaternary ammonium salts, phosphonium salts, sulfonium salts, and so forth) are adsorbed between the layers to compensate for this deficiency. These layer compounds are swollen by water. When shear is applied in the swollen state, cleavage readily occurs and a stable sol is formed in water. Bentonite and swellable synthetic micas strongly exhibit this tendency.

On the subject of the shape of the layer compound, with regard to thickness, thinner is more desirable from the standpoint of controlling diffusion; with regard to the size of the flat side, larger is more desirable as long as neither the smoothness of the coated surface nor the transmission of the active light are impaired. The aspect ratio is therefore at least 20, preferably at least 100, and particularly preferably at least 200. Here, the aspect ratio is the ratio between the longer diameter of the particle and the thickness thereof, and can be measured, for example, from the projection yielded by a microphotograph of the particle. A larger aspect ratio provides a greater effect.

With regard to the average particle size of the layer compound, its average diameter is from 1 to 20 μm, preferably from 1 to 10 μm, and particularly preferably from 2 to 5 μm. The inhibition of oxygen and moisture permeation is inadequate at a particle size smaller than 1 μm and an adequate effect therefore cannot be evidenced. When the particle size is larger than 20 μm, the dispersion stability in the coating fluid is inadequate and coating cannot be carried out in a stable manner. The average thickness of the particles is no more than 0.1 μm, preferably no more than 0.05 μm, and particularly preferably no more than 0.01 μm. For example, among the inorganic layer compounds, the swellable synthetic micas, taken as representative compounds, have a thickness from 1 to 50 nm and a face size from 1 to 20 μm.

The coated film strength can be improved and the permeation of oxygen and moisture can be effectively prevented when the protective layer contains the high aspect ratio inorganic layer compound particles described above. As a consequence, impairment of the protective layer due, for example, to deformation, can be prevented, and an excellent storage stability—including no decline in the image-forming performance of the lithographic printing plate precursor due to humidity changes—is obtained even for long-term storage under high humidity conditions.

The content of the inorganic layer compound in the protective layer is preferably from 5/1 to 1/100 as the mass ratio with respect to the amount of binder used in the protective layer. 2/1 to 1/5 is more preferred. When a plurality of inorganic layer compounds are used in combination, it is again preferred that the total quantity of these inorganic layer compounds satisfy this mass ratio.

In order to improve the receptivity, a phosphonium compound is preferably also added to the photopolymerizable layer and/or protective layer in those instances where the above-described inorganic layer compound is used in the protective layer. Phosphonium compounds with the following general formulas (v) and (vi) are preferred for this phosphonium compound, wherein phosphonium compounds with general formula (v) are preferred therebetween.

(v)

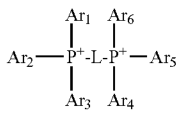

$mX^{n-}$ (vi)

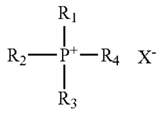

$Ar_1$ to $Ar_6$ in formula (v) each independently represent aryl or a heterocyclic group; L represents a divalent linking group; X represents an n-valent counteranion; n represents an integer with a value of 1 to 3; and m represents a number that satisfies n×m=2. Preferred examples of the aryl here are phenyl, naphthyl, tolyl, xylyl, fluorophenyl, chlorophenyl, bromophenyl, methoxyphenyl, ethoxyphenyl, dimethoxyphenyl, methoxycarbonylphenyl, dimethylaminophenyl, and so forth. The heterocyclic group can be exemplified by pyridyl, quinolyl, pyrimidinyl, thienyl, furyl, and so forth.

L represents a divalent linking group. The number of carbons in the linking group is preferably 6 to 15, and more preferably this is a $C_{6-12}$ linking group.

$X^-$ represents a counteranion, wherein preferred counteranions are halogen anions such as $Cl^-$, Br, and $I^-$, the sulfonate anion, carboxylate anions, sulfate ester anions, $PF_6^-$, $BF_4^-$, and the perchlorate anion. Particularly preferred thereamong are halogen anions such as $Cl^-$, $Br^-$, and $I^-$, the sulfonate anion, and carboxylate anions.

Specific examples of phosphonium salts with general formula (v) for use in the present invention are provided below.

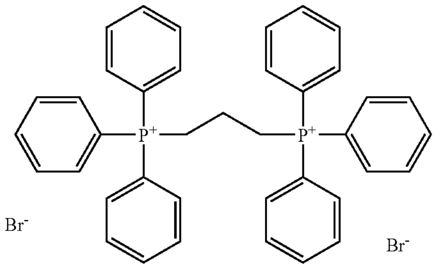

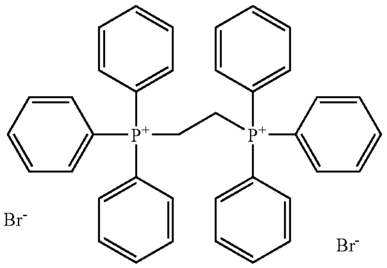

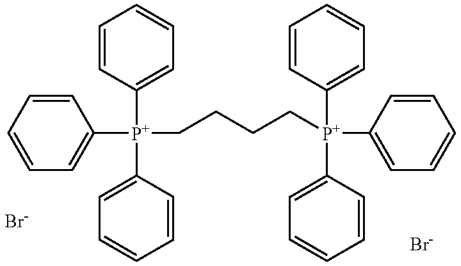

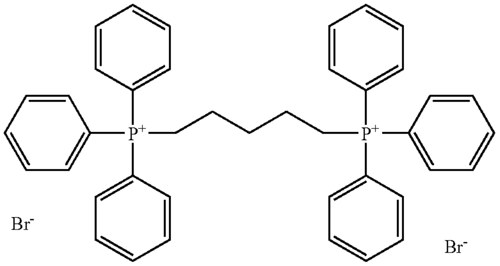

-continued
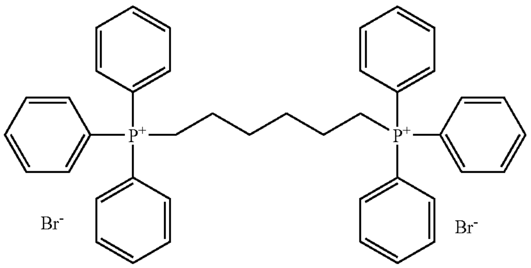
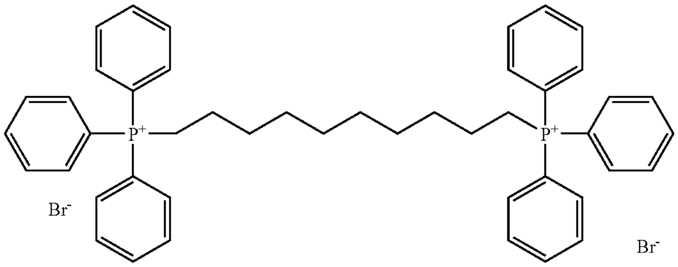
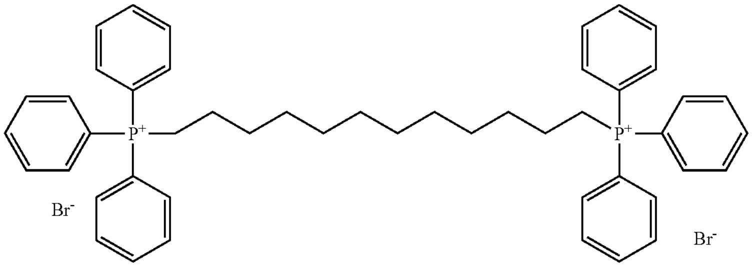
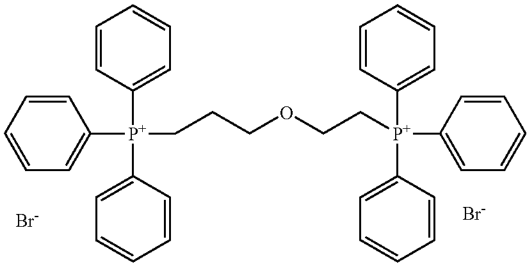
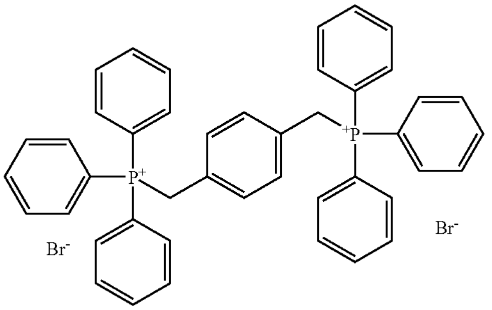
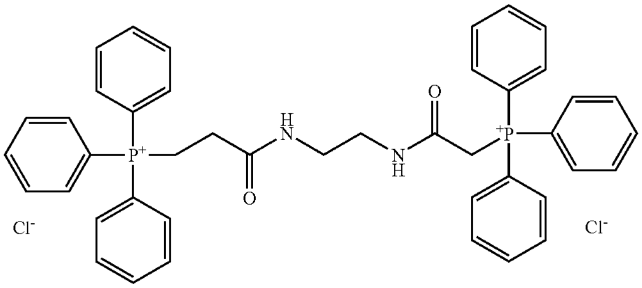
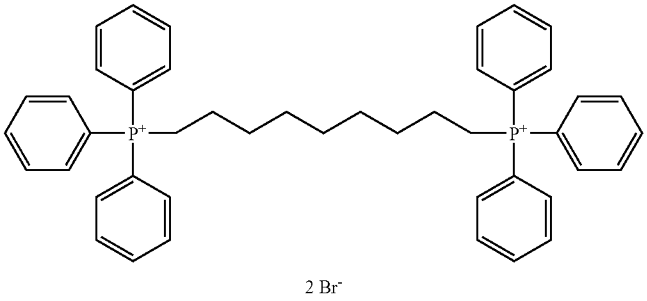

-continued
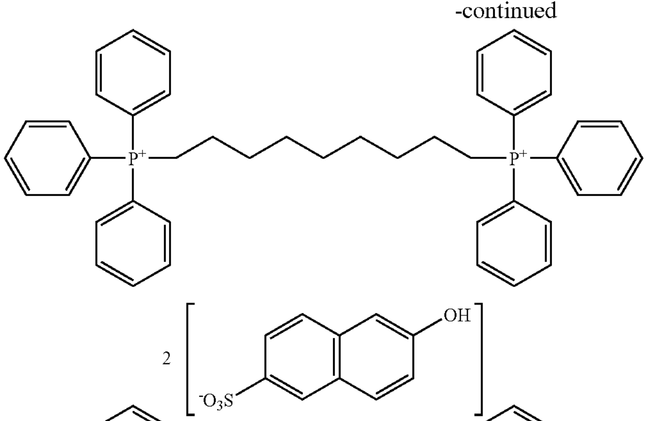
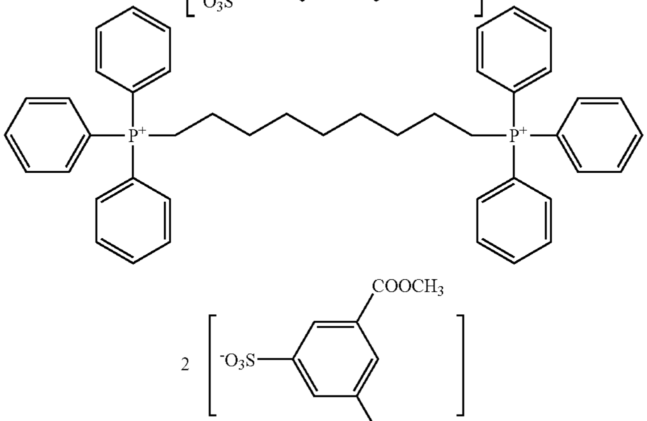
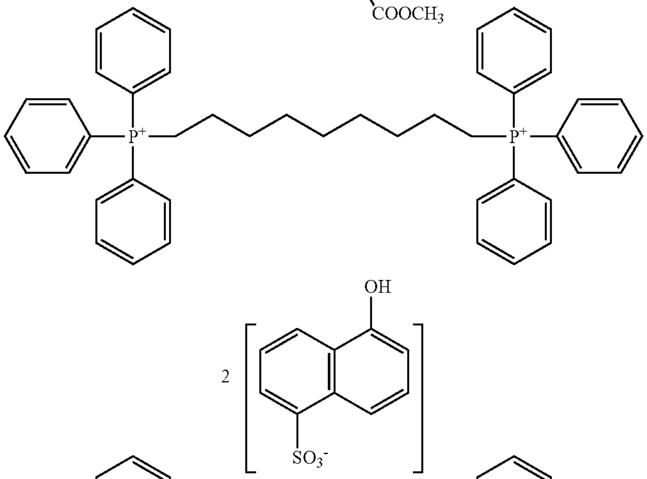
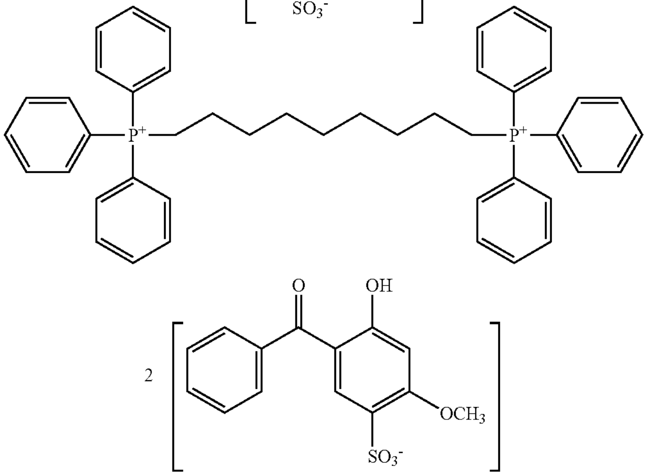

-continued
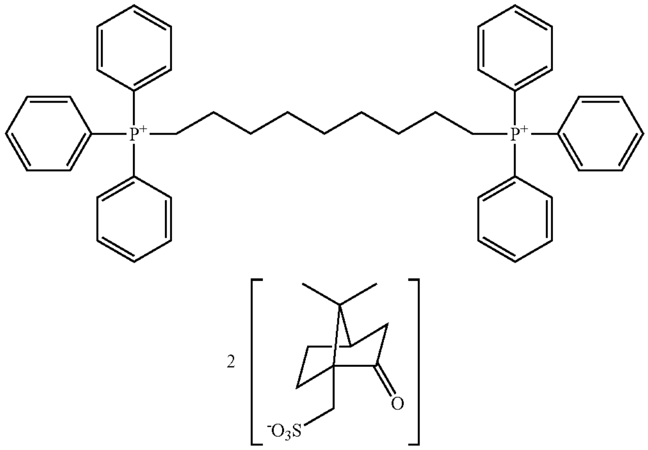
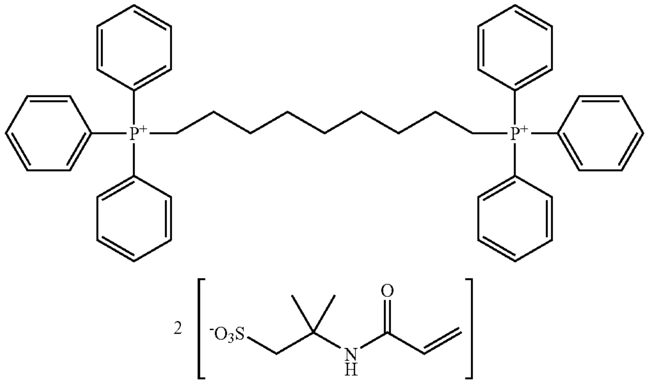
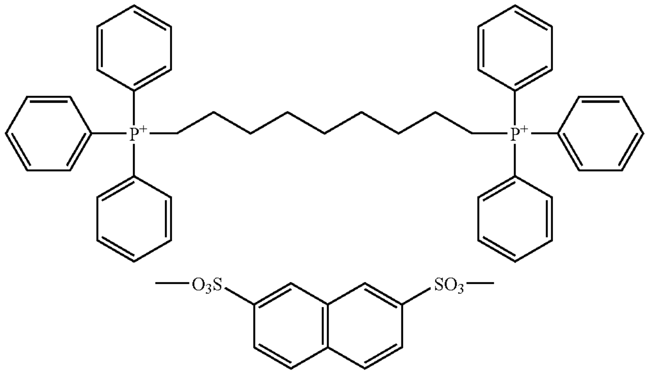
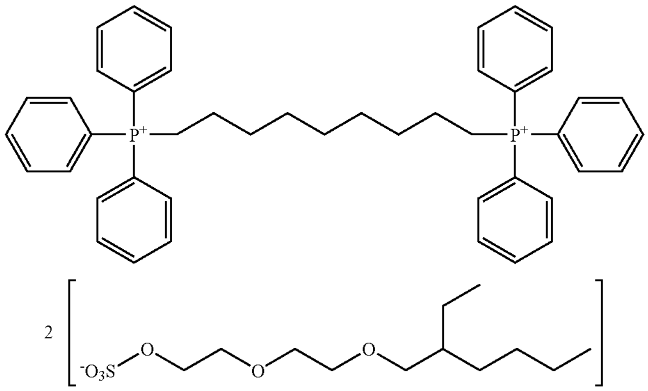

-continued

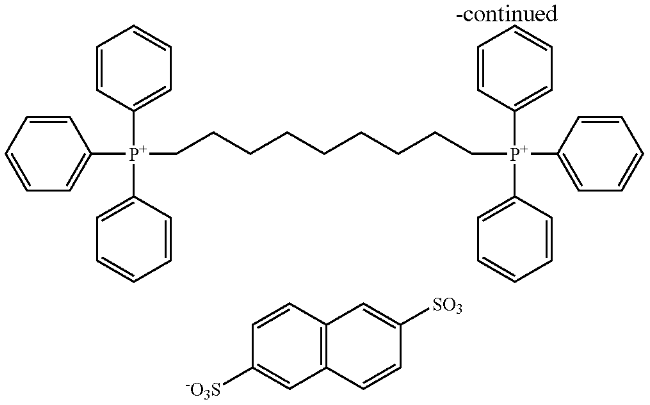

$R_1$ to $R_4$ in general formula (vi) each independently represent possibly substituted alkyl, alkenyl, alkynyl, cycloalkyl, alkoxy, aryl, aryloxy, alkylthio, or a heterocyclic group or the hydrogen atom. Two or more of $R_1$ to $R_4$ may be bonded to each other to form a ring. $X^-$ represents a counteranion.

The number of carbons is generally 1 to 20 when $R_1$ to $R_4$ is alkyl, alkoxy, or alkylthio; the number of carbons is generally 2 to 15 when $R_1$ to $R_4$ is alkenyl or alkynyl; and the number of carbons is generally 3 to 8 when $R_1$ to $R_4$ is cycloalkyl. The aryl is exemplified by phenyl, naphthyl, and so forth; the aryloxy is exemplified by phenoxy, naphthyloxy, and so forth; the arylthio is exemplified by phenylthio and so forth; and the heterocyclic group is exemplified by furyl, thienyl, and so forth. The substituents possibly present on these groups are exemplified by alkyl, alkenyl, alkynyl, cycloalkyl, alkoxy, alkoxycarbonyl, acyl, alkylthio, aryl, aryloxy, arylthio, sulfino, sulfo, phosphino, phosphoryl, the amino group, the nitro group, the cyano group, the hydroxyl group, and halogen atoms. These substituents may themselves be substituted.

The anion represented by $X^-$ can be exemplified by halogen ions such as $Cl^-$, $Br^-$, and $I^-$; the anions of inorganic acids, such as $ClO_4^-$, $PF_6^-$, and $SO_4^{2-}$; organocarboxylate anions; and organosulfonate anions. The organic group in the organocarboxylate anion and organosulfonate anion can be exemplified by methyl, ethyl, propyl, butyl, phenyl, methoxyphenyl, naphthyl, fluorophenyl, difluorophenyl, pentafluorophenyl, thienyl, pyrrolyl, and so forth. $Cl^-$, $Br^-$, $I^-$, $ClO_4^-$, $PF_6^-$, and so forth are preferred among the preceding. Specific examples of phosphonium compounds suitable for the present invention are given below.

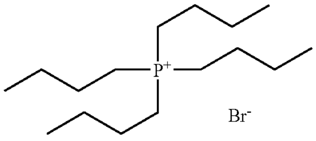

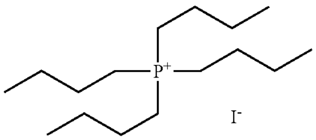

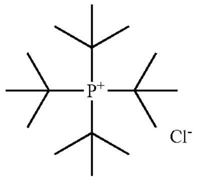

-continued

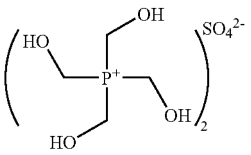

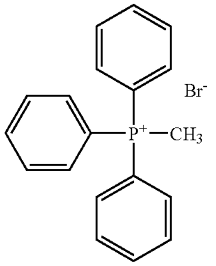

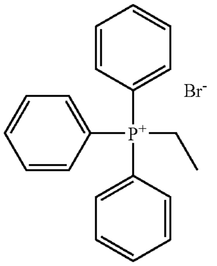

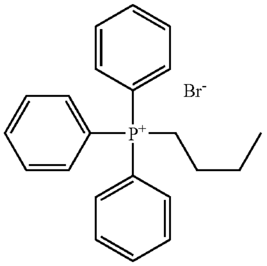

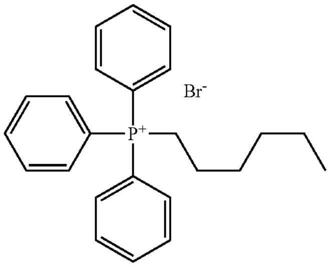

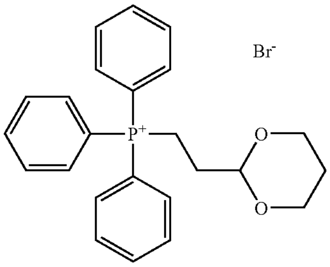

-continued

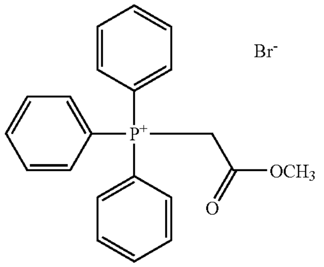

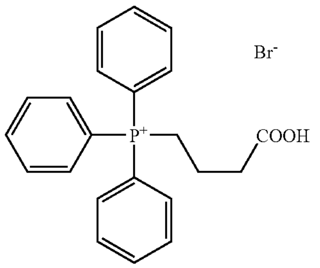

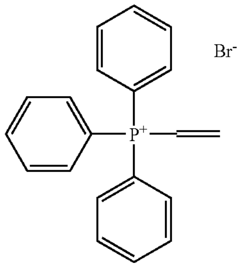

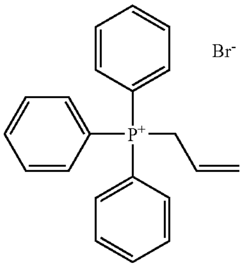

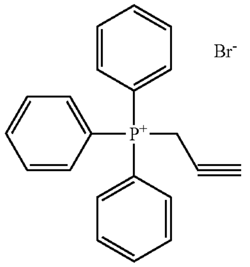

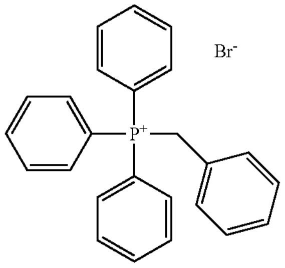

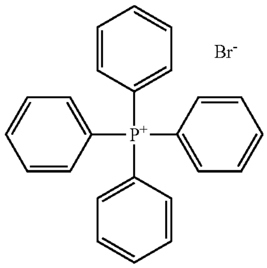

-continued

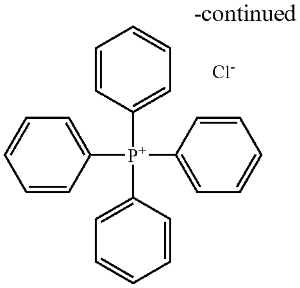

The quantity of phosphonium salt addition to the photopolymerizable layer or protective layer is preferably 0.01 to 20 mass %, more preferably 0.05 to 10 mass %, and most preferably 0.1 to 5 mass %, in each case with reference to the solids fraction in the particular layer. An excellent ink receptivity is obtained in these ranges.

With regard to other components in the protective layer, the addition of, for example, glycerol or dipropylene glycol in an amount corresponding to several mass % with reference to the (co)polymer can provide flexibility. An anionic surfactant such as a sodium alkyl sulfate, sodium alkylsulfonate, and so forth, an amphoteric surfactant such as an alkylaminocarboxylic acid salt, alkylaminodicarboxylic acid salt, and so forth, or a nonionic surfactant such as a polyoxyethylene alkylphenyl ether and so forth, can also be added. These surfactants can be added at from 0.1 to 100 mass % with reference to the (co)polymer.

In order to bring about an excellent adhesion with the image areas, Japanese Patent Application Publication No. Sho 49-70702 and GB 1,303,578 teach that a satisfactory adhesion is obtained by mixing 20 to 60 mass % of, for example, an acrylic emulsion or a water-insoluble vinylpyrrolidone-vinyl acetate copolymer, into a hydrophilic polymer comprising mainly polyvinyl alcohol and layering this on the photopolymerizable layer. Any of these known technologies may be used in the present invention.

The protective layer may also be provided with other functionalities. For example, the safelight fitness can be improved without causing a decline in sensitivity by adding a colorant (e.g., a water-soluble dye) that exhibits an excellent transmittance for the infrared radiation used in photoexposure and that can efficiently absorb light at other wavelengths.

Examples of general methods for dispersing the layer compound used in the protective layer are provided in the following. First, from 5 to 10 mass parts of the swellable layer compound, which was provided as a preferred layer compound among the previously described layer compounds, is added to 100 mass parts water. After thorough mixing into the water and swelling, the mixture is transferred to a disperser and dispersion is carried out. The disperser used here can be exemplified by mills that carry out dispersion by the direct application of mechanical force, high-speed stirring-type dispersers that generate high shear forces, and dispersers that apply high intensity ultrasonic energy. Specific examples are ball mills, sand grinder mills, viscomills, colloid mills, homogenizers, dissolvers, Polytrons, homomixers, homoblenders, Kady mills, the Jet Agitor, capillary emulsifying devices, liquid sirens, piezoelectric-type ultrasonic generators, and emulsifying devices equipped with a Polman whistle. The dispersion, containing 5 to 10 mass % of the inorganic layer compound dispersed by the previously described method, has a high viscosity or is a gel and exhibits an extremely good storage stability. To prepare a coating fluid for protective layer formation using this dispersion, the dispersion is preferably diluted with water and thoroughly stirred and then blended with the binder solution.

Known additives may be added to the coating fluid for forming the protective layer. Thus, an anionic surfactant, nonionic surfactant, cationic surfactant, or fluorosurfactant can be added in order to improve the coating characteristics, while a water-soluble plasticizer can be added in order to improve the physical properties of the applied film. The water-soluble plasticizer can be exemplified by propionamide, cyclohexanediol, glycerol, sorbitol, and so forth. A water-soluble (meth)acrylic polymer may also be added. Moreover, known additives may be added to this coating fluid in order to improve the adhesion to the photopolymerizable layer and improve the timewise stability of the coating fluid.

The protective layer is formed by coating the coating fluid for protective layer formation, prepared as described in the preceding, on a photopolymerizable layer that itself has been disposed on a support. The solvent used for coating can be selected as appropriate in relation to the binder, wherein the use of distilled water or purified water is preferred when a water-soluble polymer is used. The method for applying the protective layer is not particularly limited and known methods, e.g., the methods described in U.S. Pat. No. 3,458,311 and Japanese Patent Publication No. Sho 55-49729, can be used. Specifically, for example, blade coating, air knife coating, gravure coating, roll coating, spray coating, dip coating, or bar coating may be used to form the protective layer.

The coating rate for the protective layer is preferably in the range from 0.01 to 10 $g/m^2$, more preferably in the range from 0.02 to 3 $g/m^2$, and most preferably in the range from 0.02 to 1 $g/m^2$, in each case as the coating rate after drying.

[The Method of Lithographic Printing]

Known light sources can be used as the light source for photoexposing the lithographic printing plate precursor according to the present invention. Specifically, it is suitable to use various kind of laser as the light source. In the lithographic printing method of the present invention, the lithographic printing plate precursor may be imagewize exposed by the infrared lazer. While there are no particular limitations on the infrared laser used, solid state lasers and semiconductor lasers that emit infrared radiation at wavelengths of 760 to 1200 nm are preferred examples.

The photoexposure mechanism may be any selection from internal drum, external drum, and flat bad configurations. The output of the infrared laser is preferably at least 100 mW. The use of a multibeam laser device is preferred in order to shorten the photoexposure time. The photoexposure time per pixel is preferably no more than 20 μs. The irradiated energy dose is preferably 10 to 300 $mJ/cm^2$.

Printing can be carried out in the lithographic printing method of the present invention by subjecting the lithographic printing plate precursor of the present invention to imagewise photoexposure with an infrared laser as described above and by subsequently supplying, without going through any development process step, an oil-based ink and a water-based component.

In specific terms, for example, a method can be used in which the lithographic printing plate precursor is photoexposed with an infrared laser followed by mounting on the press, without going through any development process step, and printing, or a method can be used in which the lithographic printing plate precursor is mounted on the press followed by photoexposure with an infrared laser on the press and printing.

When, for the case of an on-press-developable lithographic printing plate precursor, the lithographic printing plate precursor is imagewise photoexposed with an infrared laser followed—without going through a development process step such as a wet development process step—by printing in which a water-based component and oil-based ink are supplied, the photoexposure-cured photopolymerizable layer in the photoexposed areas of the photopolymerizable layer forms an oil-based ink receptive region that has an oleophilic surface. In the unexposed areas, on the other hand, the uncured photopolymerizable layer is removed by dissolution or dispersion by the supplied water-based component and/or oil-based ink and the hydrophilic surface is exposed in these areas. As a result, the water-based component attaches to the exposed hydrophilic surface, the oil-based ink is taken up by the photopolymerizable layer in the photoexposed regions, and printing is initiated.

Here, either the water-based component or the oil-based ink may be supplied to the plate surface at the very first; however, for the on-press-developable lithographic printing plate precursor of the present invention, the water-based component is preferably supplied at the outset in order to carry out on-press development rapidly. The fountain solution and printing ink typically employed for lithographic printing are used as the water-based component and oil-based ink.

Even in those instances where a UV ink is employed, the use of the lithographic printing plate precursor of the present invention makes it possible to carry out on-press development and subsequent printing according to the same lithographic printing methods described above and to obtain an excellent printing durability. The usual commercially available inks can be used as the UV ink.

Proceeding in the described manner, the lithographic printing plate precursor undergoes on-press development on the offset press and is used as such for long-run printing.

EXAMPLES

The present invention is described in detail in the following using examples and comparative examples, but the present invention is not limited to these examples and comparative examples.

Examples 1 to 5 and Comparative Examples 1 to 3

1. Fabrication of Lithographic Printing Plate Precursors (1) Preparation of the Support 0.3 mm-thick aluminum sheet (quality: 1050) was subjected to a degreasing treatment with 10 mass % aqueous sodium aluminate solution at 50° C. for 30 seconds in order to remove the rolling oil on the surface. The aluminum surface was thereafter grained using three bundled nylon brushes (bristle diameter=0.3 mm) and an aqueous suspension of pumice (median diameter=25 μm, specific gravity of the suspension=1.1 $g/cm^3$) and was then thoroughly washed with water. This sheet was immersed for 9 seconds in 25 mass % aqueous sodium hydroxide solution at 45° C. to carry out etching, washed with water, immersed in 20 mass % nitric acid at 60° C. for 20 seconds, and washed with water. The etching rate on the grained surface in this case was approximately 3 $g/m^2$.

A continuous electrochemical roughening treatment was then carried out using 60-Hz AC voltage. The electrolytic solution used for this treatment was a 1 mass % aqueous nitric acid solution (containing 0.5 mass % aluminum ion) and the bath temperature was 50° C. The AC power source waveform provided trapezoidal square wave alternating current with a TP (time required for the current value to go from zero to the peak) of 0.8 msec and a duty ratio of 1:1, and electrochemical roughening was carried out using a carbon electrode as the counterelectrode. Ferrite was used as an auxiliary anode. The current density was 30 A/$dm^2$ at the current peak value. 5% of the current flowing from the power source was branched to the auxiliary anode. The quantity of electricity in this nitric acid electrolysis was 175 C/$dm^2$ for the time in which the aluminum sheet was functioning as an anode. This treatment was followed by a water rinse by spraying.

An electrochemical roughening treatment was then carried out by the same method as for the nitric acid electrolysis, but using the following conditions: electrolytic solution=0.5 mass % aqueous hydrochloric acid solution (containing 0.5 mass % aluminum ion), bath temperature=50° C., quantity of electricity=50 C/$dm^2$ for the time in which the aluminum sheet was functioning as an anode. This was followed by a water rinse by spraying. A 2.5 g/$m^2$ direct-current anodic oxidation film was then disposed on this sheet using a current density of 15 A/$dm^2$ and using 15 mass % sulfuric acid (containing 0.5 mass % aluminum ion) as the electrolytic solution; this was followed by a water rinse and drying. This substrate was immersed for 7 seconds in a 2.5 mass % aqueous #3 sodium silicate solution held at 70° C. followed by a water rinse and drying. The center-line average surface roughness (Ra) of this substrate was measured at 0.51 μm using a needle with a diameter of 2 μm. The undercoat solution (1) described below was applied to give a dry coating rate of 18 mg/$m^2$, yielding the support.

—Undercoat Solution (1)—

| | |
|---|---|
| undercoat compound (1) (mass-average molecular weight: 60,000) | 0.051 g |
| methanol | 9.00 g |
| water | 1.00 g |

undercoat compound (1)

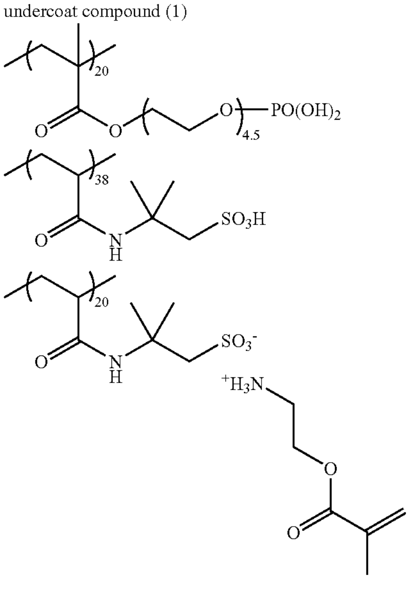

-continued

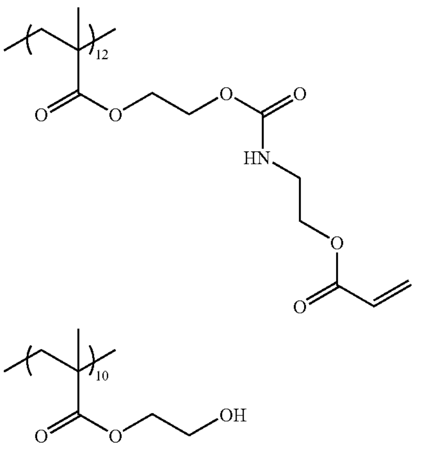

(2) Formation of the Photopolymerizable Layer and Protective Layer

A solution (the coating solution for formation of the photopolymerizable layer), prepared by dissolving the components in the compositions (unit: g) shown in Table 1 below in 12.00 g solvent (propylene glycol monomethyl ether/methyl ethyl ketone/methyl alcohol/water=55/20/15/10 (mass ratio)), was coated on the aforementioned support on which the undercoat layer had already been formed. Coating was carried out using a wire bar so as to provide a dry coating rate of 1.2 g/$m^2$. Drying at 120° C. for 40 seconds in an oven then gave the photopolymerizable layer.

A coating solution for protective layer formation with the composition given below was then coated on the aforementioned photopolymerizable layer; drying for 75 seconds at 125° C. in an oven resulted in the formation of a protective layer at a dry coating rate of 0.18 g/$m^2$, thus yielding the lithographic printing plate precursors of Examples 1 to 5 and the lithographic printing plate precursors of Comparative Examples 1 to 3.

The coating solution for photopolymerizable layer formation was obtained by mixing/stirring the photosensitive solution shown in Table 1 with microgel fluid (1), infra, immediately prior to coating. The exemplary compounds (2), (15), (16), (25), and (47) used here refer to the (1) to (84) designations of the previously cited specific examples of special polymer compounds used by the present invention.

In Comparative Examples, a polymethyl methacrylate (Mw=50,000), the comparative special polymer (R-1) (Mw=70,000) or the comparative special polymer (R-2) (Mw=100,000) with the structure shown below was used in place of the special polymer compound of the present invention.

TABLE 1

| | examples | | | | | comparative examples | | |
|---|---|---|---|---|---|---|---|---|
| Component | 1 | 2 | 3 | 4 | 5 | 1 | 2 | 3 |
| polymerizable monomer (NK Ester A-9300, Shin-Nakamura Chemical Co., Ltd.) | 2.00 | 2.00 | 2.00 | 2.00 | 2.00 | 2.00 | 2.00 | 2.00 |

TABLE 1-continued

| | examples | | | | | comparative examples | | |
|---|---|---|---|---|---|---|---|---|
| Component | 1 | 2 | 3 | 4 | 5 | 1 | 2 | 3 |
| microgel dispersion (1) | 16.51 | 16.51 | 16.51 | 16.51 | 16.51 | 16.51 | 16.51 | 16.51 |
| infrared absorber (1) | 0.28 | 0.28 | 0.28 | 0.28 | 0.28 | 0.28 | 0.28 | 0.28 |
| polymerization initiator (1) | 1.77 | 1.77 | 1.77 | 1.77 | 1.77 | 1.77 | 1.77 | 1.77 |
| phosphonium compound (1) | 0.55 | 0.55 | 0.55 | 0.55 | 0.55 | 0.55 | 0.55 | 0.55 |
| 2-hydroxyethyl isocyanurate | 0.64 | 0.64 | 0.64 | 0.64 | 0.64 | 0.64 | 0.64 | 0.64 |
| fluorosurfactant (1), 10 mass % aqueous solution | 0.04 | 0.04 | 0.04 | 0.04 | 0.04 | 0.04 | 0.04 | 0.04 |
| anionic surfactant (Paionin A-24-EA, Takemoto Oil & Fat Co., Ltd., 40 mass % aqueous solution) | 0.125 | 0.125 | 0.125 | 0.125 | 0.125 | 0.125 | 0.125 | 0.125 |
| polymethyl methacrylate (Mw = 50,000) | — | — | — | — | — | 0.254 | — | — |
| comparative special polymer (R-1) (Mw = 70,000) | — | — | — | — | — | — | 0.254 | — |
| comparative special polymer (R-2) (Mw = 100,000) | — | — | — | — | — | — | — | 0.254 |
| exemplary compound (2) (Mw = 50,000) | 0.254 | — | — | — | — | — | — | — |
| exemplary compound (15) (Mw = 50,000) | — | 0.254 | — | — | — | — | — | — |
| exemplary compound (16) (Mw = 50,000) | — | — | 0.254 | — | — | — | — | — |
| exemplary compound (25) (Mw = 60,000) | — | — | — | 0.254 | — | — | — | — |
| exemplary compound (47) (Mw = 70,000) | — | — | — | — | 0.254 | — | — | — |

—Synthesis of Microgel Dispersion (1)—

8.4 g trimethylolpropane/xylylene diisocyanate adduct (Takenate D-110N from Mitsui Takeda Chemicals Inc., 75 mass % ethyl acetate solution), 3.15 g of the 1:1 (mass ratio) adduct (50 mass % ethyl acetate solution) between Takenate D-110N and Uniox M-4000 (NOF Corporation), 6.30 g SR399E (Sartomer Company, Inc.) as polymerizable monomer, and 0.19 g Paionin A-41-C (Takemoto Oil & Fat Co., Ltd.) were dissolved in 16.39 g ethyl acetate as the oil phase component. This oil phase component and 39.4 g distilled water were mixed and were emulsified for 10 minutes at 12,000 rpm using a homogenizer. The resulting emulsion was added to 24 g distilled water and this was stirred for 4 hours at 40° C. The resulting microgel dispersion was diluted with distilled water to bring the solids fraction concentration thereof to 21 mass %, thus yielding microgel dispersion (1). The average particle size was 0.23 μm.

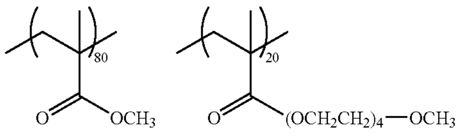

Comparative special polymer (R-1)

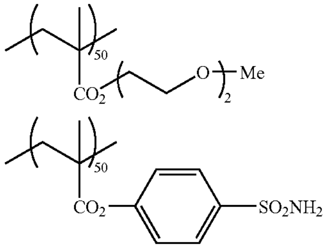

Comparative special polymer (R-2)

-continued

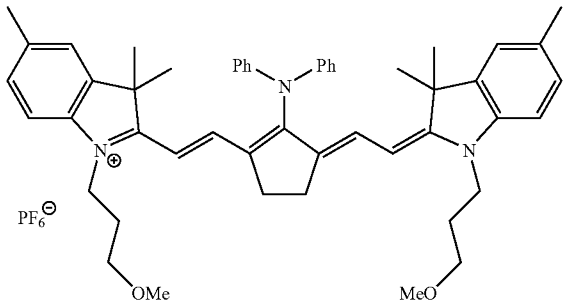

infrared absorber (1)

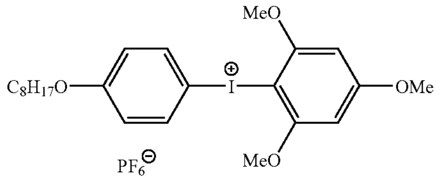

polimerization initiator (1)

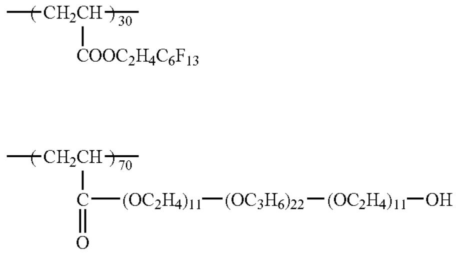

fluorosurfactant (1)

-continued

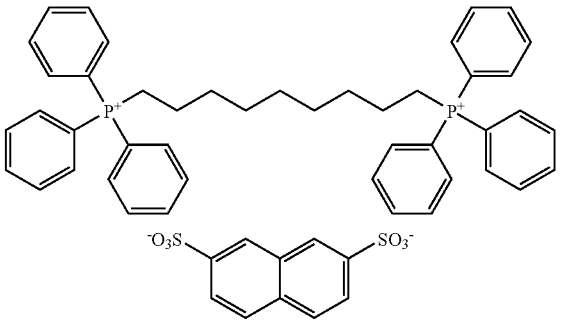

phosphoium compound (1)

Coating Solution for Forming the Protective Layer

| | |
|---|---|
| inorganic layer compound dispersion (1), see below | 1.50 g |
| polyvinyl alcohol (PVA405, Kuraray Co., Ltd., degree of saponification = 81.5 mol %) | 0.01 g |
| polyvinyl alcohol (CKS-50, Nippon Synthetic Chemical Industry Co., Ltd., degree of saponification = 99 mol %, anion modified) | 0.03 g |
| surfactant (Emalex 710, Nihon Emulsion Co., Ltd.) | 0.01 g |
| silica filler (MP-1040, Nissan Chemical Industries, Ltd.) | 0.05 g |
| water | 3.51 g |

—Preparation of the Inorganic Layer Compound Dispersion (1)—

6.4 g of the synthetic mica Somashif ME-100 (Co-op Chemical Co., Ltd.) was added to 193.6 g ion-exchanged water, and dispersion was carried out using a homogenizer until the average particle size reached 3 μm (laser scattering method). The aspect ratio of the resulting dispersed layer compound particles was at least 100.

Examples 6 to 10 and Comparative Examples 4 to 6

1. Fabrication of Lithographic Printing Plate Precursors

A solution (the coating solution for formation of the photopolymerizable layer), prepared by dissolving the components in the compositions (unit: g) shown in Table 2 below in 500 g solvent (n-propanol/water/2-butanone=76/20/4 (mass ratio)), was coated on an aluminum substrate prepared as described for Examples 1 to 5. Coating was carried out using a wire bar so as to provide a dry coating rate of 1.5 g/$m^2$, and drying was carried out at 100° C. for 90 seconds.

TABLE 2

| | examples | | | | | comparative examples | | |
|---|---|---|---|---|---|---|---|---|
| component | 6 | 7 | 8 | 9 | 10 | 4 | 5 | 6 |
| urethane acrylate (see note 1) | 30.00 | 30.00 | 30.00 | 30.00 | 30.00 | 30.00 | 30.00 | 30.00 |
| dispersion of particles of acrylonitrile-containing copolymer (see note 2) | 46.25 | 46.25 | 46.25 | 46.25 | 46.25 | 46.25 | 46.25 | 46.25 |
| Sartomer SR399E (see note 3) | 4.90 | 4.90 | 4.90 | 4.90 | 4.90 | 4.90 | 4.90 | 4.90 |
| polymethyl methacrylate (Mw = 50,000) | — | — | — | — | — | 10.00 | | |
| hydroxypropyl cellulose (see note 4) | 1.00 | 1.00 | 1.00 | 1.00 | 1.00 | 1.00 | 1.00 | 1.00 |
| Irgacure 250 (see note 5) | 4.69 | 4.69 | 4.69 | 4.69 | 4.69 | 4.69 | 4.69 | 4.69 |
| mercapto-3-triazole (see note 6) | 2.73 | 2.73 | 2.73 | 2.73 | 2.73 | 2.73 | 2.73 | 2.73 |
| BYK336 (see note 7) | 2.23 | 2.23 | 2.23 | 2.23 | 2.23 | 2.23 | 2.23 | 2.23 |
| infrared absorber, see (8) below | 1.96 | 1.96 | 1.96 | 1.96 | 1.96 | 1.96 | 1.96 | 1.96 |
| exemplary compound(2) (Mw = 50,000) | 10.00 | — | — | — | — | — | — | — |
| exemplary compound (15) (Mw = 50,000) | — | 10.00 | — | — | — | — | — | — |
| exemplary compound (16) (Mw = 50,000) | — | — | 10.00 | — | — | — | — | — |
| exemplary compound (25) (Mw = 60,000) | — | — | — | 10.00 | — | — | — | — |
| exemplary compound (47) (Mw = 70,000) | — | — | — | — | 10.00 | — | — | — |
| polymethyl methacrylate (Mw = 50,000) | — | — | — | — | — | 10.00 | — | — |
| comparative special polymer (R-1) (Mw = 70,000) | — | — | — | — | — | — | 10.00 | — |
| comparative special polymer (R-2) (Mw = 100,000) | — | — | — | — | — | — | — | 10.00 |

note 1. Polymerizable compound obtained by the reaction of hydroxyethyl acrylate and pentaerythritol triacrylate with DESMODUR N100 (hexamethylene diisocyanate-containing aliphatic polyisocyanate resin from Bayer). 80 mass % solution in 2-butanone note 2. 21 mass % dispersion in n-propanol/water (80/20) mixed solvent of polyethylene glycol methyl ether methacrylate/styrene/acrylonitrile (10/20/70) copolymer note 3. ditrimethylolpropane tetraacrylate (Sartomer Company, Inc.)

note 4. 2 mass % aqueous solution note 5. 75 mass % solution of iodonium (4-methoxyphenyl [4-(2-methylpropyl)phenyl]hexafluorophosphoric acid) in propylene carbonate (Ciba Specialty Chemical Corp.)

note 6. mercapto-3-triazole-1H,2,4, available from PCAS (France)

note 7. 25 mass % solution of modified dimethylpolysiloxane copolymer in xylene/methoxypropyl acetate solution (BYK Chemie)

on-press developability. A smaller number of impressions is regarded as a better on-press developability. The results of the evaluation are shown in Table 3.

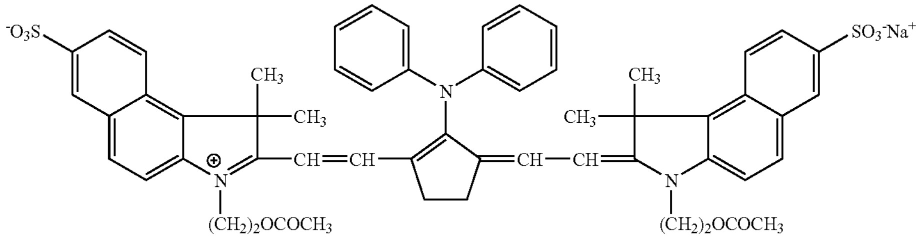

infrared absorber (8)

2. Photoexposure of, Printing with, and Evaluation of the Lithographic Printing Plate Precursors The lithographic printing plate precursors obtained in the previously described examples and comparative examples were subjected to photoexposure using a Trendsetter 3244 VX (Creo) equipped with a water-cooled 40 W infrared semiconductor laser. The following conditions were used: output=9 W, external drum rotation rate=210 rpm, resolution=2400 dpi. A fine line chart was included in the photoexposed image.

In general with negative-working lithographic printing plate precursors, lower photoexposure levels result in a lower degree of cure in the photosensitive layer (the photopolymerizable layer in the present invention) while higher photoexposure levels result in a higher degree of cure. When the degree of cure of the photopolymerizable layer is too low, the printing durability by the lithographic printing plate declines and the reproducibility (small dots, fine lines) becomes unsatisfactory. High degrees of cure for the photopolymerizable layer, on the other hand, provide a high printing durability and an excellent reproducibility (small dots, fine lines).

In these examples, the printing durability and fine line reproducibility of the negative-working lithographic printing plate precursors prepared as described above were evaluated using the same photoexposure level, supra, and these evaluations were used as an indicator of the sensitivity of the lithographic printing plate precursor. Thus, a higher number of impressions for the printing durability and a finer fine line width in the fine line reproducibility can be said to indicate a higher sensitivity for the lithographic printing plate precursor.

(1) On-Press Developability

On-press development was carried out as follows using the following printing inks: (i) ordinary ink (TRANS-G(N) black ink (Dainippon Ink and Chemicals, Incorporated)) and (ii) UV ink (Best Cure UV-BF-WRO standard black ink (T & K TOKA Co., Ltd.)).

The resulting photoexposed precursor was installed, without a development process, on the cylinder of a Dia IF-2 press from Mitsubishi Heavy Industries, Ltd.; fountain solution (EU-3 etching solution from Fujifilm Corporation/water/isopropyl alcohol=1/89/10 (volume ratio)) and a printing ink as described above were supplied; and printing was then carried out at a printing rate of 6,000 impressions per hour. At this point, the number of sheets of printing paper required until there was no ink transfer to the unexposed areas (nonimage areas) of the photopolymerizable layer was evaluated as the on-press developability. A smaller number of impressions is regarded as a better on-press developability. The results of the evaluation are shown in Table 3.

(2) Fine Line Reproducibility

After printing 100 impressions as described above and confirming that prints free of ink scumming in the nonimage areas were being obtained, 500 impressions were then printed. The fine line chart (the chart contained 10, 12, 14, 16, 18, 20, 25, 30, 35, 40, 60, 80, 100, and 200 μm fine line images and nonimage areas present in alternation at the same width) on the six-hundredth (total) print was inspected with a 25× loupe, and the fine line reproducibility was evaluated based on the fine line width that was reproduced without gaps. The results of the evaluation are shown in Table 3.

(3) On-Press Development Scum

After the completion of printing in the evaluation of fine line reproducibility as described above, the status of the adhesion of removal scum on the water form roll was evaluated at the same time. This was scored on the following scale.

+: no scum is seen on the water form roll

Δ: a small amount of scum is seen on the water form roll x: a large amount of scum is seen on the water form roll (4) Printing Durability (i) Printing with Ordinary Ink Printing was continued after carrying out the evaluation of on-press development scum. As the number of printed impressions grew, the ink receptivity declined due to gradual wear of the photopolymerizable layer, which resulted in a decline in the ink density on the printing paper. The printing durability was evaluated based on the number of impressions required for the ink density (reflection density) to decline 0.1 from the value at the start of printing. The results of the evaluation are shown in Table 3.

(ii) Printing with UV Ink

Printing was continued after carrying out the evaluation of on-press development scum As the number of printed impressions grew, the ink receptivity declined due to gradual wear of the photopolymerizable layer, which resulted in a decline in the ink density on the printing paper. The printing durability was evaluated based on the number of impressions required for the ink density (reflection density) to decline 0.1 from the value at the start of printing. The results of the evaluation are shown in Table 3.

TABLE 3

| | special polymer compound | ordinary ink: on-press develop-ability (number of impressions) | ordinary ink: fine line reproducibility (μm) | ordinary ink: on-press development scum | ordinary ink: printing durability (thousands of impressions) | UV ink: on-press developability (number of impressions) | UV ink: fine line reproducibility (μm) | UV ink: on-press development scum | UV ink: printing durability (thousands of impressions) |
|---|---|---|---|---|---|---|---|---|---|
| Ex. 1 | exemplary compound (2) (Mw = 50,000) | 20 | 10 | + | 70 | 25 | 10 | + | 40 |
| Ex. 2 | exemplary compound (15) (Mw = 50,000) | 20 | 10 | + | 70 | 25 | 10 | + | 40 |
| Ex. 3 | exemplary compound (16) (Mw = 50,000) | 20 | 10 | + | 70 | 25 | 10 | + | 40 |
| Ex. 4 | exemplary compound (25) (Mw = 60,000) | 16 | 10 | + | 65 | 20 | 10 | + | 35 |
| Ex. 5 | exemplary compound (47) (Mw = 70,000) | 16 | 10 | + | 65 | 20 | 10 | + | 35 |
| Comp. Ex. 1 | polymethyl methacrylate (Mw = 50,000) | 20 | 10 | x | 50 | 30 | 20 | x | 8 |
| Comp. Ex. 2 | comparative special polymer (R-1) (Mw = 70,000) | 20 | 10 | Δ | 50 | 25 | 15 | Δ | 8 |
| Comp. Ex. 3 | comparative special polymer (R-2) (Mw = 100,000) | 20 | 10 | + | 60 | 25 | 10 | + | 28 |
| Ex. 6 | exemplary compound (2) (Mw = 50,000) | 40 | 10 | + | 45 | 45 | 10 | + | 28 |
| Ex. 7 | exemplary compound (15) (Mw = 50,000) | 40 | 10 | + | 45 | 45 | 10 | + | 28 |
| Ex. 8 | exemplary compound (16) (Mw = 50,000) | 40 | 10 | + | 45 | 45 | 10 | + | 28 |
| Ex. 9 | exemplary compound (25) (Mw = 60,000) | 35 | 10 | + | 40 | 30 | 10 | + | 25 |
| Ex. 10 | exemplary compound (47) (Mw = 70,000) | 35 | 10 | + | 40 | 30 | 10 | + | 25 |
| Comp. Ex. 4 | polymethyl methacrylate (Mw = 50,000) | 40 | 30 | x | 25 | 50 | 35 | x | 3 |
| Comp. Ex. 5 | comparative special polymer (R-1) (Mw = 70,000) | 40 | 25 | Δ | 25 | 45 | 30 | Δ | 3 |
| Comp. Ex. 6 | comparative special polymer (R-2) (Mw = 100,000) | 40 | 25 | + | 35 | 45 | 25 | + | 20 |

The results in Table 3 demonstrated that a negative-working lithographic printing plate precursor that contains a special polymer compound according to the present invention in its photopolymerizable layer exhibits not only an excellent printing durability with ordinary ink and an excellent on-press developability in lithographic printing using on-press development, but also an excellent printing durability with UV ink in lithographic printing using on-press development.

Examples 11 to 15 and Comparative Examples 7 to 9

1. Fabrication of Lithographic Printing Plate Precursors (1) Preparation of the Support 0.3 mm-thick aluminum sheet (quality: 1050) was subjected to a degreasing treatment with 10 mass % aqueous sodium aluminate solution at 50° C. for 30 seconds in order to remove the rolling oil on the surface. The aluminum surface was thereafter grained using three bundled nylon brushes (bristle diameter=0.3 mm) and an aqueous suspension of pumice (median diameter=25 μm, specific gravity of the suspension=1.1 g/$cm^3$) and was then thoroughly washed with water. This sheet was immersed for 9 seconds in 25 mass % aqueous sodium hydroxide solution at 45° C. to carry out etching, washed with water, immersed in 20 mass % nitric acid at 60° C. for 20 seconds, and washed with water. The etching rate on the grained surface in this case was approximately 3 g/$m^2$.

A continuous electrochemical roughening treatment was then carried out using 60-Hz AC voltage. The electrolytic solution used for this treatment was a 1 mass % aqueous nitric acid solution (containing 0.5 mass % aluminum ion) and the bath temperature was 50° C. The AC power source waveform provided trapezoidal square wave alternating current with a TP (time required for the current value to go from zero to the peak) of 0.8 msec and a duty ratio of 1:1, and electrochemical roughening was carried out using a carbon electrode as the counterelectrode. Ferrite was used as an auxiliary anode. The current density was 30 $A/dm^2$ at the current peak value. 5% of the current flowing from the power source was branched to the auxiliary anode. The quantity of electricity in this nitric acid electrolysis was 175 $C/dm^2$ for the time in which the aluminum sheet was functioning as an anode. This treatment was followed by a water rinse by spraying.

An electrochemical roughening treatment was then carried out by the same method as for the nitric acid electrolysis, but using the following conditions: electrolytic solution=0.5 mass % aqueous hydrochloric acid solution (containing 0.5 mass % aluminum ion), bath temperature=50° C., quantity of electricity=50 $C/dm^2$ for the time in which the aluminum sheet was functioning as an anode. This was followed by a water rinse by spraying. A 2.5 $g/m^2$ direct-current anodic oxidation film was then disposed on this sheet using a current density of 15 $A/dm^2$ and using 15 mass % sulfuric acid (containing 0.5 mass % aluminum ion) as the electrolytic solution; this was followed by a water rinse and drying. This substrate was immersed for 7 seconds in a 2.5 mass % aqueous #3 sodium silicate solution held at 70° C. followed by a water rinse and drying. The center-line average surface roughness (Ra) of this substrate was measured at 0.51 μm using a needle with a diameter of 2 μm. The undercoat solution (1) described below was applied to give a dry coating rate of 18 $mg/m^2$, yielding the support.

—Undercoat Solution (1)—

| | |
|---|---|
| undercoat compound (1) described above (mass-average molecular weight: 60,000) | 0.051 g |

-continued

| | |
|---|---|
| methanol | 9.00 g |
| water | 1.00 g |

(2) Formation of the Photopolymerizable Layer and Protective Layer

A solution (the coating solution for formation of the photopolymerizable layer), prepared by dissolving the components in the compositions (unit: g) shown in Table 4 below in 12.00 g solvent (propylene glycol monomethyl ether/methyl ethyl ketone/methyl alcohol/water=55/20/15/10 (mass ratio)), was coated on the aforementioned support on which the undercoat layer had already been formed. Coating was carried out using a wire bar so as to provide a dry coating rate of 1.2 $g/m^2$. Drying at 120° C. for 40 seconds in an oven then gave the photopolymerizable layer.

A coating solution for protective layer formation with the same composition as used in Examples 1 to 5 was then coated on the aforementioned photopolymerizable layer; drying for 75 seconds at 125° C. in an oven resulted in the formation of a protective layer at a dry coating rate of 0.18 $g/m^2$, thus yielding the lithographic printing plate precursors of Examples 11 to 15 and the lithographic printing plate precursors of Comparative Examples 7 to 9.

The coating solution for photopolymerizable layer formation was obtained by mixing/stirring the photosensitive solution shown in Table 4 with the microgel fluid (1) described above, immediately prior to coating. The exemplary compounds (55), (80), (73), (74), and (67) used here refer to the (1) to (84) designations of the previously cited specific examples of special polymer compounds used by the present invention.

In Comparative Examples, a polymethyl methacrylate (Mw=50,000), the comparative special polymer (R-1) (Mw=70,000) described above or the comparative special polymer (R-3) (Mw=100,000) with the structure shown below was used in place of the special polymer compound of the present invention.

TABLE 4

| | examples | | | | | comparative examples | | |
|---|---|---|---|---|---|---|---|---|
| Component | 11 | 12 | 13 | 14 | 15 | 7 | 8 | 9 |
| polymerizable monomer (NK Ester A-9300, Shin-Nakamura Chemical Co., Ltd.) | 2.00 | 2.00 | 2.00 | 2.00 | 2.00 | 2.00 | 2.00 | 2.00 |
| microgel dispersion (1) | 16.51 | 16.51 | 16.51 | 16.51 | 16.51 | 16.51 | 16.51 | 16.51 |
| infrared absorber (1) | 0.28 | 0.28 | 0.28 | 0.28 | 0.28 | 0.28 | 0.28 | 0.28 |
| polymerization initiator (1) | 1.77 | 1.77 | 1.77 | 1.77 | 1.77 | 1.77 | 1.77 | 1.77 |
| phosphonium compound (1) | 0.55 | 0.55 | 0.55 | 0.55 | 0.55 | 0.55 | 0.55 | 0.55 |
| 2-hydroxyethyl isocyanurate | 0.64 | 0.64 | 0.64 | 0.64 | 0.64 | 0.64 | 0.64 | 0.64 |
| fluorosurfactant (1), 10 mass % aqueous solution | 0.04 | 0.04 | 0.04 | 0.04 | 0.04 | 0.04 | 0.04 | 0.04 |
| anionic surfactant (Paionin A-24-EA, Takemoto Oil & Fat Co., Ltd., 40 mass % aqueous solution) | 0.125 | 0.125 | 0.125 | 0.125 | 0.125 | 0.125 | 0.125 | 0.125 |
| polymethyl methacrylate (Mw = 50,000) | — | — | — | — | — | 0.254 | — | — |
| comparative special polymer (R-1) (Mw = 70,000) | — | — | — | — | — | — | 0.254 | — |
| comparative special polymer (R-3) (Mw = 100,000) | — | — | — | — | — | — | — | 0.254 |
| exemplary compound (55) (Mw = 50,000) | 0.254 | — | — | — | — | — | — | — |
| exemplary compound (80) (Mw = 50,000) | — | 0.254 | — | — | — | — | — | — |
| exemplary compound (73) (Mw = 50,000) | — | — | 0.254 | — | — | — | — | — |

TABLE 4-continued

| | examples | | | | | comparative examples | | |
|---|---|---|---|---|---|---|---|---|
| Component | 11 | 12 | 13 | 14 | 15 | 7 | 8 | 9 |
| exemplary compound (74) (Mw = 60,000) | — | — | — | 0.254 | — | — | — | — |
| exemplary compound (67) (Mw = 70,000) | — | — | — | — | 0.254 | — | — | — |

Comparative Special Polymer (R-3)

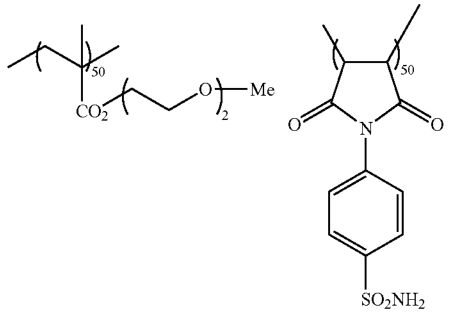

Examples 16 to 20 and Comparative Examples 10 to 12

1. Fabrication of Lithographic Printing Plate Precursors

A solution (the coating solution for formation of the photopolymerizable layer), prepared by dissolving the components in the compositions (unit: g) shown in Table 5 below in 500 g solvent (n-propanol/water/2-butanone=76/20/4 (mass ratio)), was coated on an aluminum substrate prepared as described for Examples 11 to 15. Coating was carried out using a wire bar so as to provide a dry coating rate of 1.5 g/$m^2$, and drying was carried out at 100° C. for 90 seconds.

TABLE 5

| | examples | | | | | comparative examples | | |
|---|---|---|---|---|---|---|---|---|
| component | 16 | 17 | 18 | 19 | 20 | 10 | 11 | 12 |
| urethane acrylate (see note 1) | 30.00 | 30.00 | 30.00 | 30.00 | 30.00 | 30.00 | 30.00 | 30.00 |
| dispersion of particles of acrylonitrile-containing copolymer (see note 2) | 46.25 | 46.25 | 46.25 | 46.25 | 46.25 | 46.25 | 46.25 | 46.25 |
| Sartomer SR399E (see note 3) | 4.90 | 4.90 | 4.90 | 4.90 | 4.90 | 4.90 | 4.90 | 4.90 |
| polymethyl methacrylate (Mw = 50,000) | — | — | — | — | — | 10.00 | | |
| hydroxypropyl cellulose (see note 4) | 1.00 | 1.00 | 1.00 | 1.00 | 1.00 | 1.00 | 1.00 | 1.00 |
| Irgacure 250 (see note 5) | 4.69 | 4.69 | 4.69 | 4.69 | 4.69 | 4.69 | 4.69 | 4.69 |
| mercapto-3-triazole(see note 6) | 2.73 | 2.73 | 2.73 | 2.73 | 2.73 | 2.73 | 2.73 | 2.73 |
| BYK336 (see note 7) | 2.23 | 2.23 | 2.23 | 2.23 | 2.23 | 2.23 | 2.23 | 2.23 |
| infrared absorber, see (8) below | 1.96 | 1.96 | 1.96 | 1.96 | 1.96 | 1.96 | 1.96 | 1.96 |
| exemplary compound (55) (Mw = 50,000) | 10.00 | — | — | — | — | — | — | — |
| exemplary compound (80) (Mw = 50,000) | — | 10.00 | — | — | — | — | — | — |
| exemplary compound (73) (Mw = 50,000) | — | — | 10.00 | — | — | — | — | — |
| exemplary compound (74) (Mw = 60,000) | — | — | — | 10.00 | — | — | — | — |
| exemplary compound (67) (Mw = 70,000) | — | — | — | — | 10.00 | — | — | — |
| polymethyl methacrylate (Mw = 50,000) | — | — | — | — | — | 10.00 | — | — |
| comparative special polymer (R-1) (Mw = 70,000) | — | — | — | — | — | — | 10.00 | — |
| comparative special polymer (R-3) (Mw = 100,000) | — | — | — | — | — | — | — | 10.00 |

note 1. Polymerizable compound obtained by the reaction of hydxoxyethyl acrylate and pentaerythritol triacrylate with DESMODUR N100 (hexamethylene diisocyanate-containing aliphatic polyisocyanate resin from Bayer). 80 mass % solution in 2-butanone note 2. 21 mass % dispersion in n-propanol/water (80/20) mixed solvent of polyethylene glycol methyl ether methacrylate/styrene/acrylonitrile (10/20/70) copolymer note 3. ditrimethylolpropane tetraacrylate (Sartomer Company, Inc.)

note 4. 2 mass % aqueous solution note 5. 75 mass % solution of iodonium (4-methoxyphenyl[4-(2-methylpropyl)phenyl]hexafluorophosphoric acid) in propylene carbonate (Ciba Specialty Chemical Corp.)

note 6. mercapto-3-triazole-1H,2,4, available from PCAS (France)

note 7. 25 mass % solution of modified dimethylpolysiloxane copolymer in xylene/methoxypropyl acetate solution (BYK Chemie)

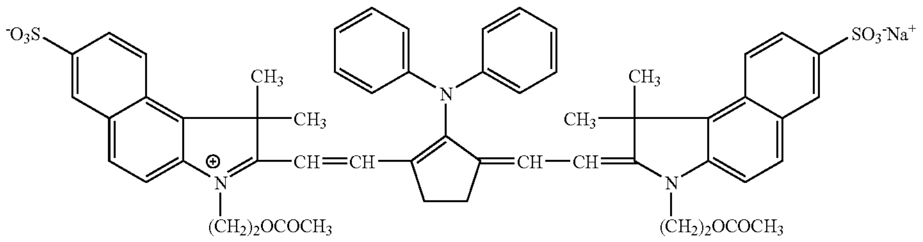

infrared absorber (8)

2. Photoexposure of, Printing with, and Evaluation of the Lithographic Printing Plate Precursors The lithographic printing plate precursors obtained in Examples 11 to 20 and Comparative Examples 7 to 12 were subjected to photoexposure in the same manner as described in Examples 1 to 10 above, and the exposed plates were evaluated on on-press developability, fine line reproducibility, on-press development scum, and printing durability in the same manner as in the above Examples 1 to 10. The results of the evaluation are shown in Table 6.

TABLE 6

| | | ordinary ink | | | | UV ink | | | |
|---|---|---|---|---|---|---|---|---|---|
| | special polymer compound | on-press develop-ability (number of impressions) | fine line reproducibility (μm) | on-press development scum | printing durability (thousands of impressions) | on-press developability (number of impressions) | fine line reproducibility (μm) | on-press development scum | printing durability (thousands of impressions) |
| Ex. 11 | exemplary compound (55) (Mw = 50,000) | 20 | 10 | + | 70 | 25 | 10 | + | 35 |
| Ex. 12 | exemplary compound (80) (Mw = 50,000) | 20 | 10 | + | 65 | 25 | 10 | + | 30 |
| Ex. 13 | exemplary compound (73) (Mw = 50,000) | 20 | 10 | + | 70 | 25 | 10 | + | 35 |
| Ex. 14 | exemplary compound (74) (Mw = 60,000) | 20 | 10 | + | 65 | 25 | 10 | + | 35 |
| Ex. 15 | exemplary compound (67) (Mw = 70,000) | 16 | 10 | + | 65 | 20 | 10 | + | 32 |
| Comp. Ex. 7 | polymethyl methacrylate (Mw = 50,000) | 20 | 10 | x | 50 | 30 | 20 | x | 8 |
| Comp. Ex. 8 | comparative special polymer (R-1) (Mw = 70,000) | 20 | 10 | Δ | 50 | 25 | 15 | Δ | 8 |
| Comp. Ex. 9 | comparative special polymer (R-3) (Mw = 100,000) | 20 | 10 | + | 58 | 25 | 10 | + | 28 |
| Ex. 16 | exemplary compound (55) (Mw = 50,000) | 40 | 10 | + | 45 | 45 | 10 | + | 27 |
| Ex. 17 | exemplary compound (80) (Mw = 50,000) | 40 | 10 | + | 40 | 40 | 10 | + | 24 |
| Ex. 18 | exemplary compound (73) (Mw = 50,000) | 40 | 10 | + | 45 | 45 | 10 | + | 27 |
| Ex. 19 | exemplary compound (74) (Mw = 60,000) | 40 | 10 | + | 45 | 45 | 10 | + | 27 |
| Ex. 20 | exemplary compound (67) (Mw = 70,000) | 35 | 10 | + | 40 | 40 | 10 | + | 25 |
| Comp. Ex. 10 | polymethyl methacrylate (Mw = 50,000) | 40 | 30 | x | 25 | 50 | 35 | x | 3 |
| Comp. Ex. 11 | comparative special polymer (R-1) (Mw = 70,000) | 40 | 25 | Δ | 25 | 45 | 30 | Δ | 3 |

TABLE 6-continued

| | special polymer compound | ordinary ink: on-press develop-ability (number of impressions) | ordinary ink: fine line reproducibility (μm) | ordinary ink: on-press development scum | ordinary ink: printing durability (thousands of impressions) | UV ink: on-press developability (number of impressions) | UV ink: fine line reproducibility (μm) | UV ink: on-press development scum | UV ink: printing durability (thousands of impressions) |
|---|---|---|---|---|---|---|---|---|---|
| Comp. Ex. 12 | comparative special polymer (R-3) (Mw = 100,000) | 40 | 25 | + | 35 | 45 | 25 | + | 20 |

The results in Table 6 demonstrated that a negative-working lithographic printing plate precursor that contains a special polymer compound according to the present invention in its photopolymerizable layer exhibits not only an excellent printing durability with ordinary ink and an excellent on-press developability in lithographic printing using on-press development, but also an excellent printing durability with UV ink in lithographic printing using on-press development.

What is claimed is:

1. A negative-working lithographic printing plate precursor comprising on a hydrophilic support a photopolymerizable layer that contains a polymer compound that has an ethylenically unsaturated bond in the side chain position, a hydrophilic group and a cyclic structure derived from a maleimide, wherein said hydrophilic group comprises an alkylene oxide structure represented by the following general formula (II):

(II)

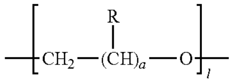

wherein in the formula (II), R represents a hydrogen atom or methyl group; a is 1, 3, or 5; and l is an integer of 2 to 9, and said ethylenically unsaturated bond is represented by the following formula (1):

(1)

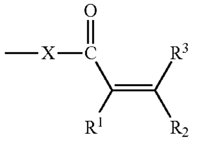

wherein in the formula (1), X represents an oxygen atom, sulfur atom, or —N($R^{12}$)—; and $R^1$ to $R^3$, and $R^{12}$ each independently represent a monovalent substituent.

2. The negative-working lithographic printing plate precursor according to claim 1, wherein the cyclic structure derived from a maleimide is a structure represented by the following formula (I):

(I)

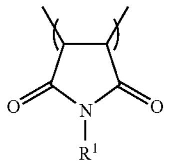

(in the formula, $R^1$ represents a hydrogen atom or an optionally substituted monovalent organic group).

3. The negative-working lithographic printing plate precursor according to claim 2, wherein $R^1$ in the formula (I) represents an optionally substituted aryl group.

4. The negative-working lithographic printing plate precursor according to claim 3, wherein $R^1$ in the formula (I) represents a phenyl group having a sulfonamide group.

5. The negative-working lithographic printing plate precursor according to claim 4, wherein the formula (I) represents:

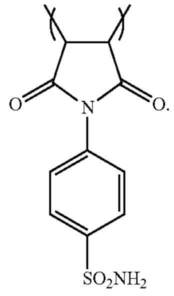

6. The negative-working lithographic printing plate precursor according to claim 1, wherein the polymer compound that has an ethylenically unsaturated bond in the side chain position, a hydrophilic group and a cyclic structure derived from a maleimide is a binder polymer.

7. The negative-working lithographic printing plate precursor according to claim 1, wherein the photopolymerizable layer contains an infrared absorber, polymerization initiator, and polymerizable monomer.

8. The negative-working lithographic printing plate precursor according to claim 1, wherein the photopolymerizable layer contains microcapsules or a microgel.

9. The negative-working lithographic printing plate precursor according to claim 1, having an undercoat layer between the hydrophilic support and the photopolymerizable layer, said undercoat layer comprising a compound that has a group that adsorbs to the hydrophilic support and an addition-polymerizable ethylenic double bond.

10. The negative-working lithographic printing plate precursor according to claim 1, wherein the photopolymerizable layer can be removed by printing ink and/or fountain solution.

11. The negative-working lithographic printing plate precursor according to claim 10, wherein the printing ink is a UV ink.

12. A method of lithographic printing comprising the steps of:

mounting the negative-working lithographic printing plate precursor according to claim 1 on a press and thereafter subjecting the negative-working lithographic printing plate precursor to imagewise exposure with a laser, or subjecting the negative-working lithographic printing plate precursor to imagewise exposure with a laser and thereafter mounting the same on a press; and removing unexposed areas of the photopolymerizable layer by feeding printing ink and/or fountain solution to the negative-working lithographic printing plate precursor to perform printing.

13. The lithographic printing method according to claim 12, wherein the printing ink is a UV ink.

* * * * *